United States Patent
Emoto et al.

(10) Patent No.: US 9,259,758 B2
(45) Date of Patent: Feb. 16, 2016

(54) SUBSTRATE TREATMENT METHOD AND SUBSTRATE TREATMENT APPARATUS

(71) Applicant: DAINIPPON SCREEN MFG. CO., LTD, Kyoto-shi, Kyoto (JP)

(72) Inventors: Tetsuya Emoto, Kyoto (JP); Manabu Okutani, Kyoto (JP)

(73) Assignee: SCREEN HOLDINGS CO., LTD., Kyoto (JP)

(*) Notice: Subject to any disclaimer, the term of this patent is extended or adjusted under 35 U.S.C. 154(b) by 147 days.

(21) Appl. No.: 14/011,285

(22) Filed: Aug. 27, 2013

(65) Prior Publication Data

US 2014/0065295 A1 Mar. 6, 2014

(30) Foreign Application Priority Data

| Aug. 28, 2012 | (JP) | 2012-187837 |
| Aug. 31, 2012 | (JP) | 2012-192083 |
| Mar. 6, 2013 | (JP) | 2013-044546 |
| Mar. 15, 2013 | (JP) | 2013-053240 |

(51) Int. Cl.

| B05D 3/12 | (2006.01) |
| B05D 1/00 | (2006.01) |
| B05C 9/12 | (2006.01) |
| B05D 5/08 | (2006.01) |
| H01L 21/67 | (2006.01) |
| B05D 3/02 | (2006.01) |
| B05D 3/04 | (2006.01) |

(52) U.S. Cl.
CPC . *B05D 1/005* (2013.01); *B05C 9/12* (2013.01); *B05D 5/08* (2013.01); *H01L 21/6708* (2013.01); *H01L 21/67051* (2013.01); *H01L 21/67057* (2013.01); *H01L 21/67086* (2013.01); *B05D 3/02* (2013.01); *B05D 3/0254* (2013.01); *B05D 3/0493* (2013.01); *H01L 21/6715* (2013.01)

(58) Field of Classification Search
CPC ............ H01L 21/6715; H01L 21/67051; B01D 1/005; B05D 3/02; B05D 3/0254; B05D 5/08
USPC ........ 427/240, 425, 372.2, 377; 438/780, 782
See application file for complete search history.

(56) References Cited

U.S. PATENT DOCUMENTS

| 2010/0075504 | A1 | 3/2010 | Tomita et al. | |
| 2010/0101497 | A1 | 4/2010 | Izuta et al. | |
| 2012/0187083 | A1* | 7/2012 | Hashizume | 216/37 |
| 2013/0256267 | A1* | 10/2013 | Ota et al. | 216/62 |

* cited by examiner

*Primary Examiner* — Kirsten Jolley
(74) *Attorney, Agent, or Firm* — McDermott Will & Emery LLP

(57) ABSTRACT

A substrate treatment method is provided, which includes: a liquid film forming step of forming a liquid film of a treatment liquid on a front surface of a substrate; a hydrophobization liquid supplying step of supplying a hydrophobization liquid to a center portion of the front surface of the substrate for hydrophobizing the front surface of the substrate, while rotating the substrate; an inactivation suppressing step of suppressing inactivation of the supplied hydrophobization liquid on a peripheral edge portion of the front surface of the substrate simultaneously with the hydrophobization liquid supplying step; and a drying step of drying the substrate to which the hydrophobization liquid has been supplied.

13 Claims, 22 Drawing Sheets

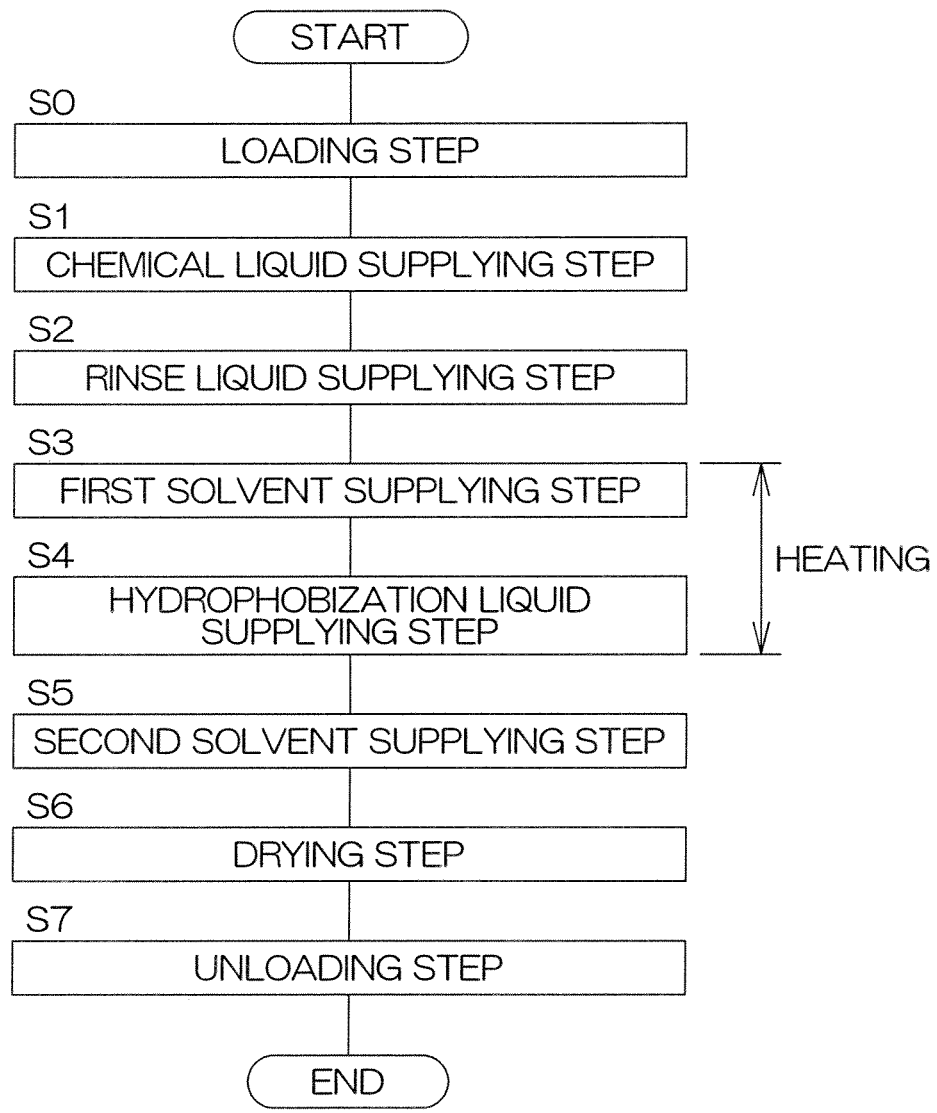

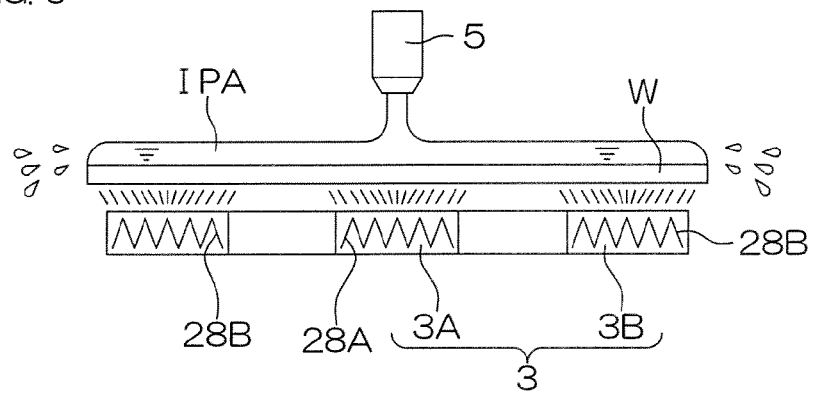
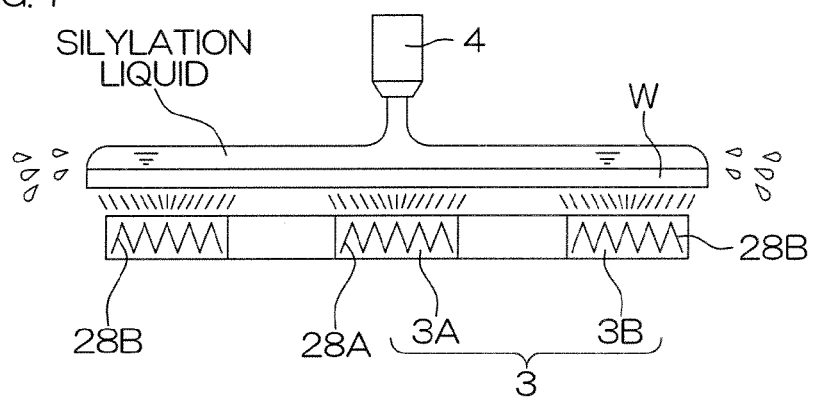
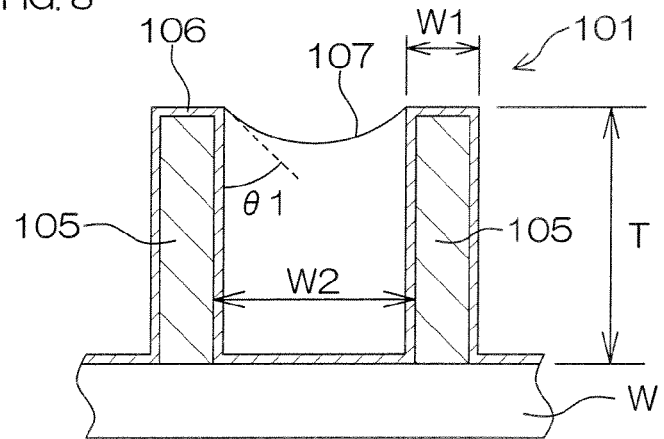

FIG. 9

| | FIRST SOLVENT SUPPLYING STEP | | HYDROPHOBIZATION LIQUID SUPPLYING STEP | |
|---|---|---|---|---|
| HEATING | PERIPHERAL EDGE PORTION OF WAFER W | CENTER PORTION OF WAFER W | PERIPHERAL EDGE PORTION OF WAFER W | CENTER PORTION OF WAFER W |
| | IPA | IPA | SILYLATION LIQUID | SILYLATION LIQUID |

SURFACE STATE OF WAFER $$F_{max} = \frac{6\gamma\cos\theta}{D}\left(\frac{H}{W}\right)^2 t$$

$F_{max}$ : COLLAPSING FORCE
$\gamma$ : SURFACE TENSION
$\theta$ : CONTACT ANGLE
H/W : ASPECT RATIO
t : ACTING PERIOD

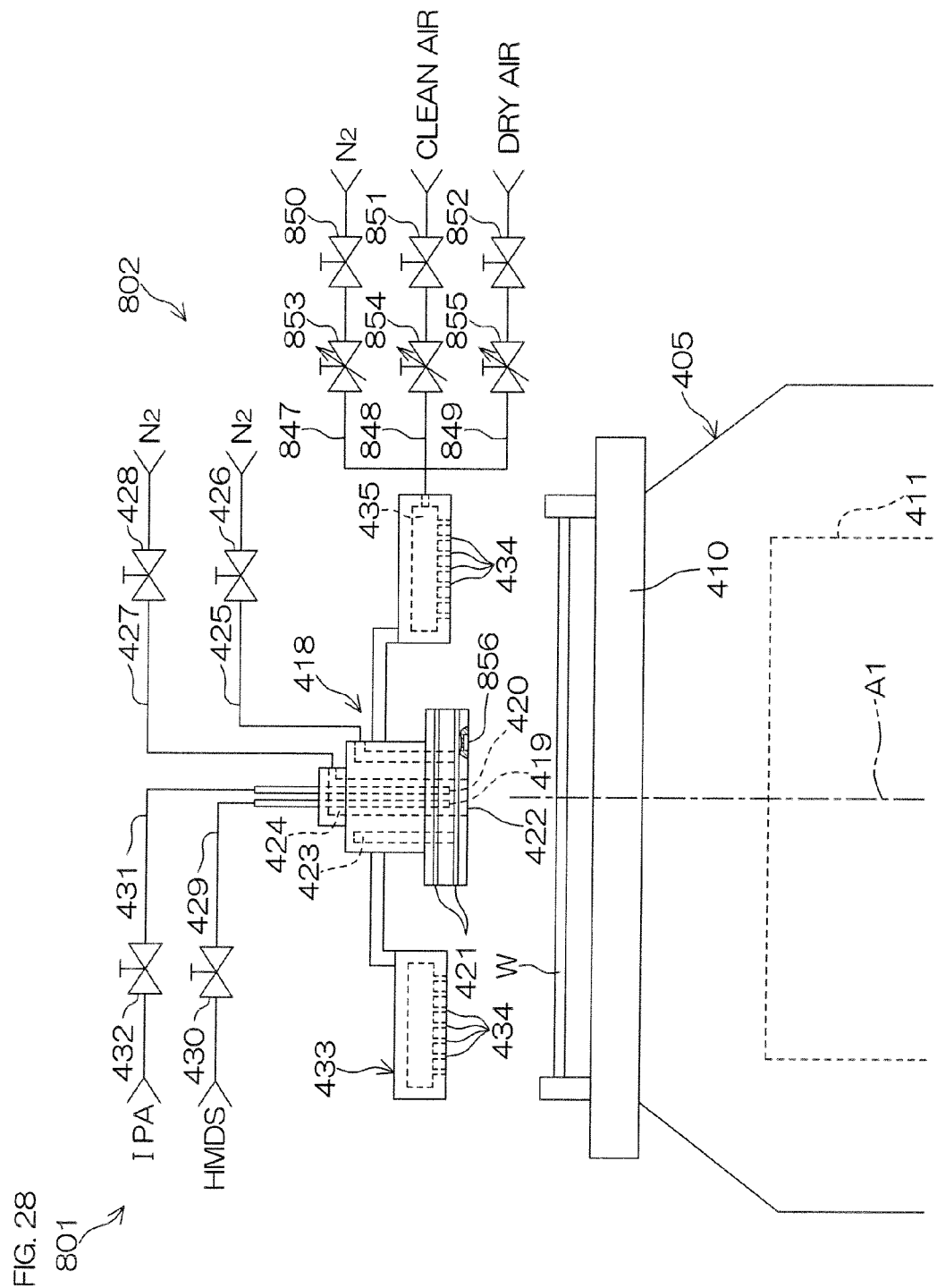

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus for treating a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, a substrate treatment apparatus of a single substrate treatment type adapted to treat a single substrate at a time is often used for treating a front surface of a substrate with a treatment liquid. The substrate treatment apparatus of the single substrate treatment type includes a spin chuck which horizontally holds and rotates the substrate, and a nozzle which spouts the treatment liquid toward a center portion of the front surface of the substrate rotated by the spin chuck (see US2010/101497A1 and US2010/075504A1).

More specifically, a chemical liquid is supplied to the substrate, whereby the front surface of the substrate is treated with the chemical liquid. Then, chemical liquid adhering to the substrate is rinsed away from the substrate by supplying deionized water to the substrate. After the chemical liquid is rinsed away, IPA (isopropyl alcohol) having a lower boiling point than water is supplied to the front surface of the substrate, whereby deionized water adhering to the substrate is replaced with IPA. Thereafter, the substrate is rotated at a high speed, whereby IPA adhering to the substrate is removed from the substrate to dry the substrate.

In this method, however, a pattern formed on the front surface of the substrate is liable to collapse during the drying of the substrate. A conventionally known method for preventing the collapse of the pattern is to hydrophobize the front surface of the substrate prior to the drying of the substrate. In US2010/075504A1, for example, a silane coupling agent solution (liquid silane coupling agent, hereinafter referred to as "silylation agent") is supplied to the substrate to form a hydrophobic protection film on the front surface of the substrate, thereby hydrophobizing the front surface of the substrate.

SUMMARY OF THE INVENTION

Where a hydrophobic protection film having a greater contact angle (a greater liquid (e.g., water) contact angle on the hydrophobic protection film) is formed on the entire major surface of a semiconductor substrate, the collapse of the pattern can be suppressed. However, where the hydrophobic protection film is formed as covering only a part of the major surface of the substrate or where the hydrophobic protection film formed on the front surface of the substrate has a smaller contact angle, it is impossible to sufficiently suppress the collapse of the pattern. For the formation of a hydrophobic protection film having a greater contact angle, a highly active silylation liquid should be supplied to different positions on the front surface of the substrate.

Further, the silylation liquid supplied to the center portion of the front surface of the substrate is inactivated while moving toward a peripheral edge portion of the substrate. Where the silylation liquid is spouted from the nozzle to be supplied to the center portion of the front surface of the substrate, therefore, the silylation liquid has a higher activity on the center portion of the substrate, and has a lower activity on a region of the substrate other than the center portion. As a result, the hydrophobic protection film is liable to have a smaller contact angle on the region of the substrate other than the center portion.

Accordingly, the hydrophobization of the substrate should be promoted on the peripheral edge portion of the front surface of the substrate.

It is therefore an object of the present invention to provide a substrate treatment method and a substrate treatment apparatus which promote the hydrophobization on the peripheral edge portion of the front surface of the substrate to properly hydrophobize the entire front surface of the substrate, thereby substantially preventing the collapse of the pattern.

The present invention provides a substrate treatment method for treating a front surface of a substrate formed with a predetermined pattern, the method including: a liquid film forming step of forming a liquid film of a treatment liquid on the front surface of the substrate; a hydrophobization liquid supplying step of supplying a hydrophobization liquid to a center portion of the front surface of the substrate for hydrophobizing the front surface of the substrate, while rotating the substrate; an inactivation suppressing step of suppressing inactivation of the supplied hydrophobization liquid on a peripheral edge portion of the front surface of the substrate simultaneously with the hydrophobization liquid supplying step; and a drying step of drying the substrate to which the hydrophobization liquid has been supplied.

In this method, the hydrophobization liquid is supplied to the substrate. Further, the inactivation of the supplied hydrophobization liquid is suppressed on the peripheral edge portion of the front surface of the substrate. Therefore, the hydrophobic protection film can be properly formed on the entire front surface of the substrate. Thus, the entire front surface of the substrate can be properly and uniformly hydrophobized, thereby substantially preventing the collapse of the pattern.

The inactivation suppressing step preferably includes a heating step of heating at least one of the substrate and the hydrophobization liquid supplied to the front surface of the substrate.

A conceivable method for increasing the activity of the hydrophobization liquid supplied to the substrate is, for example, to spout a higher temperature silylation liquid (hydrophobization liquid) from a nozzle to the front surface of the substrate.

The hydrophobization liquid is kept highly active immediately after reaching a higher temperature. However, the activity of the hydrophobization liquid is reduced with time, so that the hydrophobization liquid has a short life cycle. Where the higher temperature hydrophobization liquid is to be spouted from hydrophobization liquid nozzle toward the front surface of the substrate, therefore, the hydrophobization liquid is liable to be supplied in an inactive state to the front surface of the substrate. This may make it impossible to properly form the hydrophobic protection film on the front surface of the substrate.

In the aforementioned method, at least one of the substrate and the supplied hydrophobization liquid is heated simultaneously with the supply of the hydrophobization liquid to the substrate. In this case, the hydrophobization liquid flowing on the substrate is warmed to be highly activated in the vicinity of an interface between the front surface of the substrate and the hydrophobization liquid. This makes it possible to properly form the hydrophobic protection film on the entire front surface of the substrate. Thus, the entire front surface of the substrate is properly and uniformly hydrophobized, thereby substantially preventing the collapse of the pattern on the front surface of the substrate.

The heating step preferably includes a substrate heating step of heating the substrate.

In this method, the substrate is heated simultaneously with the supply of the hydrophobization liquid to the substrate. In this case, the hydrophobization liquid flowing on the substrate is warmed in the vicinity of the interface between the front surface of the substrate and the hydrophobization liquid. Therefore, the hydrophobization liquid is highly activated in the vicinity of the interface between the front surface of the substrate and the hydrophobization liquid, making it possible to properly form the hydrophobic protection film on the entire front surface of the substrate. Thus, the entire front surface of the substrate is properly and uniformly hydrophobized.

According to one embodiment of the present invention, the substrate heating step includes the step of heating the substrate by a heat generation member disposed in opposed relation to a back surface of the substrate.

In this method, the substrate can be heated by the heat generation member disposed in opposed relation to the back surface of the substrate without hindering the supply of the hydrophobization liquid to the front surface of the substrate.

According to another embodiment of the present invention, the substrate heating step includes a first higher temperature gas spouting step of spraying a higher temperature gas having a temperature higher than an ordinary temperature to the substrate from a back side gas outlet port disposed in opposed relation to a peripheral edge portion of the back surface of the substrate.

In this method, the substrate is heated by spraying the higher temperature gas to the substrate from the back side gas outlet port disposed in opposed relation to the back surface of the substrate. This makes it possible to heat the substrate without hindering the supply of the hydrophobization liquid to the front surface of the substrate.

According to further another embodiment of the present invention, the substrate heating step includes a higher temperature liquid spouting step of spouting a liquid having a temperature higher than the ordinary temperature toward the substrate from a liquid outlet port disposed in opposed relation to the peripheral edge portion of the back surface of the substrate.

In this method, the substrate is heated by spouting the higher temperature liquid toward the substrate from the liquid outlet port disposed in opposed relation to the back surface of the substrate. This makes it possible to heat the substrate without hindering the supply of the hydrophobization liquid to the front surface of the substrate.

The hydrophobization liquid supplying step may include the step of spouting a hydrophobization liquid having a predetermined liquid temperature toward the front surface of the substrate from a hydrophobization liquid nozzle, and the heating step may include the step of heating at least one of the substrate and the hydrophobization liquid supplied to the front surface of the substrate to a temperature higher than the liquid temperature of the hydrophobization liquid spouted from the hydrophobization liquid nozzle.

In this method, the hydrophobization liquid having the predetermined liquid temperature is supplied to the front surface of the substrate.

Once the hydrophobization liquid reaches the higher temperature, the activity of the hydrophobization liquid is thereafter reduced with time. If the higher temperature hydrophobization liquid is spouted toward the front surface of the substrate from the hydrophobization liquid nozzle, the hydrophobization liquid is liable to be supplied in an inactive state to the front surface of the substrate. In this case, the hydrophobic protection film cannot be properly formed on the front surface of the substrate.

Where the liquid temperature of the hydrophobization liquid spouted from the hydrophobization liquid nozzle is relatively low such as not to inactivate the hydrophobization liquid, in contrast, the hydrophobization liquid to be supplied to the front surface of the substrate is not inactivated but kept highly active. The highly active hydrophobization liquid is warmed while flowing on the substrate. Thus, the hydrophobization liquid can be further activated. In the aforementioned method, therefore, the hydrophobic protection film can be properly formed on the front surface of the substrate, thereby substantially preventing the collapse of the pattern on the front surface of the substrate.

A hydrophobization liquid having an ordinary temperature (e.g., about 23° C. to about 25° C.) may be spouted from the hydrophobization liquid nozzle.

Alternatively, a hydrophobization liquid having a higher temperature (e.g., 40° C. to 82.4° C.) may be spouted from the hydrophobization liquid nozzle.

According to still another embodiment of the present invention, the substrate heating step includes a second higher temperature gas spouting step of spraying a gas having a temperature higher than the ordinary temperature to the substrate from a front side gas outlet port disposed in opposed relation to the peripheral edge portion of the front surface of the substrate.

In this method, the higher temperature gas is sprayed to the substrate from the front side gas outlet port disposed in opposed relation to the front surface of the substrate, whereby the hydrophobization liquid flowing toward a peripheral edge of the substrate on the front surface of the substrate can be directly heated. Thus, the temperature of the hydrophobization liquid can be efficiently increased.

In the heating step, at least one of a peripheral edge portion of the substrate and a hydrophobization liquid supplied to the peripheral edge portion of the front surface of the substrate may be heated.

In the heating step, at least one of the entire substrate and the hydrophobization liquid supplied to the entire front surface of the substrate may be heated.

In the heating step, at least one of a center portion of the substrate and the hydrophobization liquid supplied to the center portion of the front surface of the substrate may be heated with a smaller heat amount per unit area than the peripheral edge portion of the substrate and the hydrophobization liquid supplied to the peripheral edge portion of the front surface of the substrate.

In the substrate treatment method, the liquid film forming step includes a preliminary solvent supplying step of supplying a solvent having a smaller surface tension than water to the front surface of the substrate before the hydrophobization liquid supplying step, and the heating step is performed simultaneously with the preliminary solvent supplying step.

In this method, the solvent having a smaller surface tension than water is supplied to the substrate before the supply of the hydrophobization liquid to the substrate. Then, the substrate is heated simultaneously with the supply of the solvent to the substrate. Thus, the solvent flowing on the substrate is heated, whereby replacement with the solvent on the front surface of the substrate is achieved at a higher replacement efficiency.

The substrate treatment method further includes a pre-drying solvent supplying step of supplying the solvent having a smaller surface tension than water to the front surface of the substrate after the hydrophobization liquid supplying step before the drying step, and the heating step is performed simultaneously with the pre-drying solvent supplying step.

In this method, the solvent having a smaller surface tension than water is supplied to the substrate after the supply of the hydrophobization liquid to the substrate before the drying. Thus, hydrophobization liquid adhering to the front surface of the substrate is replaced with the solvent. Since the substrate can be dried with the front surface of the substrate covered and protected with the solvent, the collapse of the pattern on the front surface of the substrate can be substantially prevented which may otherwise occur during the drying.

Further, the substrate is heated simultaneously with the supply of the solvent to the substrate. The solvent flowing on the substrate is warmed, whereby the replacement with the solvent on the front surface of the substrate can be achieved at a higher replacement efficiency.

In the substrate treatment method, the liquid film forming step includes the step of forming the liquid film of the treatment liquid on the entire front surface of the substrate, and the inactivation suppressing step includes a dehumidifying step of forming a drying gas stream on the substrate to reduce a humidity on the substrate. The dehumidifying step includes a peripheral edge portion dehumidifying step of spouting a drying gas toward the peripheral edge portion of the front surface of the substrate with the entire front surface of the substrate covered with the liquid film, and the hydrophobization liquid supplying step includes the step of supplying the hydrophobization liquid for hydrophobizing the substrate with the humidity on the substrate kept at a reduced level while rotating the substrate.

In this method, the entire front surface of the substrate is covered with the liquid film. In this state, the drying gas stream is formed on the substrate, whereby an atmosphere on the substrate is replaced with the drying gas. Thus, a moisture-containing atmosphere is removed from above the substrate, so that the humidity on the substrate is reduced. Then, the hydrophobization liquid for hydrophobizing the substrate is supplied to the front surface of the rotating substrate with the humidity on the substrate kept at a reduced level. Thus, the front surface of the substrate is hydrophobized. This reduces a force acting on the pattern (pattern collapsing force) during the drying of the substrate, thereby substantially preventing the collapse of the pattern.

The hydrophobization liquid contains an active species that reacts with the substrate to hydrophobize the front surface of the substrate. The amount of the active species is reduced by the reaction with the substrate. The hydrophobization liquid supplied to the rotating substrate flows outward on the front surface of the substrate. Therefore, the amount of the active species is smaller on the peripheral edge portion of the front surface of the substrate than on the center portion of the front surface of the substrate. Further, the amount of the active species in the hydrophobization liquid is reduced by a reaction with moisture in the atmosphere. On the center portion of the front surface of the substrate, the active species is present in a greater amount and, therefore, the hydrophobization liquid properly reacts with the substrate even at a higher humidity. On the peripheral edge portion of the front surface of the substrate, the active species is present in a smaller amount, so that the reaction between the substrate and the hydrophobization liquid is significantly influenced by the humidity.

As described above, the hydrophobization liquid is supplied to the front surface of the substrate with the humidity on the substrate kept at a reduced level by the drying gas. The drying gas is spouted toward the peripheral edge portion of the front surface of the substrate. Thus, the drying gas stream is formed on the peripheral edge portion of the front surface of the substrate, whereby a humidity on the peripheral edge portion of the front surface of the substrate is reduced. Therefore, the hydrophobization liquid can reliably react with the entire front surface of the substrate, thereby substantially preventing the collapse of the pattern on the entire front surface of the substrate. Further, the drying gas is spouted with the entire front surface of the substrate covered with the liquid film, so that particles and other foreign matter can be substantially prevented from adhering to the peripheral edge portion of the front surface of the substrate. This substantially prevents contamination of the substrate.

The dehumidifying step preferably includes a substrate covering step of forming a drying gas stream radially spreading from the center portion of the front surface of the substrate on the front surface of the substrate to cover the front surface of the substrate with the gas stream.

In this method, the drying gas is spouted toward the peripheral edge portion of the front surface of the substrate covered with the liquid film, and the drying gas stream is formed as radially spreading from the center portion of the front surface of the substrate on the front surface of the substrate. The front surface of the substrate including the center portion is covered with the radially spreading gas stream. Therefore, the moisture-containing atmosphere can be reliably removed from above the substrate to further reduce the humidity on the substrate. Thus, the hydrophobization liquid can reliably react with the entire front surface of the substrate. In this manner, the entire front surface of the substrate can be hydrophobized, thereby substantially preventing the collapse of the pattern.

The dehumidifying step preferably includes a chamber dehumidifying step of supplying the drying gas into a chamber in which the substrate is accommodated to replace an internal atmosphere of the chamber with the drying gas.

In this method, the drying gas is supplied into the chamber to expel the internal atmosphere of the chamber. Thus, the internal atmosphere of the chamber is replaced with the drying gas to reduce a humidity in the chamber. The substrate is accommodated in the chamber. Therefore, the hydrophobization liquid is supplied to the substrate in a lower humidity atmosphere. Thus, the entire front surface of the substrate can be hydrophobized, thereby substantially preventing the collapse of the pattern.

The hydrophobization liquid may be supplied to the substrate with or without the spouting of the drying gas. That is, the hydrophobization liquid supplying step may include the step of supplying the hydrophobization liquid to the front surface of the rotating substrate while reducing the humidity on the substrate by forming the drying gas stream on the substrate. In this case, the moisture-containing atmosphere is continuously removed from above the substrate even during the supply of the hydrophobization liquid to the substrate, so that the humidity on the substrate can be maintained at a reduced level. Therefore, the hydrophobization liquid can reliably react with the entire front surface of the substrate. Thus, the entire front surface of the substrate can be hydrophobized, thereby substantially preventing the collapse of the pattern.

The dehumidifying step preferably includes a setting step of setting gas supplying conditions including a humidity and a flow rate of the drying gas based on a humidity on the substrate observed before the formation of the drying gas stream, and a spouting step of spouting the drying gas according to the gas supplying conditions set in the setting step to form the drying gas stream on the substrate.

The humidity on the substrate is reduced by the drying gas. If the humidity of the drying gas is lower, the humidity on the substrate is further reduced. If the supply flow rate of the drying gas is greater even with the same humidity, the humidity on the substrate is further reduced. In the aforementioned method, the gas supplying conditions including the humidity and the flow rate of the drying gas are set based on the humidity on the substrate observed before the formation of the drying gas stream, i.e., before the dehumidification. If the humidity is higher before the dehumidification, the gas supplying conditions are set so that a drying gas having a lower humidity is supplied at a higher flow rate. Then, the drying gas is spouted according to the gas supplying conditions thus set to form the drying gas stream on the substrate. Thus, the humidity on the substrate is reliably reduced to a predetermined level.

The gas supplying conditions may be set based on a treatment performed on the substrate before the formation of the drying gas stream. More specifically, where the treatment liquid is supplied to the substrate for a longer period of time, where the treatment liquid is supplied in a greater supply amount to the substrate, or where the substrate is rotated at a higher rotation speed, the humidity on the substrate is liable to be increased. Therefore, the gas supplying conditions may be set based on substrate treatment conditions including a treatment liquid supply period and the like.

The gas supplying conditions may be set based on an actual humidity on the substrate. More specifically, the dehumidifying step may further include a measuring step of measuring the humidity on the substrate before the formation of the drying gas stream and, in the setting step, the gas supplying conditions may be set based on the humidity on the substrate measured in the measuring step. In this case, the gas supplying conditions are set based on the actual humidity on the substrate, so that the humidity on the substrate can be reliably reduced to the predetermined level.

The drying gas may be a gas having a humidity that is not higher than a humidity outside the chamber in which the substrate is accommodated.

The hydrophobization liquid may comprise HMDS (hexamethyldisilazane).

The present invention further provides a substrate treatment apparatus, which includes: a substrate holding and rotating unit which holds and rotates a substrate formed with a predetermined pattern; a liquid film forming unit which forms a liquid film entirely covering a front surface of the substrate held by the substrate holding and rotating unit; a hydrophobization liquid supplying unit which supplies a hydrophobization liquid to a center portion of the front surface of the substrate held by the substrate holding and rotating unit for hydrophobizing the substrate; an inactivation suppressing unit which suppresses inactivation of the supplied hydrophobization liquid on a peripheral edge portion of the front surface of the substrate; and a drying unit which dries the substrate held by the substrate holding and rotating unit.

With this arrangement, the hydrophobization liquid is supplied to the substrate. Further, the inactivation of the supplied hydrophobization liquid is suppressed on the peripheral edge portion of the front surface of the substrate. Therefore, a hydrophobic protection film can be properly formed on the entire front surface of the substrate. Thus, the entire front surface of the substrate can be properly and uniformly hydrophobized, thereby substantially preventing the collapse of the pattern.

According to one embodiment of the present invention, the inactivation suppressing unit preferably includes a heat generation member disposed in opposed relation to a back surface of the substrate held by the substrate holding and rotating unit.

With this arrangement, the substrate can be heated by the heat generation member disposed in opposed relation to the back surface of the substrate without hindering the supply of the hydrophobization liquid to the front surface of the substrate.

According to another embodiment of the present invention, the inactivation suppressing unit preferably includes a back side gas spraying unit which sprays a higher temperature gas having a temperature higher than the ordinary temperature to the substrate from a back side gas outlet port disposed in opposed relation to the back surface of the substrate held by the substrate holding and rotating unit.

With this arrangement, the substrate is heated by spraying the higher temperature gas to the substrate from the back side gas outlet port disposed in opposed relation to the back surface of the substrate. Thus, the substrate can be heated without hindering the supply of the hydrophobization liquid to the front surface of the substrate.

According to further another embodiment of the present invention, the inactivation suppressing unit includes a front side gas spraying unit which sprays a higher temperature gas having a temperature higher than the ordinary temperature to the substrate from a front side gas outlet port disposed in opposed relation to the front surface of the substrate held by the substrate holding and rotating unit.

With this arrangement, the higher temperature gas is sprayed to the substrate from the front side gas outlet port disposed in opposed relation to the front surface of the substrate, making it possible to directly heat the hydrophobization liquid flowing toward a peripheral edge of the substrate on the front surface of the substrate. Thus, the temperature of the hydrophobization liquid can be efficiently increased.

According to still another embodiment of the present invention, the inactivation suppressing unit includes a higher temperature liquid spouting unit which spouts a higher temperature liquid having a temperature higher than the ordinary temperature toward the substrate from a liquid outlet port disposed in opposed relation to the back surface of the substrate held by the substrate holding and rotating unit.

With this arrangement, the substrate is heated by spouting the higher temperature liquid toward the substrate from the liquid outlet port disposed in opposed relation to the back surface of the substrate. Thus, the substrate can be heated without hindering the supply of the hydrophobization liquid to the front surface of the substrate.

The foregoing and other objects, features and effects of the present invention will become more apparent from the following detailed description of the preferred embodiments with reference to the attached drawings.

BRIEF DESCRIPTION OF THE DRAWINGS

FIG. 5 is a process diagram for explaining a first exemplary process to be performed for treating a wafer by the substrate treatment apparatus shown in FIGS. 1 and 2.

FIG. 6 is a schematic diagram showing a first solvent supplying step.

FIG. 7 is a schematic diagram showing a hydrophobization liquid supplying step.

FIG. 8 is a sectional view showing an exemplary thin film pattern formed on the wafer.

FIG. 9 is a sectional view showing treatment states of an upper surface of the wafer in the first solvent supplying step and the hydrophobization liquid supplying step.

FIG. 28 is a schematic side view illustrating an inner gas nozzle and an outer gas nozzle according to a ninth embodiment of the present invention.

DETAILED DESCRIPTION OF PREFERRED EMBODIMENTS

Figure 1:
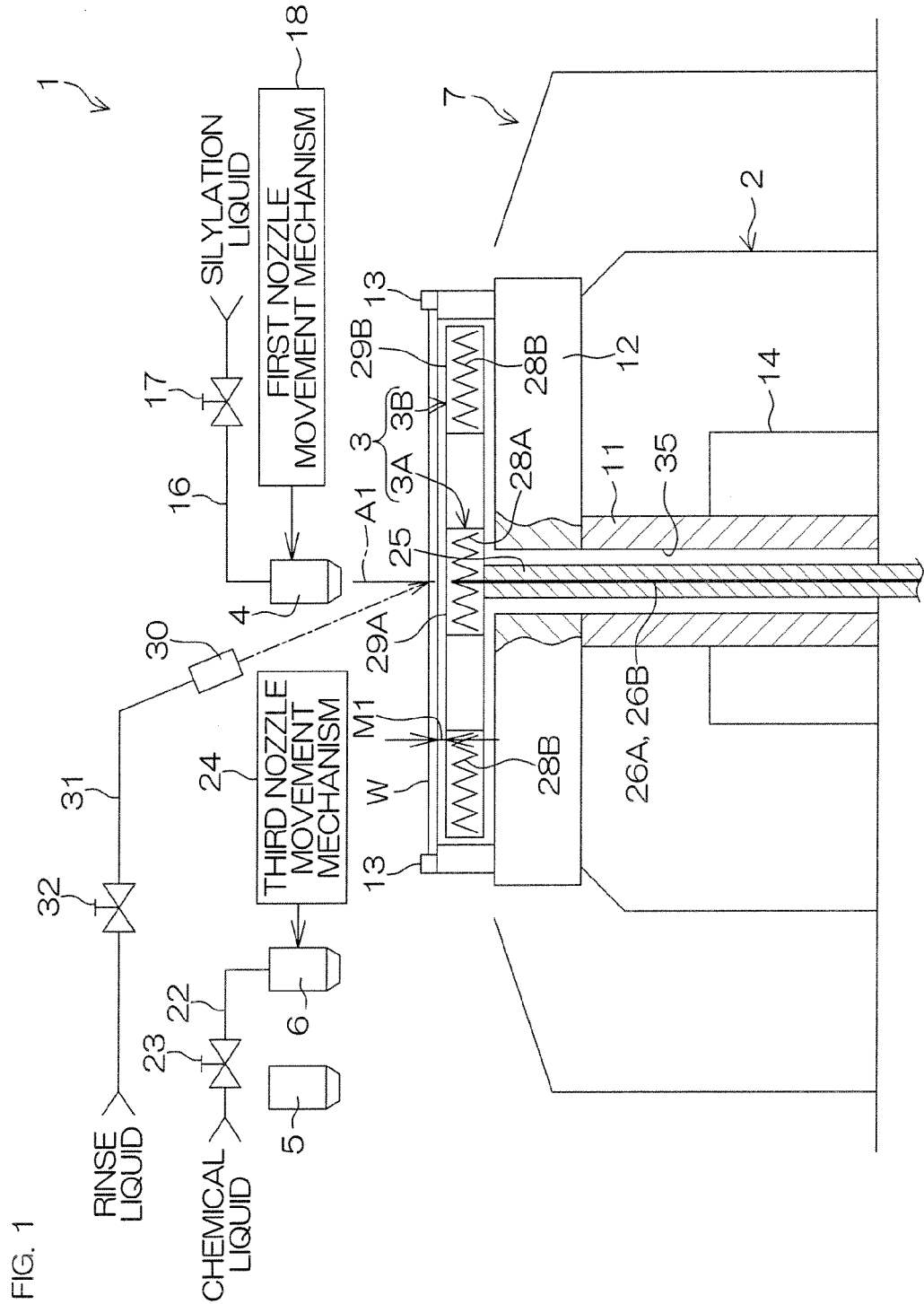
FIG. 1 is a sectional view schematically showing the construction of a substrate treatment apparatus according to a first embodiment of the present invention.
Figure 2:
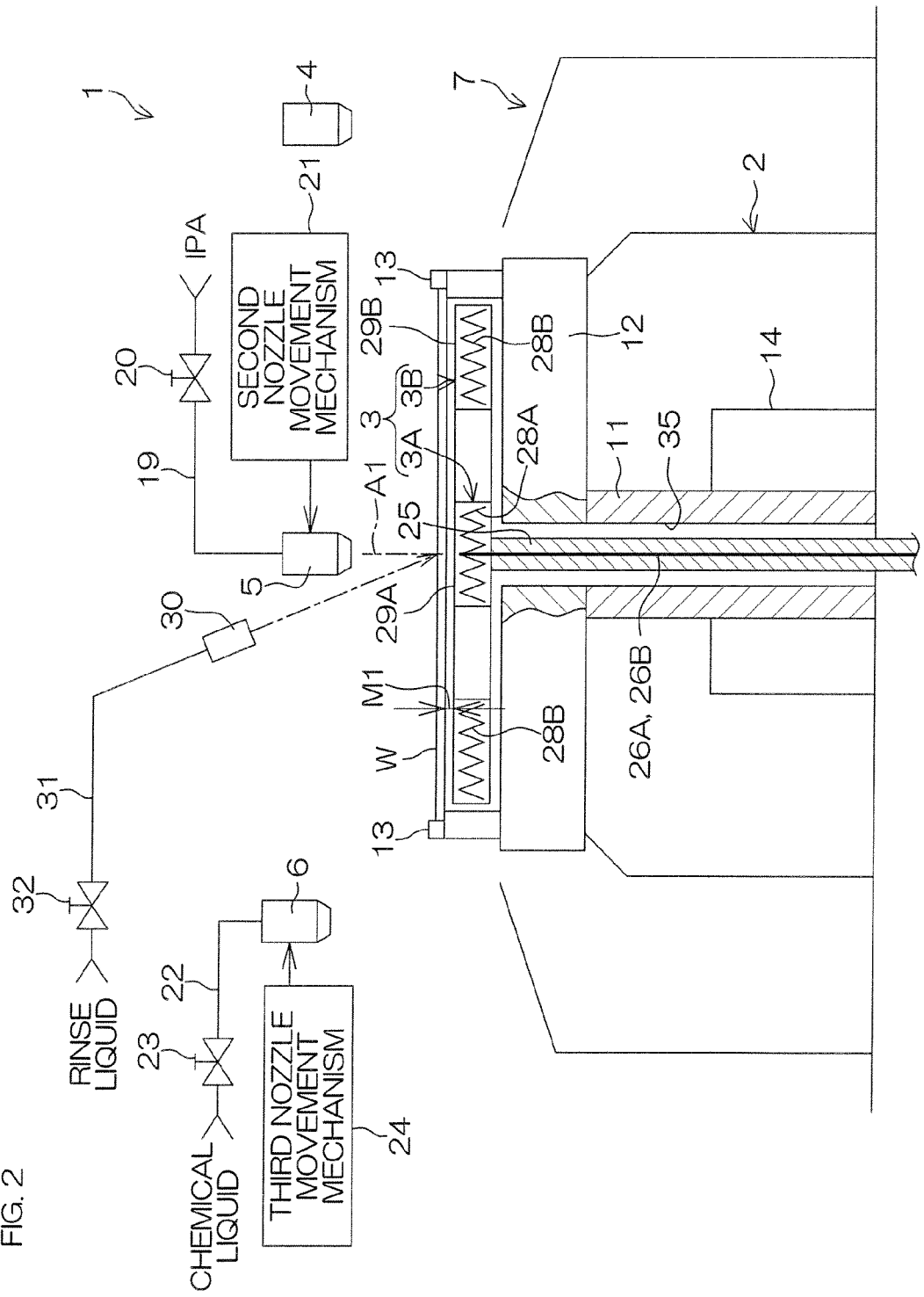
FIG. 2 is another sectional view schematically showing the construction of the substrate treatment apparatus according to the first embodiment of the present invention.

FIGS. 1 and 2 are sectional views schematically showing the construction of a substrate treatment apparatus 1 according to a first embodiment of the present invention.

The substrate treatment apparatus 1 is of a single substrate treatment type which is adapted to treat a single disk-shaped semiconductor wafer W (an example of the substrate, hereinafter referred to simply as "wafer W") with a treatment liquid such as a chemical liquid or a rinse liquid at a time. As shown in FIG. 1, the substrate treatment apparatus 1 includes a spin chuck (substrate holding and rotating unit) 2 which horizontally holds and rotates the wafer W, a heating mechanism 3 disposed in opposed relation to a lower surface of the wafer W held by the spin chuck 2 to heat the wafer W from a lower side, a hydrophobization liquid nozzle (hydrophobization liquid supplying unit) 4 which supplies a silylation liquid (an example of the hydrophobization liquid) to an upper surface (front surface) of the wafer W held by the spin chuck 2, a solvent nozzle 5 which supplies IPA (isopropyl alcohol as an example of the solvent having a smaller surface tension than water) to the upper surface of the wafer W held by the spin chuck 2, a chemical liquid nozzle 6 which supplies a chemical liquid (cleaning liquid) to the upper surface of the wafer W held by the spin chuck 2, a rinse liquid nozzle 30 which supplies a rinse liquid to the upper surface of the wafer W held by the spin chuck 2, and a cup 7 in which the spin chuck 2 is accommodated.

The spin chuck 2 includes a vertically extending tubular rotation shaft 11, a disk-shaped spin base 12 horizontally attached to an upper end of the rotation shaft 11, a plurality of clamping members 13 disposed on the spin base 12, and a spin motor (drying unit) 14 connected to the rotation shaft 11. With the clamping members 13 kept in contact with a peripheral surface of the wafer W, the spin chuck 2 circumferentially holds the wafer W. The wafer W is rotated about a rotation axis A1 extending vertically through the center of the wafer W by inputting a rotative drive force of the spin motor 14 to the rotation shaft 11 with the wafer W held by the clamping members 13.

The hydrophobization liquid nozzle 4 is a straight nozzle, for example, which spouts the silylation liquid downward in the form of a continuous stream. A hydrophobization liquid supply pipe 16 to which the silylation liquid is supplied from a silylation liquid supply source is connected to the hydrophobization liquid nozzle 4. A hydrophobization liquid valve (hydrophobization liquid supplying unit) 17 which opens and closes the hydrophobization liquid supply pipe 16 is provided in the hydrophobization liquid supply pipe 16. With the hydrophobization liquid valve 17 open, the silylation liquid is supplied from the hydrophobization liquid supply pipe 16 to the hydrophobization liquid nozzle 4. With the hydrophobization liquid valve 17 closed, the supply of the silylation liquid from the hydrophobization liquid supply pipe 16 to the hydrophobization liquid nozzle 4 is stopped. The hydrophobization liquid nozzle 4 is connected to a first nozzle movement mechanism 18. The first nozzle movement mechanism 18 moves the hydrophobization liquid nozzle 4 between a silylation treatment position (shown in FIG. 1) located above the spin chuck 2 and a retracted position (shown in FIG. 2) located on a lateral side of the spin chuck 2. The silylation treatment position is defined such that the silylation liquid spouted from the hydrophobization liquid nozzle 4 is supplied to a center portion (the rotation center) of the upper surface of the wafer W held by the spin chuck 2 (see FIG. 1).

The silylation liquid includes a liquid silylation agent. The silylation agent is an organic silicon compound having an ethoxy (or methoxy) group present at one end of the molecule thereof to provide a silanol group (Si—OH) through hydrolysis and an organic functional group such as an amino group or a glycidyl group present at the other end of the molecule.

The silylation agent includes, for example, at least one of HMDS (hexamethyldisilazane) and TMS (tetramethylsilane).

The solvent nozzle 5 is a straight nozzle, for example, which spouts IPA downward in the form of a continuous stream. A solvent supply pipe 19 to which IPA is supplied from a solvent supply source is connected to the solvent nozzle 5. A solvent valve 20 which opens and closes the solvent supply pipe 19 is provided in the solvent supply pipe 19. With the solvent valve 20 open, IPA is supplied from the solvent supply pipe 19 to the solvent nozzle 5. With the solvent valve 20 closed, the supply of IPA from the solvent supply pipe 19 to the solvent nozzle 5 is stopped. The solvent nozzle 5 is connected to a second nozzle movement mechanism 21. The second nozzle movement mechanism 21 moves the solvent nozzle 5 between a solvent treatment position (shown in FIG. 2) located above the spin chuck 2 and a retracted position (shown in FIG. 1) located on a lateral side of the spin chuck 2. The solvent treatment position is defined such that IPA spouted from the solvent nozzle 5 is supplied to the center portion (rotation center) of the upper surface of the wafer W held by the spin chuck 2 (see FIG. 2).

The chemical liquid nozzle 6 is a straight nozzle, for example, which spouts the chemical liquid downward in the form of a continuous stream. A chemical liquid supply pipe 22 to which the chemical liquid is supplied from a chemical liquid supply source is connected to the chemical liquid nozzle 6. A chemical liquid valve 23 which opens and closes the chemical liquid supply pipe 22 is provided in the chemical liquid supply pipe 22. With the chemical liquid valve 23 open, the chemical liquid is supplied from the chemical liquid supply pipe 22 to the chemical liquid nozzle 6. With the chemical liquid valve 23 closed, the supply of the chemical liquid from the chemical liquid supply pipe 22 to the chemical liquid nozzle 6 is stopped. The chemical liquid nozzle 6 is connected to a third nozzle movement mechanism 24. The third nozzle movement mechanism 24 moves the chemical liquid nozzle 6 between a chemical liquid treatment position (not shown) located above the spin chuck 2 and a retracted position located on a lateral side of the spin chuck 2. The chemical liquid treatment position is defined such that the chemical liquid spouted from the chemical liquid nozzle 6 is supplied to the center portion (rotation center) of the upper surface of the wafer W held by the spin chuck 2.

The rinse liquid nozzle 30 is a straight nozzle, for example, which spouts the rinse liquid in the form of a continuous stream. The rinse liquid to be supplied to the rinse liquid nozzle 30 is DIW (deionized water). The rinse liquid nozzle 30 has an outlet port directed toward the center portion of the upper surface of the wafer W held by the spin chuck 2. A rinse liquid supply pipe 31 to which the rinse liquid is supplied from a rinse liquid supply source is connected to the rinse liquid nozzle 30. A rinse liquid valve 32 which opens and closes the rinse liquid supply pipe 31 is provided in the rinse liquid supply pipe 31. With the rinse liquid valve 32 open, the rinse liquid is supplied from the rinse liquid supply pipe 31 to the rinse liquid nozzle 30, whereby the rinse liquid is spouted from the rinse liquid nozzle 30 toward the center portion of the upper surface of the wafer W. The rinse liquid to be supplied to the rinse liquid nozzle 30 is not limited to DIW, but other examples of the rinse liquid include carbonated water, electrolytic ion water, hydrogen water, ozone water and a hydrochloric acid aqueous solution having a dilute concentration (e.g., about 10 to about 100 ppm).

The heating mechanism 3 includes a disk-shaped first heater plate (heat generation member) 3A concentric about the rotation axis A1, and a annular second heater plate (heat generation member) 3B circumferentially surrounding the first heater plate 3A. The first and second heater plates 3A, 3B are disposed between an upper surface of the spin base 12 and the lower surface of the wafer W held by the spin chuck 2. The second heater plate 3B is connected to and fixed to the first heater plate 3A via a connector (not shown).

Figure 3:
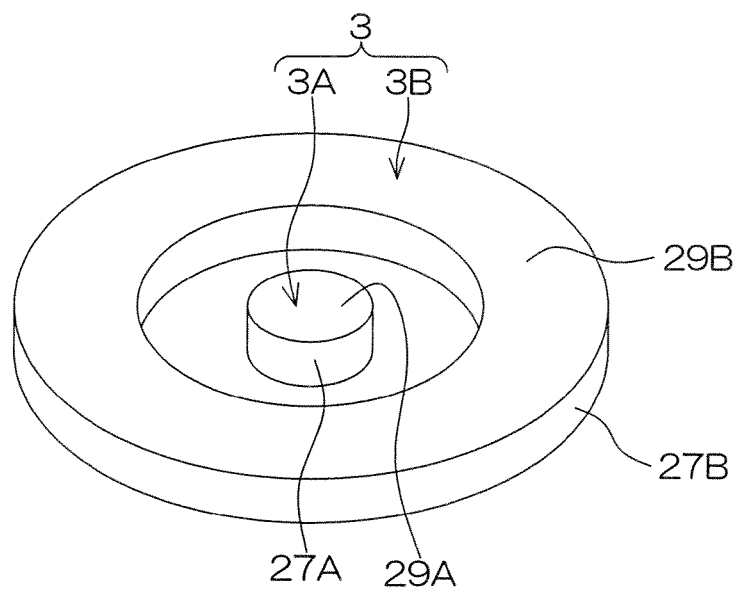
FIG. 3 is a perspective view showing the arrangement of heater plates shown in FIGS. 1 and 2.

FIG. 3 is a perspective view showing the arrangement of the first and second heater plates 3A, 3B. Referring to FIGS. 1 to 3, the first and second heater plates 3A, 3B will be described.

The first heater plate 3A includes a first body 27A such as made of a ceramic material, and a first heater 28A incorporated in the first body 27A. The first body 27A has a round flat upper surface which serves as a first opposed surface 29A to be brought into opposed relation to a center portion of the lower surface of the wafer W held by the spin chuck 2. The first opposed surface 29A is, for example, opposed to a round region of the lower surface of the wafer W defined about the rotation center of the wafer W and having a diameter approximately one-fourth the diameter of the wafer W.

The second heater plate 3B includes a second body 27B such as made of a ceramic material, and a second heater 28B incorporated in the second body 27B. The second body 27B has an annular flat upper surface which serves as a second opposed surface 29B to be opposed to a peripheral edge portion of the lower surface of the wafer W held by the spin chuck 2. The first and second opposed surfaces 29A, 29B are contained in the same horizontal plane. The first and second heater plates 3A, 3B are disposed with the first and second opposed surfaces 29A, 29B thereof respectively spaced a minute distance M1 from the center portion and the peripheral edge portion of the lower surface of the wafer W held by the spin chuck 2. The second opposed surface 29B is, for example, opposed to an annular region of the lower surface of the wafer W (an annular region excluding a round region which is defined about the rotation center of the wafer W and has a diameter approximately three-fourths the diameter of the wafer W).

The first and second heater plates 3A, 3B are supported by a support rod 25 from a lower side. Therefore, the first and second heater plates 3A, 3B are constantly stationary to be kept nonrotatable irrespective of the rotation of the spin base 12.

The support rod 25 extends downward from the center of the first heater plate 3A. The support rod 25 may be unitary with the first heater plate 3A or may be separate from the first heater plate 3A. The support rod 25 vertically extends along the rotation axis A1. The support rod 25 is inserted through a through-hole 35 which extends vertically through the spin base 12 and the support shaft 11. The support rod 25 has a lower end fixed to a peripheral member disposed below the spin chuck 2. Further, a power supply line 26A to the first heater 28A and a power supply line 26B to the second heater 28B are inserted through the through-hole 35. The power supply lines 26A, 26B are connected to the first and second heaters 28A, 28B, respectively.

By the energization of the first heater 28A, the first heater 28A generates heat so that the first heater plate 3A is brought into a heating state. Thus, the first opposed surface 29A functions as a heat generation surface. Since the first opposed surface 29A is opposed to and spaced the minute distance M1 from the lower surface of the wafer W, a center portion of the wafer W is heated by the first heater plate 3A. Thus, the center portion of the wafer W is warmed.

By the energization of the second heater 28B, the second heater 28B generates heat so that the second heater plate 3B is brought into a heating state. Thus, the second opposed surface 29B functions as a heat generation surface. Since the second opposed surface 29B is opposed to and spaced the minute distance M1 from the lower surface of the wafer W, a peripheral edge portion of the wafer W is heated by the second heater plate 3B. Thus, the peripheral edge portion of the wafer W is warmed.

The first heater 28A and the second heater 28B are designed so as to have substantially the same heat generation amount per unit area.

Figure 4:
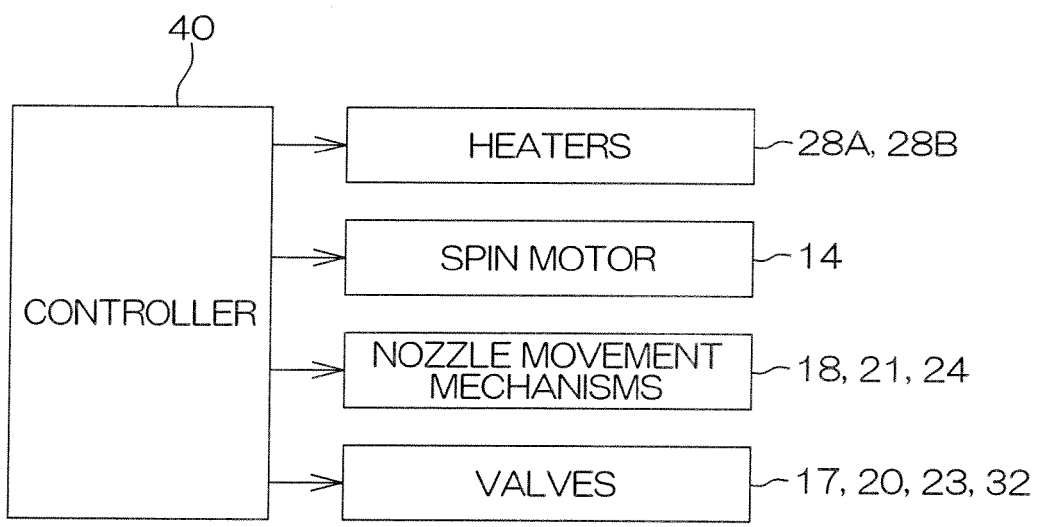
FIG. 4 is a block diagram showing the electrical construction of the substrate treatment apparatus shown in FIGS. 1 and 2.

FIG. 4 is a block diagram showing the electrical construction of the substrate treatment apparatus 1.

The substrate treatment apparatus 1 includes a controller 40 including a microcomputer. The controller 40 controls the operations of the spin motor 14, the first to third nozzle movement mechanisms 18, 21, 24 and the like. The controller 40 also controls the ON/OFF of the first heater 28A and the second heater 28B. Further, the controller 40 controls the opening and the closing of the hydrophobization liquid valve 17, the solvent valve 20, the chemical liquid valve 23 and the rinse liquid valve 32.

FIG. 5 is a process diagram for explaining a first exemplary process to be performed for treating a wafer W by the substrate treatment apparatus 1. FIG. 6 is a schematic diagram showing a first IPA supplying step (preliminary solvent supplying step) of the first exemplary process. FIG. 7 is a schematic diagram showing a hydrophobization liquid supplying step of the first exemplary process. Referring to FIGS. 1, 2 and 4 to 7, the exemplary process will be described which is performed for treating a wafer W having a thin film pattern 101 (see FIG. 8) formed on a front surface (device formation surface) thereof. In the following description, "the front surface (upper surface) of the wafer W" is intended to include the front surface (upper surface) of the wafer W itself as well as the front surface (upper surface) of the thin film pattern 101.

An untreated wafer W is loaded into a treatment chamber (not shown) by a transport robot (not shown) (Step S0), and placed on the spin chuck 2 with its front surface (device formation surface) facing up. At this time, a back surface (non-device-formation surface) of the substrate W faces down. Then, the controller 40 controls the spin chuck 2 to hold the placed wafer W. The hydrophobization liquid nozzle 4, the solvent nozzle 5 and the chemical liquid nozzle 6 are located at their retracted positions to prevent the transport robot and the wafer W from colliding against the hydrophobization liquid nozzle 4, the solvent nozzle 5 and the chemical liquid nozzle 6.

Subsequently, a chemical liquid supplying step is performed to supply the chemical liquid to the wafer W (Step S1). More specifically, the controller 40 controls the third nozzle movement mechanism 24 to move the chemical liquid nozzle 6 from the retracted position to the chemical liquid treatment position with the hydrophobization liquid nozzle 4 and the solvent nozzle 5 located at their retracted positions. Further, the controller 40 controls the spin motor 14 to rotate the wafer W held by the spin chuck 2. The controller 40 spouts the chemical liquid from the chemical liquid nozzle 6 to a center portion of the upper surface of the wafer W while causing the spin chuck 2 to rotate the wafer W. Thus, the chemical liquid is supplied to the entire upper surface of the wafer W, whereby the upper surface of the wafer W is treated (cleaned) with the chemical liquid (chemical liquid treatment process). After the chemical liquid treatment process is performed for a predetermined period, the controller 40 closes the chemical liquid valve 12 to stop spouting the chemical liquid from the chemical liquid nozzle 6. Thereafter, the controller 40 controls the third nozzle movement mechanism 24 to move the chemical liquid nozzle 6 to the retracted position.

In the chemical liquid treatment process, the third nozzle movement mechanism 24 may be controlled so that a supply position at which the chemical liquid supplied from the chemical liquid nozzle 6 is applied on the upper surface of the wafer W is reciprocally moved along an arcuate path crossing a wafer rotating direction within a range extending from the rotation center of the wafer W to a peripheral edge of the wafer W.

Then, a rinse liquid supplying step (liquid film forming step) is performed to supply the rinse liquid to the wafer W (Step S2). More specifically, the controller 40 opens the rinse liquid valve 32 to spout the rinse liquid toward the center portion of the upper surface of the wafer W from the rinse liquid nozzle 30 while causing the spin chuck 2 to rotate the wafer W. Thus, the rinse liquid is supplied to the entire upper surface of the wafer W, whereby chemical liquid adhering to the wafer W is rinsed away with the DIW (rinsing process). After the rinsing process is performed for a predetermined period, the controller 40 closes the rinse liquid valve 32 to stop spouting the rinse liquid from the rinse liquid nozzle 30.

Subsequently, a first solvent supplying step is performed to supply IPA (an example of the solvent) to the wafer W (Step S3, see FIG. 6). More specifically, the controller 40 controls the second nozzle movement mechanism 21 to move the solvent nozzle 5 from the retracted position to the solvent treatment position (shown in FIGS. 2 and 6) with the hydrophobization liquid nozzle 4 and the chemical liquid nozzle 6 located at their retracted positions. Further, the controller 40 energizes the first and second heaters 28A, 28B to bring the first and second heater plates 3A, 3B into the heating state. Thus, the center portion and the peripheral edge portion of the wafer W are heated to a predetermined heating temperature (e.g., a predetermined temperature within a range of 40° C. to 82.4° C., that is higher than the liquid temperature of the silylation liquid to be spouted).

After the wafer W is sufficiently warmed, the controller 40 spouts IPA having an ordinary temperature (e.g., about 23° C. to about 25° C.) from the solvent nozzle 5 toward the center portion of the upper surface of the wafer W while continuously energizing the first and second heaters 28A, 28B. As shown in FIG. 6, IPA reaching the center portion of the upper surface of the wafer W receives a centrifugal force generated by the rotation of the wafer W to spread toward the peripheral edge of the wafer W on the upper surface of the wafer W. Thus, IPA is supplied to the entire upper surface of the wafer W, whereby rinse liquid adhering to the upper surface of the wafer W is rinsed away with IPA to be replaced with IPA. Since the center portion and the peripheral edge portion of the wafer W are heated, IPA is warmed while flowing on the wafer W. Thus, the temperature of IPA is elevated to a level substantially equal to the heating temperature.

After a lapse of a predetermined period from the start of the supply of IPA, the controller 40 closes the solvent valve 20 to stop spouting IPA from the solvent nozzle 5. Thereafter, the controller 40 controls the second nozzle movement mechanism 21 to move the solvent nozzle 5 to the retracted position.

In turn, a hydrophobization liquid supplying step is performed to supply the silylation liquid (an example of the hydrophobization liquid) to the wafer W (Step S4, see FIG. 7). More specifically, the controller 40 controls the first nozzle movement mechanism 18 to move the hydrophobization liquid nozzle 4 from the retracted position to the silylation treatment position (shown in FIGS. 1 and 7) with the solvent nozzle 5 and the chemical liquid nozzle 6 located at their retracted positions.

The controller 40 opens the hydrophobization liquid valve 17 to spout the silylation liquid having an ordinary temperature (e.g., about 23° C. to about 25° C.) from the hydrophobization liquid nozzle 4 toward the center portion of the upper surface of the wafer W, while continuously energizing the first and second heaters 28A, 28B. As shown in FIG. 7, silylation liquid reaching the center portion of the upper surface of the wafer W receives a centrifugal force generated by the rotation of the wafer W to spread toward the peripheral edge of the wafer W on the upper surface of the wafer W, whereby the silylation liquid is supplied to the entire upper surface of the wafer W. IPA adhering to the wafer W is replaced with the silylation liquid supplied to the entire upper surface of the wafer W. Thus, the silylation liquid enters an inner portion of the thin film pattern 101 (between adjacent projection patterns 105) to form a less wettable hydrophobic protection film 106 (see FIG. 8) on the upper surface of the wafer W (hydrophobization process). Thus, all the projection patterns 105 on the upper surface of the wafer W are covered with the hydrophobic protection film 106.

Since the center portion and the peripheral edge portion of the wafer W are heated, the silylation liquid is warmed while flowing on the wafer W. Thus, the liquid temperature of the silylation liquid is elevated to a level substantially equal to the temperature of the first and second heater plates 3A, 3B.

After the hydrophobization process is performed for a predetermined period, the controller 40 controls the hydrophobization liquid valve 17 to stop spouting the silylation liquid. Thereafter, the controller 40 controls the first nozzle movement mechanism 18 to move the hydrophobization liquid nozzle 4 to the retracted position. The controller 40 stops the energization of the first and second heaters 28A, 28B to stop the heat generation from the first and second heaters 28A, 28B. Thus, the temperature of the wafer W is reduced to finally reach the ordinary temperature.

In turn, a second solvent supplying step (pre-drying solvent supplying step) is performed to supply IPA (an example of the solvent) to the wafer W before a drying step (Step S5). More specifically, the controller 40 controls the second nozzle movement mechanism 21 to move the solvent nozzle 5 from the retracted position to the solvent treatment position (see FIGS. 2 and 6) with the hydrophobization liquid nozzle 4 and the chemical liquid nozzle 6 located at their retracted positions. The controller 40 spouts IPA having an ordinary temperature (e.g., about 23° C. to about 25° C.) from the solvent nozzle 5 toward the center portion of the upper surface of the wafer W, while causing the spin chuck 2 to rotate the wafer W. IPA reaching the center portion of the upper surface of the wafer W receives a centrifugal force generated by the rotation of the wafer W to spread toward the peripheral edge of the wafer W on the upper surface of the wafer W, whereby IPA is supplied to the entire upper surface of the wafer W. Thus, silylation liquid adhering to the upper surface of the wafer W is rinsed away with IPA to be replaced with IPA. After a lapse of a predetermined period from the start of the supply of IPA, the controller 40 closes the solvent valve 20 to stop spouting IPA from the solvent nozzle 5. Thereafter, the controller 40 controls the second nozzle movement mechanism 21 to move the solvent nozzle 5 to the retracted position.

Then, the drying step is performed to dry the wafer W (Step S6). More specifically, the controller 40 controls the spin motor 14 to rotate the wafer W at a higher rotation speed (e.g., 2500 rpm or higher). Thus, a greater centrifugal fore acts on IPA adhering to the upper surface of the wafer W, whereby IPA is spun around the wafer W. Thus, IPA is removed from the wafer W to dry the wafer W (drying process). After the drying process is performed for a predetermined period, the controller 40 controls the spin motor 14 to cause the spin chuck 2 to stop rotating the wafer W. Thereafter, the treated wafer W is unloaded from the spin chuck 2 by the transport robot (Step S7).

FIG. 8 is a sectional view showing an example of the thin film pattern 101 formed on the wafer W to be treated by the substrate treatment apparatus 1.

The wafer W to be treated by the substrate treatment apparatus 1 is, for example, a silicon (Si) wafer (an example of the substrate) having a minute thin film pattern 101 formed on a front surface thereof. The thin film pattern 101 includes a plurality of projection patterns 105 arranged at a pattern pitch of about 10 nm to several micrometers as extending in the same direction and each having a line width of about 10 nm to about 45 nm.

The thin film pattern 101 includes at least an insulator film. The thin film pattern 101 may include a conductor film. More specifically, the thin film pattern 101 may have a layered structure including a plurality of films including the insulator film and the conductor film. The insulator film may be an $SiO_2$ film. The conductor film may be an amorphous silicon film doped with an impurity for reduction of resistance, or may be a metal film (e.g., a metal interconnection film). Examples of the films for the layered structure include a polysilicon film, an SiN film, a BSG film (a boron-containing $SiO_2$ film) and a TEOS film (an $SiO_2$ film formed by a CVD method using TEOS (tetraethoxysilane)).

The projection patterns 105 each have a film thickness T of, for example, about 50 nm to about 5 μm. The projection patterns 105 may have an aspect ratio (the ratio of film thickness T to the line width W1) of, for example, about 5 to about 500.

Where the projection patterns 105 are covered with the hydrophobic protection film 106 as shown in FIG. 8, the treatment liquid 107 has a relatively great contact angle θ1 (close to 90 degrees) when the front surface of the wafer W is partly wetted with the treatment liquid 107.

When the wafer W formed with the projection patterns 105 is dried, the projection patterns 105 are liable to collapse due to an attractive force which attracts the projection patterns 105 to each other during the drying of the wafer W. A force acting on the projection patterns 105 is calculated from the following expression (1):

$$(2 \times \sigma \times T \cos \theta 1)/W2 \tag{1}$$

wherein σ is the surface tension of the treatment liquid 107, and W2 is a distance between adjacent projection patterns 105, and T is the height of the projection patterns 105.

The expression (1) indicates that the force acting on the projection patterns 105 is reduced as the surface tension σ of the treatment liquid decreases. Therefore, the force acting on the projection patterns 105 is reduced by reducing the surface tension σ of the treatment liquid, thereby substantially preventing the collapse of the projection patterns 105.

Further, the force acting on the projection patterns 105 is reduced as the contact angle θ1 becomes closer to 90 degrees. Therefore, the contact angle θ1 is made closer to 90 degrees by hydrophobizing the front surface of the wafer W, thereby substantially preventing the collapse of the projection patterns 105.

If the front surface of the wafer W is insufficiently hydrophobized, the force acting on the projection patterns 105 is insufficiently reduced, making it impossible to sufficiently suppress the collapse of the projection patterns 105. In order to sufficiently suppress the collapse of the projection patterns 105, therefore, it is necessary to properly cover the entire front surface of the wafer W with the hydrophobic protection film 106 (to properly hydrophobize the entire front surface of the wafer W).

FIG. 9 is a sectional view showing treatment states of the upper surface of the wafer W in the first solvent supplying step (Step S3 in FIG. 5, also see FIG. 6) and in the hydrophobization liquid supplying step (Step S4 in FIG. 5, also see FIG. 7). In FIG. 9, the states of the peripheral edge portion and the center portion of the wafer W observed in the first solvent supplying step and the states of the peripheral edge portion and the center portion of the wafer W observed in the hydrophobization liquid supplying step are shown in this order from the left side.

When the first solvent supplying step is performed, the center portion and the peripheral edge portion of the wafer W are heated. Since the first heater 28A and the second heater 28B generate substantially the same heat amount per unit area, the center portion and the peripheral edge portion of the wafer W are warmed up to the same temperature. On the center portion of the wafer W, therefore, higher temperature IPA enters the inner portion of the thin film pattern 101 (between the adjacent projection patterns 105) to reach closer to the upper surface of the wafer W (the upper surface of the wafer W itself), because convection occurs in IPA present on the center portion. On the peripheral edge portion of the wafer W, higher temperature IPA enters the inner portion of the thin film pattern 101 (between the adjacent projection patterns 105) to reach closer to the upper surface of the wafer W (the upper surface of the wafer W itself), because convection occurs in IPA present on the peripheral edge portion. Thus, the IPA replacement efficiency can be increased on the entire front surface of the wafer W.

When the hydrophobization liquid supplying step is performed, the center portion and the peripheral edge portion of the wafer W are heated. At this time, the first heater 28A and the second heater 28B generate substantially the same heat amount per unit area, so that the center portion and the peripheral edge portion of the wafer W are warmed up to the same temperature. On the center portion of the wafer W, therefore, the higher temperature silylation liquid enters the inner portion of the thin film pattern 101 (between the adjacent projection patterns 105) to reach closer to the upper surface of the wafer W (the upper surface of the wafer W itself), because convection occurs in the silylation liquid present on the center portion. On the peripheral edge portion of the wafer W, the higher temperature silylation liquid enters the inner portion of the thin film pattern 101 (between the adjacent projection patterns 105) to reach closer to the upper surface of the wafer W (the upper surface of the wafer W itself), because convection occurs in the silylation liquid present on the peripheral edge portion.

The activity of the silylation liquid is increased as the temperature of the silylation liquid increases. That is, the higher temperature silylation liquid has a higher activity.

According to this embodiment, as described above, the wafer W is heated during the supply of the silylation liquid to the wafer W. In this case, the silylation liquid flowing on the wafer W is warmed in the vicinity of an interface between the upper surface of the wafer W and the silylation liquid. Therefore, the silylation liquid is highly activated in the vicinity of the interface between the upper surface of the wafer W and the silylation liquid.

Since the center portion and the peripheral edge portion of the wafer W are warmed up to the same temperature, the silylation liquid is kept highly active on the peripheral edge portion of the wafer W. Thus, the hydrophobic protection film 106 (see FIG. 8) can be formed as having a greater contact angle on the entire upper surface of the wafer W. Therefore, the entire upper surface of the wafer W can be properly and uniformly hydrophobized.

According to this embodiment, the silylation liquid having an ordinary temperature is supplied to the upper surface of the wafer W. Once the silylation liquid reaches a higher temperature, the activity of the silylation liquid is thereafter reduced with time. Where the higher temperature silylation liquid is spouted from the hydrophobization liquid nozzle 4 toward the upper surface of the wafer W, therefore, the silylation liquid is liable to be supplied in an inactive state to the upper surface of the wafer W. This may make it impossible to properly form the hydrophobic protection film 106 on the upper surface (front surface) of the wafer W.

Where the silylation liquid is spouted at the ordinary temperature from the hydrophobization liquid nozzle 4, in contrast, the silylation liquid supplied to the upper surface of the wafer W is not inactivated but kept highly active. Then, the highly active silylation liquid is warmed while flowing on the wafer W. This makes it possible to further activate the silylation liquid.

As described above, the hydrophobic protection film 106 can be properly formed on the entire upper surface of the wafer W. Thus, the contact angle of the treatment liquid 107 with respect to the upper surface of the wafer W can be made closer to 90 degrees on the entire upper surface of the wafer W. As a result, the force acting on the projection patterns 105 can be reduced, thereby substantially preventing the collapse of the projection patterns 105.

Further, the wafer W is heated by the heat generation from the first and second heater plates 3A, 3B disposed in opposed relation to the lower surface of the wafer W. Therefore, the heating of the wafer W can be achieved without hindering the supply of the silylation liquid and the treatment liquid (e.g., IPA) to the upper surface of the wafer W.

In this embodiment, the wafer W is heated by the first and second heater plates 3A, 3B during a period from the start of the first solvent supplying step (Step S3) to the end of the hydrophobization liquid supplying step (Step S4). In other words, the wafer W is heated during the first solvent supplying step. In the first solvent supplying step, IPA flowing on the wafer W is warmed, so that the IPA replacement efficiency on the upper surface of the wafer W can be increased in the first solvent supplying step.

Figure 10:
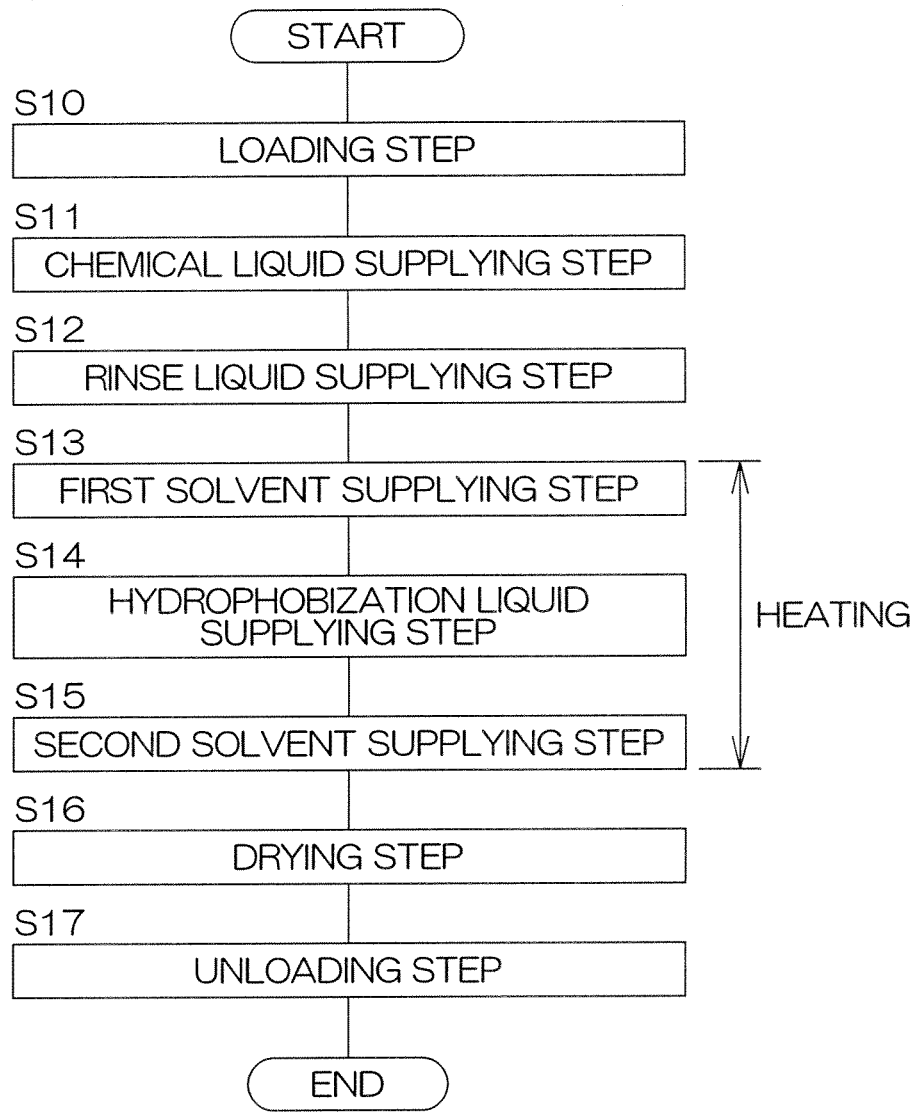
FIG. 10 is a process diagram for explaining a second exemplary process to be performed for treating a wafer by the substrate treatment apparatus shown in FIGS. 1 and 2.

FIG. 10 is a process diagram for explaining a second exemplary process to be performed for treating a wafer W by the substrate treatment apparatus 1.

In the second exemplary process, an untreated wafer W is loaded into the treatment chamber (not shown) by the transport robot (not shown) (Step S10), and then the spin motor 14 is controlled to rotate the wafer W held by the spin chuck 2. Thereafter, a chemical liquid supplying step (Step S11) of supplying the chemical liquid to the wafer W, a rinse liquid supplying step (liquid film forming step, Step S12) of supplying the rinse liquid to the wafer W, a first solvent supplying step (preliminary solvent supplying step, Step S13) of supplying IPA to the wafer W, a hydrophobization liquid supplying step (Step S14) of supplying the silylation liquid to the wafer W, a second solvent supplying step (pre-drying solvent supplying step, Step S15) of supplying IPA to the wafer W, and a drying step (Step S16) of drying the wafer W are performed in this order.

The chemical liquid supplying step of Step S11 is equivalent to the chemical liquid supplying step (Step S1 in FIG. 5)

in the first exemplary process. The rinse liquid supplying step of Step S12 is equivalent to the rinse liquid supplying step (Step S2 in FIG. 5) in the first exemplary process. The first solvent supplying step of Step S13 is equivalent to the first solvent supplying step (Step S3 in FIG. 5) in the first exemplary process. The hydrophobization liquid supplying step of Step S14 is equivalent to the hydrophobization liquid supplying step (Step S4 in FIG. 5) in the first exemplary process. The second solvent supplying step of Step S15 is substantially equivalent to the second solvent supplying step (Step S5 in FIG. 5) in the first exemplary process, except that the wafer W is heated. The drying step of Step S16 is equivalent to the drying step (Step S6 in FIG. 5) in the first exemplary process.

The second exemplary process differs from the first exemplary process in that the wafer W is heated by the first and second heater plates 3A, 3B in a period from the start of the first solvent supplying step (Step S13) to the end of the first {second} solvent supplying step (Step S15). The second exemplary process will hereinafter be described more specifically.

In the second exemplary process, the controller 40 energizes the first and second heaters 28A, 28B to bring the first and second heater plates 3A, 3B into the heating state prior to the start of the first solvent supplying step (Step S13) as in the first exemplary process. Thus, the center portion and the peripheral edge portion of the wafer W are each heated up to the predetermined heating temperature. Thereafter, the first and second heater plates 3A, 3B are kept in the heating state during the first solvent supplying step (Step S13) and the hydrophobization liquid supplying step (Step S14). Further, the first and second heater plates 3A, 3B are kept in the heating state during the second solvent supplying step (Step S15).

After completion of the second solvent supplying step (Step S15), the controller 40 stops the energization of the first and second heaters 28A, 28B to stop the heat generation from the first and second heaters 28A, 28B. Thus, the temperature of the wafer W is reduced to finally reach the ordinary temperature.

In the second exemplary process, the center portion and the peripheral edge portion of the wafer W are heated during the second solvent supplying step. On the center portion of the wafer W, therefore, higher temperature IPA enters the inner portion of the thin film pattern 101 to reach closer to the upper surface of the wafer W (the upper surface of the wafer W itself), because convection occurs in IPA flowing on the center portion. On the peripheral edge portion of the wafer W, higher temperature IPA enters the inner portion of the thin film pattern 101 to reach closer to the upper surface of the wafer W (the upper surface of the wafer W itself), because convection occurs in IPA flowing on the peripheral edge portion. Thus, the IPA replacement efficiency can be increased on the entire front surface of the wafer W in the second solvent supplying step.

After the drying step (Step S16) is performed for the predetermined period, the controller 40 controls the spin motor 14 to cause the spin chuck 2 to stop rotating the wafer W. Thereafter, the treated wafer W is unloaded from the spin chuck 2 by the transport robot (Step S17).

Figure 11:
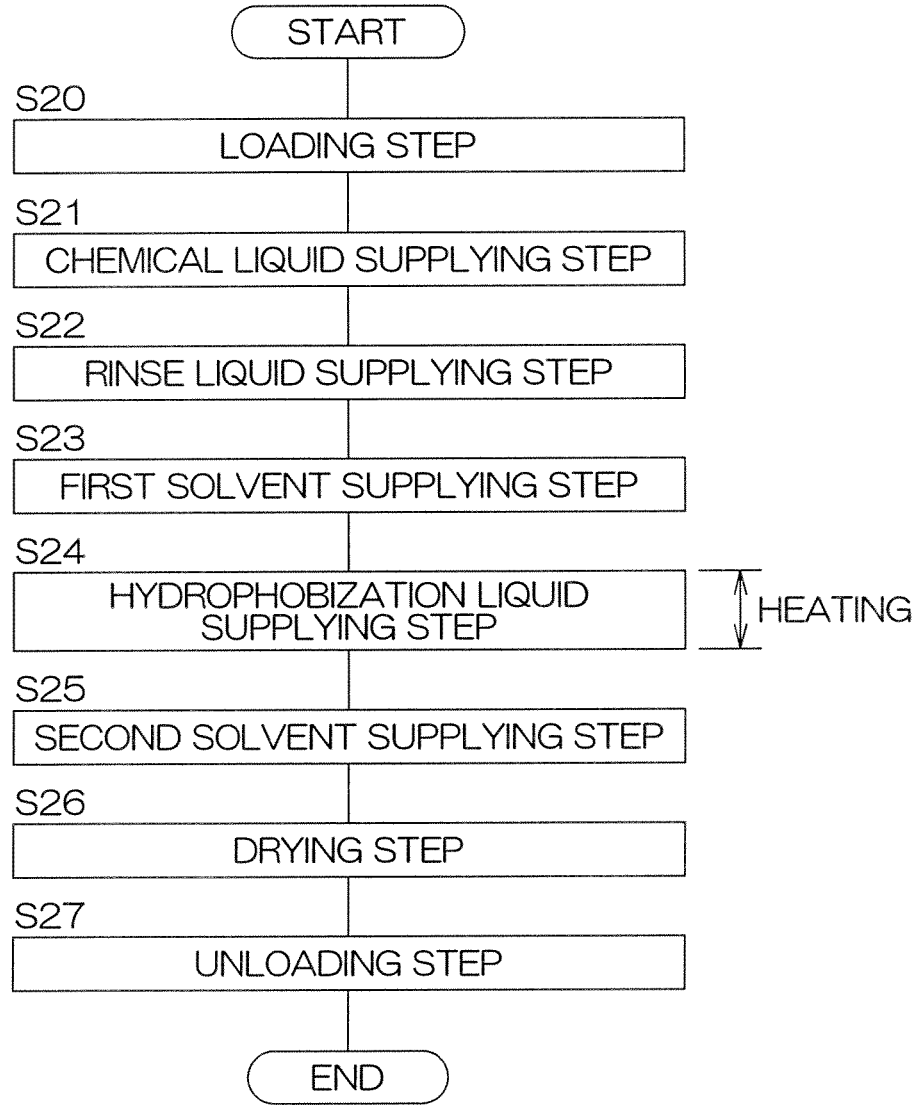
FIG. 11 is a process diagram for explaining a third exemplary process to be performed for treating a wafer by the substrate treatment apparatus shown in FIGS. 1 and 2.

FIG. 11 is a process diagram for explaining a third exemplary process to be performed for treating a wafer W by the substrate treatment apparatus 1.

In the third exemplary process, an untreated wafer W is loaded into the treatment chamber (not shown) by the transport robot (not shown) (Step S20), and then the spin motor 14 is controlled to rotate the wafer W held by the spin chuck 2. Thereafter, a chemical liquid supplying step (Step S21) of supplying the chemical liquid to the wafer W, a rinse liquid supplying step (liquid film forming step, Step S22) of supplying the rinse liquid to the wafer W, a first solvent supplying step (preliminary solvent supplying step, Step S23) of supplying IPA to the wafer W, a hydrophobization liquid supplying step (Step S24) of supplying the silylation liquid to the wafer W, a second solvent supplying step (pre-drying solvent supplying step, Step S25) of supplying IPA to the wafer W, and a drying step (Step S26) of drying the wafer W are performed in this order.

The chemical liquid supplying step of Step S21 is equivalent to the chemical liquid supplying step (Step S1 in FIG. 5) in the first exemplary process. The rinse liquid supplying step of Step S22 is equivalent to the rinse liquid supplying step (Step S2 in FIG. 5) in the first exemplary process. The first solvent supplying step of Step S23 is substantially equivalent to the first solvent supplying step (Step S3 in FIG. 5) in the first exemplary process, except that the wafer W is not heated. The hydrophobization liquid supplying step of Step S24 is equivalent to the hydrophobization liquid supplying step (Step S4 in FIG. 5) in the first exemplary process. The second solvent supplying step of Step S25 is equivalent to the second solvent supplying step (Step S5 in FIG. 5) in the first exemplary process. The drying step of Step S26 is equivalent to the drying step (Step S6 in FIG. 5) in the first exemplary process.

The third exemplary process differs from the first exemplary process in that the wafer W is heated by the first and second heater plates 3A, 3B only in a period from the start of the hydrophobization liquid supplying step (Step S24) to the end of the hydrophobization liquid supplying step (Step S24) but the wafer W is not heated during the first solvent supplying step (Step S23). The third exemplary process will hereinafter be described more specifically.

In the third exemplary process, the controller 40 energizes the first and second heaters 28A, 28B to bring the first and second heater plates 3A, 3B into the heating state prior to the start of the hydrophobization liquid supplying step (Step S24) after completion of the first solvent supplying step (Step S23). Thus, the center portion and the peripheral edge portion of the wafer W are each heated up to the predetermined heating temperature.

As in the first exemplary process, the controller 40 stops the energization of the first and second heaters 28A, 28B to stop the heat generation from the first and second heaters 28A, 28B after the spouting of the silylation liquid is stopped. Thus, the temperature of the wafer W is reduced to finally reach the ordinary temperature.

After the drying step (Step S26) is performed for the predetermined period, the controller 40 controls the spin motor 14 to cause the spin chuck 2 to stop rotating the wafer W. Thereafter, the treated wafer W is unloaded from the spin chuck 2 by the transport robot (not shown) (Step S27).

[Second Embodiment]

Figure 12:
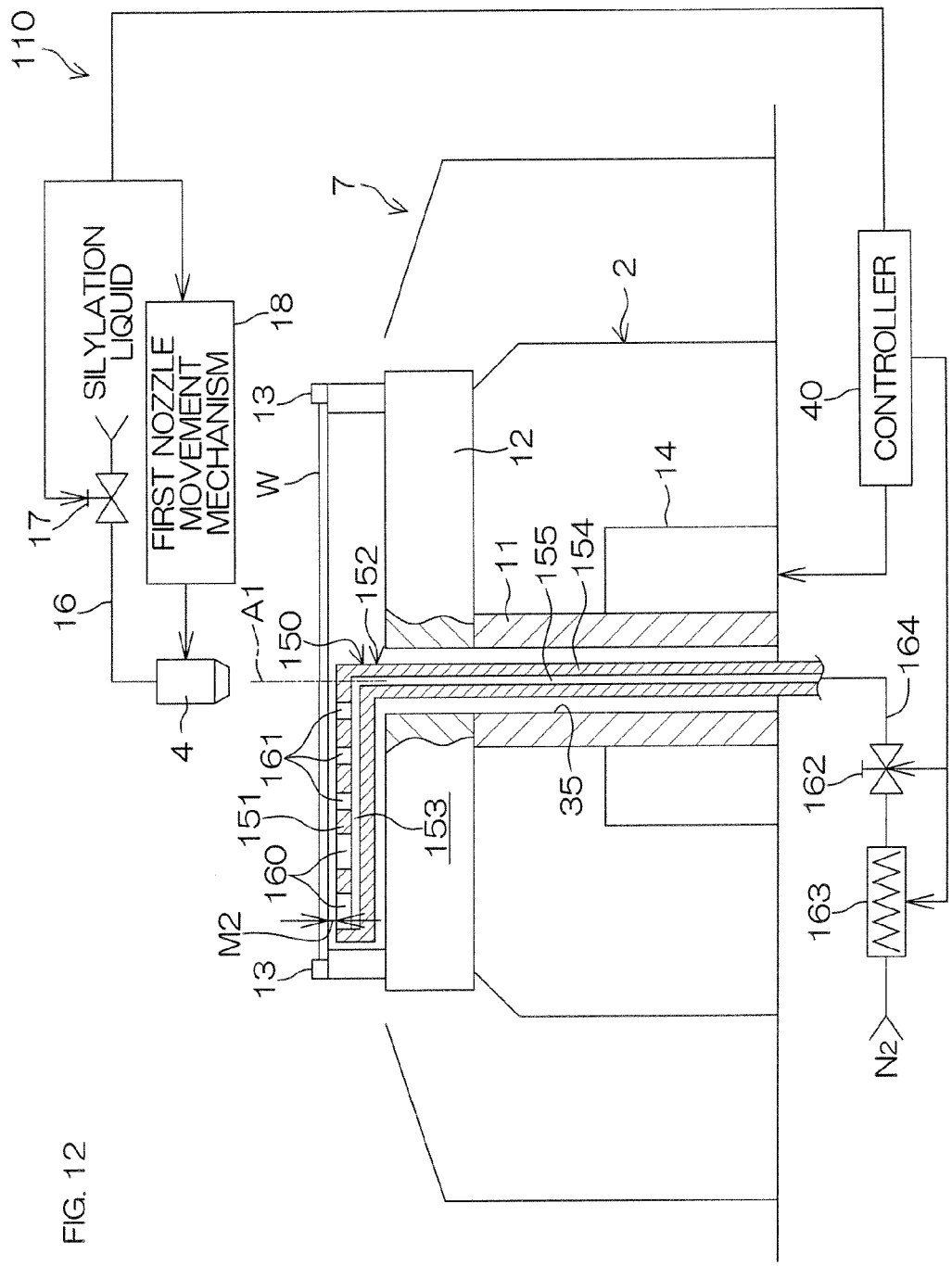
FIG. 12 is a sectional view schematically showing the construction of a substrate treatment apparatus according to a second embodiment of the present invention.

FIG. 12 is a sectional view schematically showing the construction of a substrate treatment apparatus 110 according to a second embodiment of the present invention. In FIG. 12, components corresponding to those shown in the aforementioned first embodiment will be designated by the same reference characters as in FIGS. 1 and 4, and duplicate description will be omitted.

The substrate treatment apparatus 110 differs from the substrate treatment apparatus 1 according to the first embodiment in that a back side gas spraying mechanism (back side gas spraying unit) 150 which sprays a higher temperature gas to the lower surface (back surface) of the wafer W held by the spin chuck 2 is provided instead of the heating mechanism 3.

The back side gas spraying mechanism 150 includes an elongated bar-shaped gas nozzle 151 extending horizontally along a rotation radius of the wafer W from the rotation axis A1, and a higher temperature gas supplying mechanism 152 which supplies a higher temperature inert gas (higher temperature gas) to the gas nozzle 151.

The gas nozzle 151 is disposed between the upper surface of the spin base 12 and the lower surface of the wafer W held by the spin chuck 2. The gas nozzle 151 has a hollow inside, and a gas supply passage 153 is defined in the gas nozzle 151 as extending in conformity with the shape of the gas nozzle 151. The gas nozzle 151 has a center end which is connected to and fixed to an insertion pipe 154 to be described later. Therefore, the gas nozzle 151 is constantly stationary to be kept nonrotatable irrespective of the rotation of the spin base 12.

A plurality of back side gas outlet ports 160, 161 are provided in an upper region of the gas nozzle 151 in opposed relation to the lower surface of the wafer W held by the spin chuck 2 as aligning in a row along the rotation radius of the wafer W. The back side gas outlet ports 160, 161 are arranged equidistantly (at a uniform density) in a region of the gas nozzle 151 not opposed to the rotation center of the wafer W. The back side gas outlet ports 160, 161 communicate with the gas supply passage 153, and are adapted to spout the inert gas supplied to the back side gas outlet ports 160, 161 vertically upward. The back side gas outlet ports 160, 161 are opposed to and spaced a minute distance M2 from the lower surface (back surface) of the wafer W.

The back side gas outlet ports 160, 161 include peripheral outlet ports 160 opposed to the peripheral edge portion of the lower surface of the wafer W, and center outlet ports 161 opposed to the center portion of the lower surface of the wafer W. The peripheral outlet ports 160 are larger outlet ports each having a greater diameter than the center outlet ports 161. More specifically, the diameters of the peripheral outlet ports 160 and the center outlet ports 161 are defined so that the inert gas supply flow amount per unit area is greater on the peripheral edge portion of the lower surface of the wafer W than on the center portion of the lower surface of the wafer W. In FIG. 12, two peripheral outlet ports 160 and three center outlet ports 161 are shown not by way of limitation, but the peripheral outlet ports 160 and the center outlet ports 161 may be provided in greater numbers.

The higher temperature gas supplying mechanism 152 includes the insertion pipe 154, which is inserted in the through-hole 35 of the rotation shaft 11. An inert gas flow passage 155 is defined inside the insertion pipe 154 as extending vertically along the rotation axis A1. The inert gas flow passage 155 communicates with the inert gas supply passage 153. More specifically, an upper end of the inert gas flow passage 155 opens in a center end of the inert gas supply passage 153. An inert gas pipe 164 is connected to the inert gas flow passage 155. An inert gas valve 162 for opening and closing the inert gas pipe 164 and a gas heating heater 163 for heating the inert gas are provided in this order from the inert gas flow passage 155 in the inert gas pipe 164. The gas heating heater 163 is adapted to heat the inert gas flowing through the inert gas pipe 164 by a one-path heating system.

In FIG. 12, an IPA supplying mechanism (including the solvent nozzle 5 (see FIG. 2), the solvent supply pipe 19 (see FIG. 2), the solvent valve 20 (see FIG. 2) and the second nozzle movement mechanism 21 (see FIG. 2)), a chemical liquid supplying mechanism (including the chemical liquid nozzle 6 (see FIG. 1), the chemical liquid supply pipe 22 (see FIG. 1), the chemical liquid valve 23 (see FIG. 1) and the third nozzle movement mechanism 24 (see FIG. 1)), and a rinse liquid supplying mechanism (including the rinse liquid nozzle 30 (see FIG. 1), the rinse liquid supply pipe 31 (see FIG. 1) and the rinse liquid valve 32 (see FIG. 1)) are not shown, but these mechanisms are provided in the substrate treatment apparatus 110.

The controller 40 controls the operations of the spin motor 14, the first to third nozzle movement mechanisms 18, 21, 24 and the like, and switches on and off the energization of the gas heating heater 163. Further, the controller 40 controls the opening and the closing of the inert gas valve 162 as well as the hydrophobization liquid valve 17, the solvent valve 20, the chemical liquid valve 23 and the rinse liquid valve 32.

With the inert gas valve 162 open, inert gas warmed to a predetermined higher temperature by the gas heating heater 163 is supplied to the backside gas outlet ports 160, 161 through the inert gas pipe 164, the inert gas flow passage 155 and the inert gas supply passage 153 to be spouted upward from the back side gas outlet ports 160, 161. Since the back side gas outlet ports 160, 161 are opposed to and spaced the minute distance M2 from the wafer W, the higher temperature inert gas is sprayed to different radial positions on the lower surface of the wafer W from the back side gas outlet ports 160, 161.

In the second embodiment, the wafer W is heated by spraying the higher temperature inert gas to the lower surface of the wafer W by means of the back side gas spraying mechanism 150 (first higher temperature gas spouting step). The spraying of the higher temperature inert gas to the wafer W may be carried out during a period from the start of the first solvent supplying step (Step S3 in FIG. 5) to the end of the hydrophobization liquid supplying step (Step S4 in FIG. 5) as in the first exemplary process of the first embodiment, or may be carried out during a period from the start of the first solvent supplying step (Step S13 in FIG. 10) to the end of the second solvent supplying step (Step S15 in FIG. 10) as in the second exemplary process of the first embodiment. Further, the spraying of the higher temperature inert gas to the wafer W may be carried out only during a period from the start to the end of the hydrophobization liquid supplying step (Step S24 in FIG. 11) as in the third exemplary process of the first embodiment.

The inert gas supply flow amount per unit area is greater on the peripheral edge portion of the lower surface of the wafer W than on the center portion of the lower surface of the wafer W. Therefore, the center portion of the wafer W is heated with a smaller heat amount per unit area than the peripheral edge portion of the wafer W.

According to the second embodiment, as described above, the wafer W is heated by spraying the higher temperature inert gas to the wafer W from the back side gas outlet ports 160, 161 disposed in opposed relation to the lower surface of the wafer W. This makes it possible to heat the wafer W without hindering the supply of the silylation liquid and the treatment liquid (e.g., IPA) to the upper surface of the wafer W.

It is supposed that the silylation liquid or the treatment liquid supplied to the center portion of the wafer W is inactivated while being moved to the peripheral edge of the wafer W. It is also supposed that the wafer W is cooled by the rotation of the wafer W. In the second embodiment, however, the peripheral edge portion of the wafer W is heated with a greater heat amount per unit area than the center portion of the wafer W, so that the treatment liquid is more efficiently warmed on the peripheral edge portion of the wafer W. Where the silylation liquid is supplied, the silylation liquid is kept highly active on the peripheral edge portion of the wafer W. Thus, the hydrophobic protection film 106 can be formed as having a greater contact angle on the entire upper surface of the wafer W, so that the entire upper surface of the wafer W can be properly and uniformly hydrophobized. Where IPA is supplied as an example of the treatment liquid, the IPA replacement efficiency can be increased on the entire upper surface of the wafer W.

[Third Embodiment]

Figure 13:
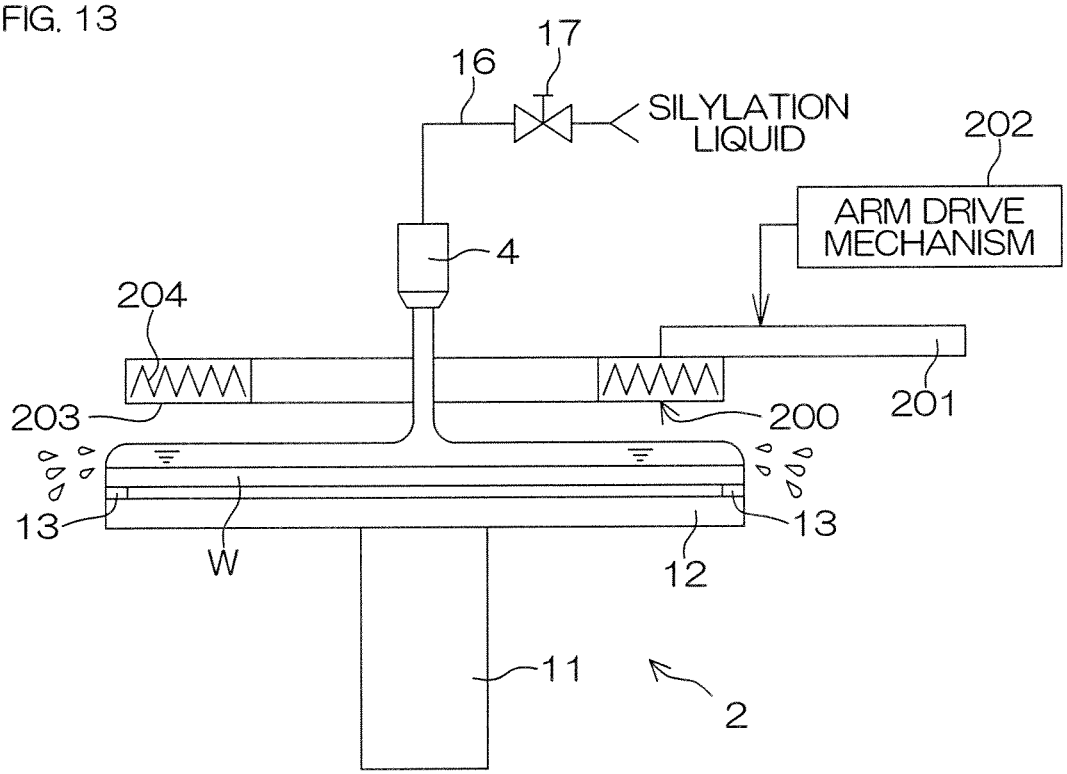
FIG. 13 is a diagram schematically showing the construction of a substrate treatment apparatus according to a third embodiment of the present invention.

FIG. 13 is a diagram schematically showing the construction of a substrate treatment apparatus 190 according to a third embodiment of the present invention. In FIG. 13, components corresponding to those shown in the first embodiment will be designated by the same reference characters as in FIGS. 1 and 4, and duplicate description will be omitted.

The substrate treatment apparatus 190 according to the third embodiment differs from the substrate treatment apparatus 1 according to the first embodiment in that the substrate treatment apparatus 190 includes a heater plate (heat generation member) 200 having the same construction as the second heater plate 3B described in the first embodiment, and a heater arm 201 horizontally supporting the heater plate 200 above the spin chuck 2. An arm drive mechanism 202 for vertically or horizontally moving the heater arm 201 is connected to the heater arm 201.

The heater plate 200 includes a main body having an annular flat opposed surface 203 to be opposed to the peripheral edge portion of the upper surface of the wafer W held by the spin chuck 2, and a heater 204 is incorporated in the main body.

With the wafer W held by the spin chuck 2, the heater plate 200 is disposed so that the opposed surface 203 is opposed to and spaced a minute distance from the peripheral edge portion of the upper surface of the wafer W. By the energization of the heater 204, the heater 204 generates heat to bring the heater plate 200 into the heating state. Thus, the opposed surface 203 functions as a heat generation surface.

When the silylation liquid is spouted toward the center portion of the upper surface of the wafer W from the hydrophobization liquid nozzle 4 located above the center portion of the upper surface of the wafer W in this state, the silylation liquid from the hydrophobization liquid nozzle 4 flows through the inside of the annular heater plate 200 to be supplied to the center portion of the upper surface of the wafer W. The silylation liquid supplied to the center portion of the upper surface of the wafer W receives a centrifugal force generated by the rotation of the wafer W to spread toward the peripheral edge of the wafer W on the upper surface of the wafer W. Since the opposed surface 203 functioning as the heat generation surface is disposed in opposed relation to the peripheral edge portion of the wafer W, the silylation liquid is warmed by the opposed surface 203 itself and by the wafer W heated by the opposed surface 203 while flowing on the wafer W. Thus, the liquid temperature of the silylation liquid is elevated to a temperature level substantially equal to the temperature of the heater plate 200.

When IPA is spouted toward the center portion of the upper surface of the wafer W from the solvent nozzle 5 located above the center portion of the upper surface of the wafer W with the opposed surface 203 opposed to the peripheral edge portion of the upper surface of the wafer W, IPA from the solvent nozzle 5 flows through the inside of the annular heater plate 200 to be supplied to the center portion of the upper surface of the wafer W. IPA supplied to the center portion of the upper surface of the wafer W receives a centrifugal force generated by the rotation of the wafer W to spread toward the peripheral edge of the wafer W on the upper surface of the wafer W. Since the opposed surface 203 functioning as the heat generation surface is disposed in opposed relation to the peripheral edge portion of the wafer W, IPA is warmed by the opposed surface 203 itself and by the wafer W heated by the opposed surface 203 while flowing on the wafer W. Thus, the liquid temperature of IPA is elevated to a temperature level substantially equal to the temperature of the heater plate 200.

[Fourth Embodiment]

Figure 14:
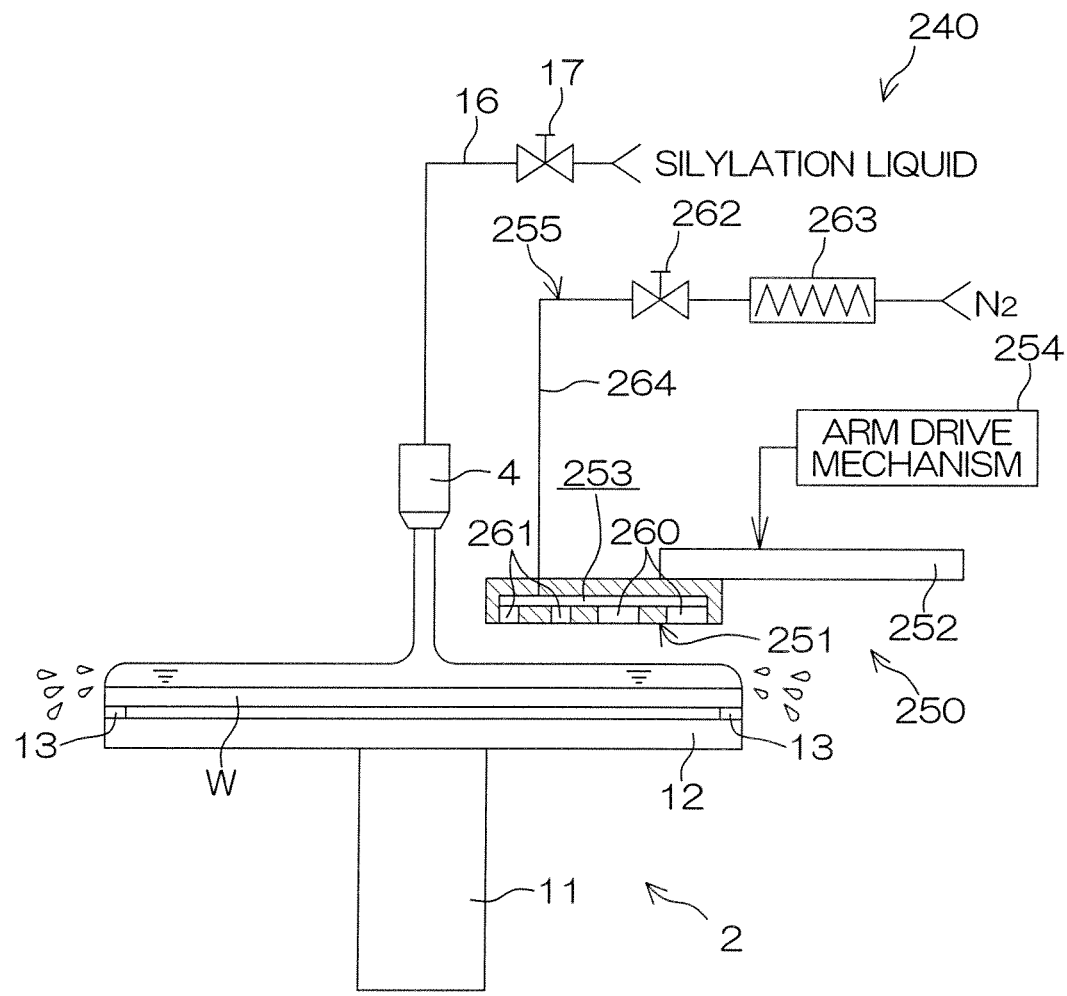
FIG. 14 is a diagram schematically showing the construction of a substrate treatment apparatus according to a fourth embodiment of the present invention.

FIG. 14 is a diagram schematically showing the construction of a substrate treatment apparatus 240 according to a fourth embodiment of the present invention. In FIG. 14, components corresponding to those shown in the first embodiment will be designated by the same reference characters as in FIGS. 1 and 4, and duplicate description will be omitted.

The substrate treatment apparatus 240 differs from the substrate treatment apparatus 1 according to the first embodiment in that a front side gas spraying mechanism (front side gas spraying unit) 250 is provided instead of the heating mechanism 3.

The front side gas spraying mechanism 250 includes an elongated bar-shaped gas nozzle 251 extending horizontally along a rotation radius of the wafer W, a heater arm 252 horizontally supporting the gas nozzle 251 above the spin chuck 2, and a higher temperature gas supplying mechanism 255 which supplies a higher temperature inert gas (higher temperature gas) to the gas nozzle 251. An arm drive mechanism 254 for vertically or horizontally moving the heater arm 252 is connected to the heater arm 252.

The gas nozzle 251 has a hollow inside, and a gas supply passage 253 is defined inside the gas nozzle 251 as extending in conformity with the shape of the gas nozzle 251.

A plurality of front side gas outlet ports 260, 261 are provided in a lower surface of the gas nozzle 251 in opposed relation to the upper surface of the wafer W held by the spin chuck 2 as aligning in a row along the rotation radius of the wafer W. The front side gas outlet ports 260, 261 are arranged equidistantly (at a uniform density) in a region not opposed to the rotation center of the wafer W. The front side gas outlet ports 260, 261 communicate with the gas supply passage 253, and are adapted to spout the inert gas supplied to the front side gas outlet ports 260, 261 vertically downward.

The higher temperature gas supply mechanism 255 includes an inert gas pipe 264. A distal end of the inert gas pipe 264 is connected to the inert gas supply passage 253, and an inside space of the inert gas supply pipe 264 communicates with the inert gas supply passage 253. An inert gas valve 262 for opening and closing the inert gas pipe 264 and a gas heating heater 263 for heating the inert gas are provided in the inert gas pipe 264. The gas heating heater 263 is adapted to heat the inert gas flowing through the inert gas pipe 264 by a one-path heating system.

The front side gas outlet ports 260, 261 include peripheral outlet ports 260 opposed to the peripheral edge portion of the upper surface of the wafer W, and center outlet ports 261 opposed to the center portion of the upper surface of the wafer W. The peripheral outlet ports 260 are larger outlet ports each having a greater diameter than the center outlet ports 261. More specifically, the diameters of the peripheral outlet ports 260 and the center outlet ports 261 are defined so that the inert gas supply flow amount per unit area is greater on the peripheral edge portion of the upper surface of the wafer W than on the center portion of the upper surface of the wafer W. In FIG. 14, two peripheral outlet ports 260 and two center outlet ports 261 are shown not by way of limitation, but the peripheral outlet ports 260 and the center outlet ports 261 may be provided in greater numbers.

In FIG. 14, an IPA supplying mechanism (including the solvent nozzle 5 (see FIG. 2), the solvent supply pipe 19 (see FIG. 2), the solvent valve 20 (see FIG. 2) and the second nozzle movement mechanism (see FIG. 2)), a chemical liquid supplying mechanism (including the chemical liquid nozzle 6 (see FIG. 1), the chemical liquid supply pipe 22 (see FIG. 1), the chemical liquid valve 23 (see FIG. 1) and the third nozzle movement mechanism 24 (see FIG. 1)), and a rinse liquid supplying mechanism (including the rinse liquid nozzle 30 (see FIG. 1), the rinse liquid supply pipe 31 (see FIG. 1) and the rinse liquid valve 32 (see FIG. 1)) are not shown, but these mechanisms are provided in the substrate treatment apparatus 250.

The controller 40 (see FIG. 1 and the like) controls the operations of the spin motor 14, the first to third nozzle movement mechanisms 18, 21, 24 and the like, and switches on and off the energization of the gas heating heater 263. Further, the controller 40 controls the opening and the closing of the inert gas valve 262 as well as the hydrophobization liquid valve 17, the solvent valve 20, the chemical liquid valve 23 and the rinse liquid valve 32.

With the wafer W held by the spin chuck 2, the gas nozzle 251 is disposed so that the lower surface of the gas nozzle 251 is opposed to and spaced a minute distance from the upper surface of the wafer W, and the aligning outlet ports (gas outlet ports) 260, 261 are located along the rotation radius of the wafer W. Thus, the front side gas outlet ports 260, 261 are opposed to and spaced the minute distance from the upper surface (front surface) of the wafer W.

When the inert gas valve 262 is opened with the gas heating heater 263 energized, an inert gas warmed to a predetermined higher temperature by the gas heating heater 263 is supplied to the respective front side gas outlet ports 260, 261 through the inert gas pipe 264 and the inert gas supply passage 253 to be spouted downward from the front side gas outlet ports 260, 261. Since the front side gas outlet ports 260, 261 are opposed to and spaced the minute distance from the wafer W, the higher temperature inert gas is sprayed to different radial positions on the front surface of the wafer W from the front side gas outlet ports 260, 261 (second higher temperature gas spouting step).

When the silylation liquid is spouted toward the center portion of the upper surface of the wafer W from the hydrophobization liquid nozzle 4 located above the center portion of the upper surface of the wafer W in this state, the silylation liquid is supplied to the center portion of the upper surface of the wafer W. The silylation liquid supplied to the center portion of the upper surface of the wafer W receives a centrifugal force generated by the rotation of the wafer W to spread toward the peripheral edge of the wafer W on the upper surface of the wafer W. Since the front side gas outlet ports 260, 261 are disposed in opposed relation to the wafer W, the silylation liquid is warmed by the sprayed higher temperature inert gas while flowing on the wafer W. The inert gas supply flow amount per unit area is greater on the peripheral edge portion of the upper surface of the wafer W than on the center portion of the upper surface of the wafer W. Therefore, the center portion of the wafer W is heated with a smaller heat amount per unit area than the peripheral edge portion of the wafer W.

When IPA is spouted toward the center portion of the upper surface of the wafer W from the solvent nozzle 5 (see FIG. 2 and the like) located above the center portion of the upper surface of the wafer W with the lower surface of the gas nozzle 251 opposed to and spaced the minute distance from the upper surface of the wafer W, IPA is supplied to the center portion of the upper surface of the wafer W. IPA supplied to the center portion of the upper surface of the wafer W receives a centrifugal force generated by the rotation of the wafer W to spread toward the peripheral edge of the wafer W on the upper surface of the wafer W. Since the front side gas outlet ports 260, 261 are disposed in opposed relation to the wafer W, IPA is warmed by the sprayed higher temperature inert gas while flowing on the wafer W. The inert gas supply flow amount per unit area is greater on the peripheral edge portion of the upper surface of the wafer W than on the center portion of the upper surface of the wafer W. Therefore, the center portion of the wafer W is heated with a smaller heat amount per unit area than the peripheral edge portion of the wafer W.

In the fourth embodiment, the silylation liquid or IPA flowing on the upper surface of the wafer W is heated by spraying the higher temperature inert gas to the upper surface of the wafer W by means of the front side gas spraying mechanism 250 (second higher temperature gas spouting step). The spraying of the higher temperature inert gas to the wafer W may be carried out during a period from the start of the first solvent supplying step (Step S3 in FIG. 5) to the end of the hydrophobization liquid supplying step (Step S4 in FIG. 5) as in the first exemplary process of the first embodiment, or may be carried out during a period from the start of the first solvent supplying step (Step S13 in FIG. 10) to the end of the second solvent supplying step (Step S15 in FIG. 10) as in the second exemplary process of the first embodiment. Further, the spraying of the higher temperature inert gas to the wafer W may be carried out only during a period from the start to the end of the hydrophobization liquid supplying step (Step S24 in FIG. 11) as in the third exemplary process of the first embodiment.

[Fifth Embodiment]

Figure 15:
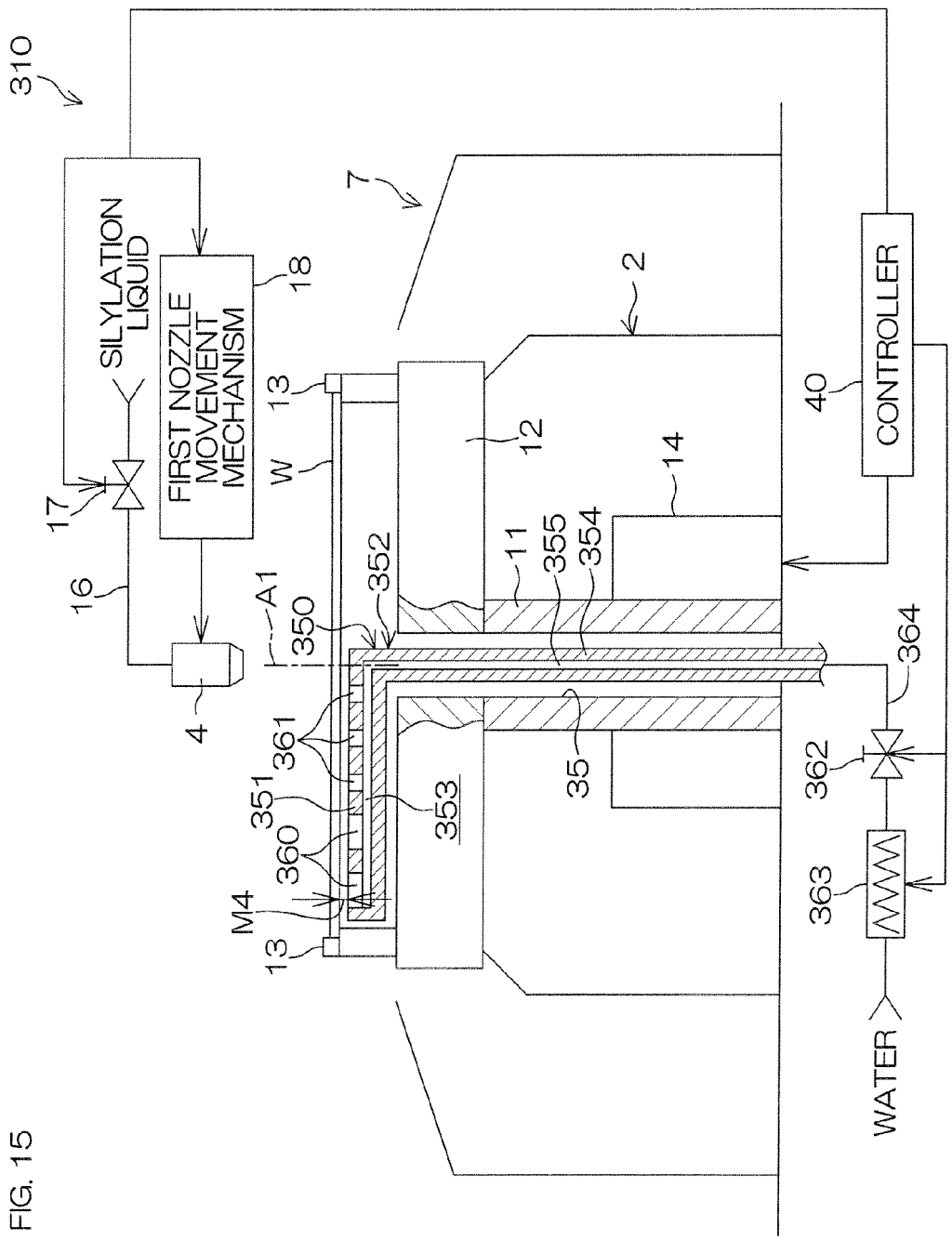
FIG. 15 is a diagram schematically showing the construction of a substrate treatment apparatus according to a fifth embodiment of the present invention.
Figure 16:
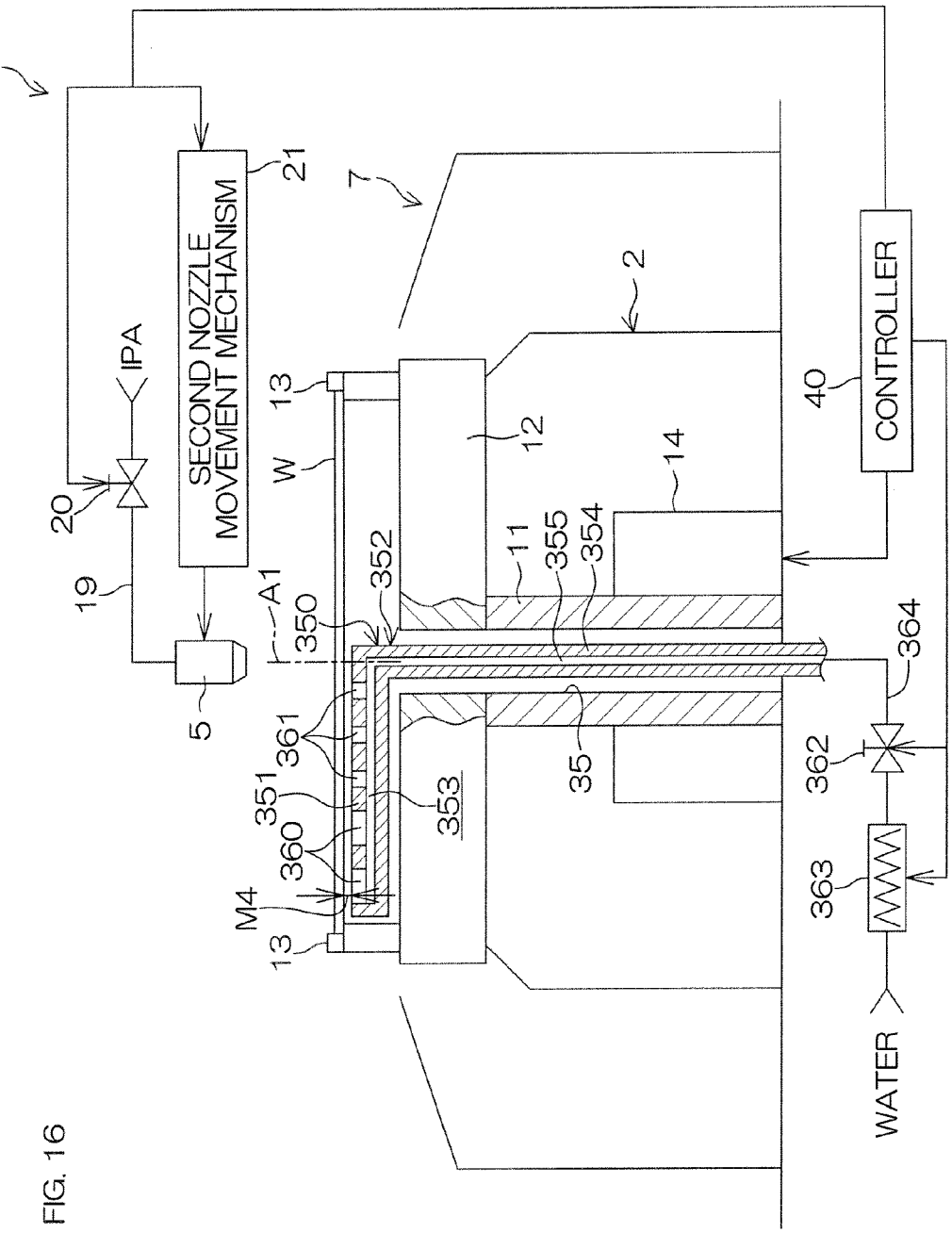
FIG. 16 is another diagram schematically showing the construction of the substrate treatment apparatus according to the fifth embodiment of the present invention.

FIGS. 15 and 16 are diagrams schematically showing the construction of a substrate treatment apparatus 310 according to a fifth embodiment of the present invention. In FIGS. 15 and 16, components corresponding to those shown in the first embodiment will be designated by the same reference characters as in FIGS. 1 and 2, and duplicate description will be omitted.

The substrate treatment apparatus 310 differs from the substrate treatment apparatus 1 according to the first embodiment in that a warm water spouting mechanism (higher temperature liquid spouting unit) 350 which spouts warm water (higher temperature liquid) toward the lower surface (back surface) of the wafer W held by the spin chuck 2 is provided instead of the heating mechanism 3.

The warm water spouting mechanism 350 includes an elongated bar-shaped warm water nozzle 351 extending horizontally along a rotation radius of the wafer W from the rotation axis A1, and a warm water supplying mechanism 352 which supplies warm water to the warm water nozzle 351.

The warm water nozzle 351 is disposed between the upper surface of the spin base 12 and the lower surface of the wafer W held by the spin chuck 2. The warm water nozzle 351 has a hollow inside, and a warm water supply passage 353 is defined inside the warm water nozzle 351 as extending in conformity with the shape of the warm water nozzle 351. The warm water nozzle 351 has a center end which is connected to and fixed to an insertion pipe 354 to be described later. Therefore, the warm water nozzle 351 is constantly stationary to be kept nonrotatable irrespective of the rotation of the spin base 12.

A plurality of liquid outlet ports 360, 361 are provided in an upper region of the warm water nozzle 351 in opposed relation to the lower surface of the wafer W held by the spin chuck 2 as aligning in a row along the rotation radius of the wafer W. The liquid outlet ports 360, 361 are arranged equidistantly (at a uniform density) in a region not opposed to the rotation center of the wafer W. The liquid outlet ports 360, 361 communicate with the warm water supply passage 353, and are adapted to spout the warm water supplied to the liquid outlet ports 360, 361 vertically upward. The liquid outlet ports 360, 361 are opposed to and spaced a minute distance M4 from the lower surface (back surface) of the wafer W.

The liquid outlet ports 360, 361 include peripheral outlet ports 360 opposed to the peripheral edge portion of the lower surface of the wafer W, and center outlet ports 361 opposed to the center portion of the lower surface of the wafer W. The peripheral outlet ports 360 are larger outlet ports each having a greater diameter than the center outlet ports 361. Therefore, the peripheral outlet ports 360 each have a greater spouting flow rate than the center outlet ports 361. More specifically, the diameters of the peripheral outlet ports 360 and the center outlet ports 361 are defined so that the warm water supply flow amount per unit area is greater on the peripheral edge portion of the lower surface of the wafer W than on the center portion of the lower surface of the wafer W. In FIGS. 15 and 16, two peripheral outlet ports 360 and three center outlet ports 361 are shown not byway of limitation, but the peripheral outlet ports 360 and the center outlet ports 361 may be provided in greater numbers.

The warm water supply mechanism 352 includes the insertion pipe 354, which is inserted in the through-hole 35 of the rotation shaft 11. A warm water flow passage 355 is defined inside the insertion pipe 354 as extending vertically along the rotation axis A1. The warm water flow passage 355 communicates with the warm water supply passage 353. More specifically, an upper end of the warm water flow passage 355 opens in a center end of the warm water supply passage 353. A warm water pipe 364 is connected to the warm water flow passage 355. A water valve 362 for opening and closing the warm water pipe 364 and a water heating heater 363 for heating water (preferably DIW) are provided in this order from the warm water flow passage 355 in the warm water pipe 364. The water heating heater 363 is adapted to heat the water flowing through the warm water pipe 364 by a one-path heating system.

In FIGS. 15 and 16, a chemical liquid supplying mechanism (including the chemical liquid nozzle 6 (see FIG. 1), the chemical liquid supply pipe 22 (see FIG. 1), the chemical liquid valve 23 (see FIG. 1) and the third nozzle movement mechanism 24 (see FIG. 1)), and a rinse liquid supplying mechanism (including the rinse liquid nozzle 30 (see FIG. 1), the rinse liquid supply pipe 31 (see FIG. 1) and the rinse liquid valve 32 (see FIG. 1)) are not shown, but these mechanisms are provided in the substrate treatment apparatus 310.

The controller 40 controls the operations of the spin motor 14, the first to third nozzle movement mechanisms 18, 21, 24 and the like, and switches on and off the energization of the water heating heater 363. Further, the controller 40 controls the opening and the closing of the water valve 362 as well as the hydrophobization liquid valve 17, the solvent valve 20, the chemical liquid valve 23 and the rinse liquid valve 32.

When the water valve 362 is opened with the water heating heater 363 energized, water warmed to a predetermined temperature (e.g., a predetermined temperature within a range of 40° C. to 65° C.) by the water heating heater 363 is supplied to the respective liquid outlet ports 360, 361 through the warm water pipe 364, the warm water flow passage 355 and the warm water supply passage 353 to be spouted upward from the respective liquid outlet ports 360, 361. Since the liquid outlet ports 360, 361 are opposed to and spaced the minute distance M4 from the wafer W, the warm water is supplied to different radial positions on the lower surface of the wafer W from the respective liquid outlet ports 360, 361.

In the substrate treatment apparatus 310 according to the fifth embodiment, the wafer W is heated by supplying the warm water to the lower surface of the wafer W by means of the warm water spouting mechanism 350. The substrate treatment apparatus 310 performs a process equivalent to the first exemplary process of the first embodiment (in the following description, this process is also referred to as "first exemplary process"). In the first exemplary process, the heating of the wafer W by the sprayed warm water is carried out during a period from the start of the first solvent supplying step (Step S3 in FIG. 5) to the end of the hydrophobization liquid supplying step (Step S4 in FIG. 5).

Figure 17:
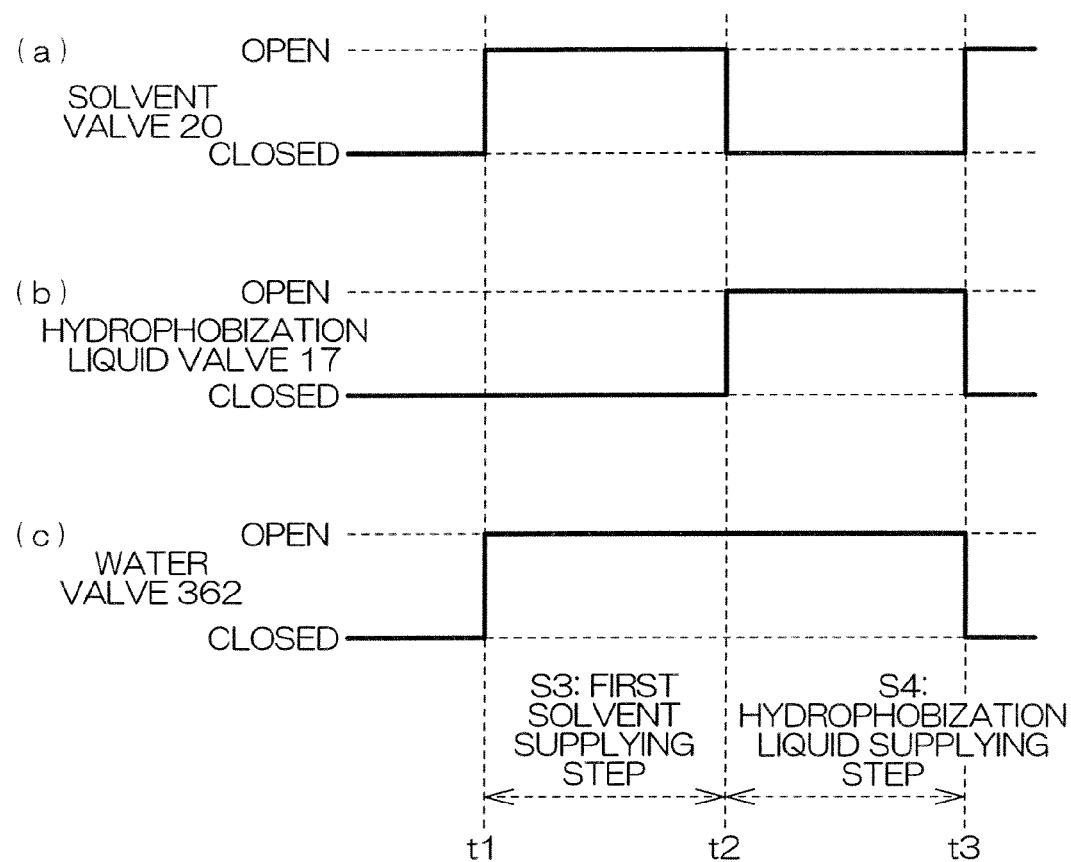
FIG. 17 is a timing chart for explaining major steps of a fourth exemplary process to be performed for treating a wafer by the substrate treatment apparatus shown in FIGS. 15 and 16.

FIG. 17 is a timing chart for explaining major steps of the first exemplary process to be performed for treating a wafer W by the substrate treatment apparatus 310. The first exemplary process to be performed by the substrate treatment apparatus 310 will be described with reference to FIGS. 5 and 15 to 17.

In the exemplary process shown in FIG. 17, the warm water is continuously supplied to the wafer W during the period from the start of the first solvent supplying step (Step S3 in FIG. 5) to the end of the hydrophobization liquid supplying step (Step S4 in FIG. 5). Only differences of the first exemplary process between the fifth embodiment and the first embodiment will be described, and duplicate description will be omitted.

In the first exemplary process of the fifth embodiment, the controller 40 controls the second nozzle movement mechanism 21 to move the solvent nozzle 5 from the retracted position to the solvent treatment position (shown in FIG. 16) with the hydrophobization liquid nozzle 4 and the chemical liquid nozzle 6 located at their retracted positions after the completion of the rinsing step (Step S2 in FIG. 5). At a predetermined solvent spouting time ("t1" in FIG. 17), the controller 40 opens the solvent valve 20 and the water valve 362 with the solvent nozzle located at the solvent treatment position and with the hydrophobization liquid valve 17 kept closed. The solvent valve 20 and the water valve 362 are opened substantially at the same time. Thus, IPA having an ordinary temperature (e.g., about 23° C. to about 25° C.) is spouted from the solvent nozzle 5 toward the center portion of the upper surface of the wafer W and, in synchronization with the start of the spouting of IPA from the solvent nozzle 5, the supply of the warm water to the lower surface of the wafer W is started. At this time, the liquid temperature of the warm water to be spouted from the liquid outlet ports 360, 361 of the warm water nozzle 351 is controlled at a predetermined temperature, for example, within a range of 40° C. to 65° C.

The liquid outlet ports 360, 361 of the warm water nozzle 351 are opposed to the lower surface of the wafer W held by the spin chuck 2. Although the warm water nozzle 351 is stationary, the liquid outlet ports 360, 361 are aligned along the rotation radius of the wafer W and, therefore, the warm water is supplied to the entire lower surface of the wafer W by the rotation of the wafer W. Warm water reaching the lower surface of the wafer W receives a centrifugal force generated by the rotation of the wafer W to spread radially outward.

The wafer W is heated by the warm water supplied to the lower surface of the wafer W. Since the warm water is supplied to the entire lower surface of the wafer W, the wafer W is entirely warmed. At this time, the warm water supply flow amount per unit area is greater on the peripheral edge portion of the lower surface of the wafer W than on the center portion of the lower surface of the wafer W. Therefore, the center portion of the wafer W is heated with a smaller heat amount per unit area than the peripheral edge portion of the wafer W.

IPA supplied to the upper surface of the wafer W receives a centrifugal force generated by the rotation of the wafer W to flow toward the peripheral edge of the wafer W. The wafer W is warmed and, therefore, IPA is warmed to a higher temperature while flowing on the wafer W. Thus, the IPA replacement efficiency can be increased on the entire upper surface of the wafer W.

IPA supplied to the upper surface of the wafer W moves radially outward to the peripheral edge portion of the upper surface of the wafer W. The warm water spreading radially outward on the lower surface of the wafer W is liable to flow up to the upper surface of the wafer W from the peripheral edge of the wafer W. Particularly, the upper surface of the wafer W is highly hydrophilic after the replacement with IPA, so that the warm water is more liable to flow up to the upper surface of the wafer W. However, IPA flowing from the center portion to the peripheral edge portion of the upper surface of the wafer W prevents the warm water from flowing up to the upper surface of the wafer W from the peripheral edge of the wafer W.

In the first solvent supplying step, the controller 40 controls the first nozzle movement mechanism 18 to move the hydrophobization liquid nozzle 4 from the retracted position to the silylation treatment position (shown in FIG. 15).

After the first solvent supplying step is performed for a predetermined period, the controller 40 closes the solvent valve 20 to stop spouting IPA from the solvent nozzle 5, and opens the hydrophobization liquid valve 17 to spout the silylation liquid at an ordinary temperature (e.g., about 23° C. to about 25° C.) from the hydrophobization liquid nozzle 4 at a predetermined hydrophobization liquid spouting time ("t2" in FIG. 17).

At this time, the solvent valve 20 is closed, but the water valve 362 is kept open. Therefore, the supply of the warm water to the lower surface of the wafer W is continued. In other words, the supply of the warm water to the lower surface of the wafer W is continued even after the supply of IPA to the upper surface of the wafer W is stopped. After the solvent valve 20 is closed, the controller 40 controls the second nozzle movement mechanism 21 to move the solvent nozzle 5 to the retracted position (not shown in FIGS. 15 and 16 but shown in FIG. 1 and the like).

Even after the start of the supply of the silylation liquid to the upper surface of the wafer W, the supply of the warm water to the lower surface of the wafer W is continued, so that the wafer W is heated by the warm water. Since the warm water is supplied to the entire lower surface of the wafer W, the wafer W is entirely warmed. At this time, the warm water supply flow amount per unit area is greater on the peripheral edge portion of the lower surface of the wafer than on the center portion of the lower surface of the wafer W. Therefore, the center portion of the wafer W is heated with a smaller heat amount per unit area than the peripheral edge portion of the wafer W.

The silylation liquid spouted from the hydrophobization liquid nozzle 4 is supplied to the center portion of the upper surface of the wafer W. The silylation liquid reaching the upper surface of the wafer W receives a centrifugal force generated by the rotation of the wafer W to spread toward the peripheral edge of the wafer W on the upper surface of the wafer W, whereby the silylation liquid is supplied to the entire upper surface of the wafer W. By supplying the silylation liquid to the entire upper surface of the wafer W, IPA adhering to the wafer W is replaced with the silylation liquid. Thus, as described above, all the projection patterns 105 on the upper surface of the wafer W are covered with the hydrophobic protection film 106.

The silylation liquid supplied to the upper surface of the wafer W moves radially outward to the peripheral edge portion of the upper surface of the wafer W. The warm water spreading radially outward on the lower surface of the wafer W is liable to flow up to the upper surface of the wafer W from the peripheral edge of the wafer W. However, the silylation liquid flowing from the center portion to the peripheral edge portion of the upper surface of the wafer W prevents the warm water from flowing up to the upper surface of the wafer W from the peripheral edge of the wafer W.

The wafer W is warmed by the warm water and, therefore, the silylation liquid is warmed to a higher temperature while flowing on the wafer W. More specifically, the silylation liquid flowing on the wafer W is warmed in the vicinity of an interface between the upper surface of the wafer W and the silylation liquid as in the first exemplary process of the first embodiment. Therefore, the silylation liquid can be highly activated in the vicinity of the interface between the upper surface of the wafer W and the silylation liquid.

After the hydrophobization liquid supplying step is performed for a predetermined period, the controller 40 closes the hydrophobization liquid valve 17 to stop spouting the silylation liquid, and closes the water valve 362 to stop spouting the warm water at a predetermined hydrophobization liquid spouting stop time ("t3" in FIG. 17). The hydrophobization liquid valve 17 and the water valve 362 are closed substantially at the same time. After the supply of the warm water to the wafer W is stopped, the temperature of the wafer W is reduced to finally reach the ordinary temperature.

Thereafter, the second solvent supplying step (Step S5 in FIG. 5) and the drying step (Step S6 in FIG. 5) are performed. Then, the spin chuck 2 stops rotating the wafer W, and the treated wafer W is unloaded from the spin chuck 2 by the transport robot (Step S7 in FIG. 5).

According to the fifth embodiment, as described above, the wafer W is heated by spouting the warm water toward the wafer W from the liquid outlet ports 360, 361 disposed in opposed relation to the lower surface of the wafer W. This makes it possible to heat the wafer W without hindering the supply of the silylation liquid and the treatment liquid (e.g., IPA) to the upper surface of the wafer W.

It is supposed that the silylation liquid or the treatment liquid supplied to the center portion of the wafer W is inactivated while being moved to the peripheral edge of the wafer W. It is also supposed that the wafer W is cooled by the rotation of the wafer W. In the fifth embodiment, however, the peripheral edge portion of the wafer W is heated with a greater heat amount per unit area than the center portion of the wafer W, so that the silylation liquid or the treatment liquid is more efficiently warmed on the peripheral edge portion of the wafer W. Where the silylation liquid is supplied, the silylation liquid is kept highly active on the peripheral edge portion of the wafer W. Thus, the hydrophobic protection film 106 (see FIG. 8) can be formed as having a greater contact angle on the entire upper surface of the wafer W, so that the entire upper surface of the wafer W can be properly and uniformly hydrophobized. Where IPA is supplied as an example of the treatment liquid, the IPA replacement efficiency can be increased on the entire upper surface of the wafer W.

The silylation liquid or IPA supplied to the upper surface of the wafer W moves radially outward to the peripheral edge portion of the upper surface of the wafer W. The warm water spreading radially outward on the lower surface of the wafer W is liable to flow up to the upper surface of the wafer W from the peripheral edge of the wafer W. However, the treatment liquid flowing from the center portion to the peripheral edge portion of the upper surface of the wafer W prevents the warm water from flowing up to the upper surface of the wafer W from the peripheral edge of the wafer W.

Particularly, the supply of the silylation liquid to the upper surface of the wafer W is started immediately after the supply of IPA is stopped. Therefore, IPA or the silylation liquid is continuously supplied to the peripheral edge portion of the upper surface of the wafer W. This more reliably prevents the warm water on the lower surface of the wafer W from flowing up to the upper surface of the wafer W from the peripheral edge of the wafer W.

If the silylation liquid was not supplied after the end of the IPA supplying step, it would be necessary to continuously supply IPA to the upper surface of the wafer W even after the stop of the supply of the warm water to the wafer W in order to prevent the warm water from flowing up to the upper surface of the wafer W. This would increase the consumption of IPA. In addition, the wafer W would be cooled due to the stop of the supply of the warm water in the first solvent supplying step, resulting in generation of water marks and generation of particles due to insufficient drying.

In this embodiment, however, the supply of the silylation liquid is started immediately after the stop of the supply of IPA. Therefore, the consumption of IPA can be reduced. Further, the wafer W is warmed during the entire IPA supplying step, thereby substantially preventing the generation of water marks and the generation of particles.

In the fifth embodiment, the wafer W may be continuously heated by supplying the warm water to the lower surface of the wafer W even after the supply of the silylation liquid is stopped. In this case, the heating of the wafer W may be continued until the end of the second solvent supplying step (Step S5 in FIG. 5) as in the second exemplary process of the first embodiment. In this case, however, the supply of the IPA in the second solvent supplying step is desirably started immediately after the stop of the supply of the silylation liquid in order to reliably prevent the warm water from flowing up to the upper surface of the wafer W from the peripheral edge of the wafer W.

[Sixth Embodiment]

Figure 18:
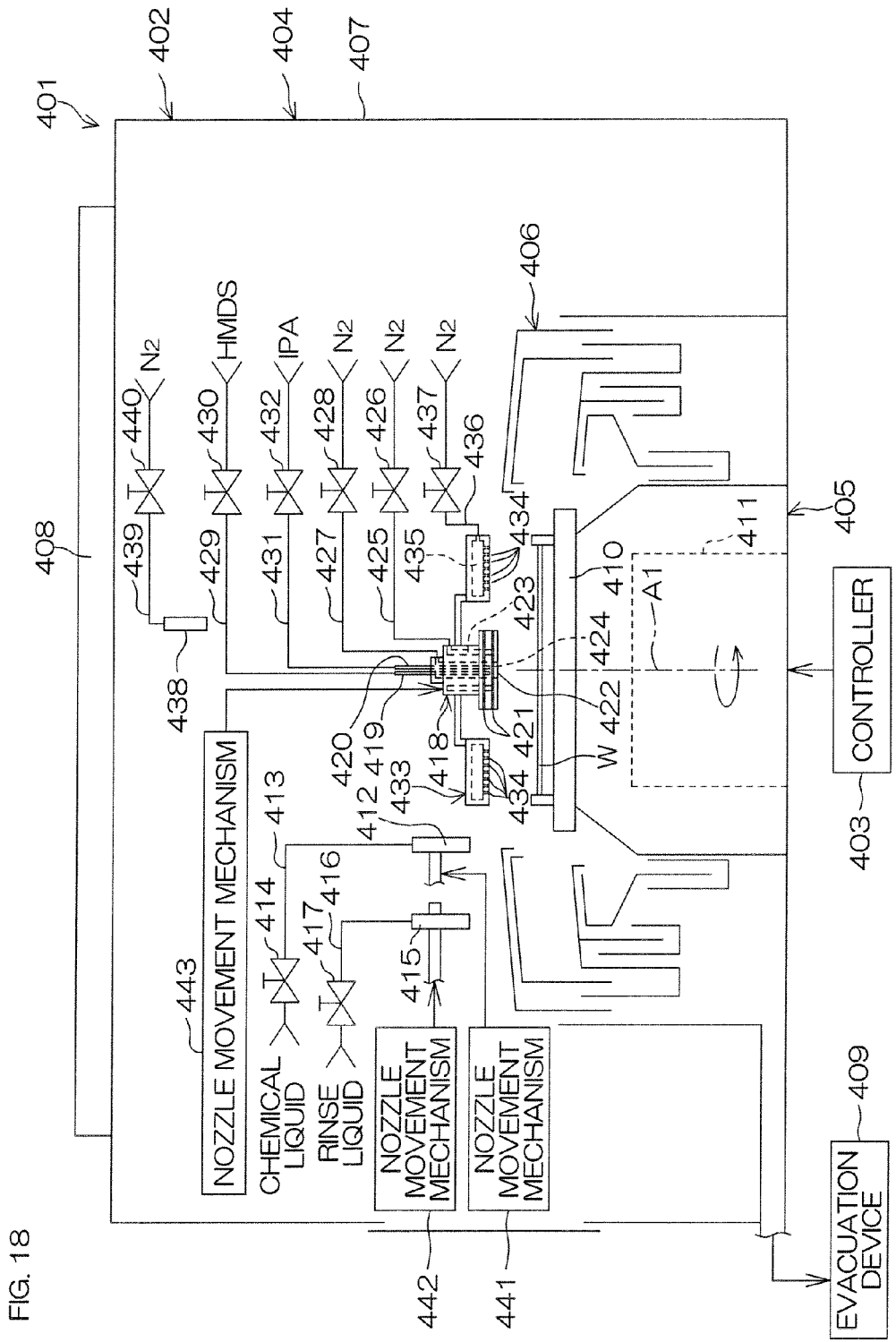
FIG. 18 is a schematic diagram showing the inside of a treatment unit provided in a substrate treatment apparatus according to a sixth embodiment of the present invention as seen horizontally.
Figure 19:
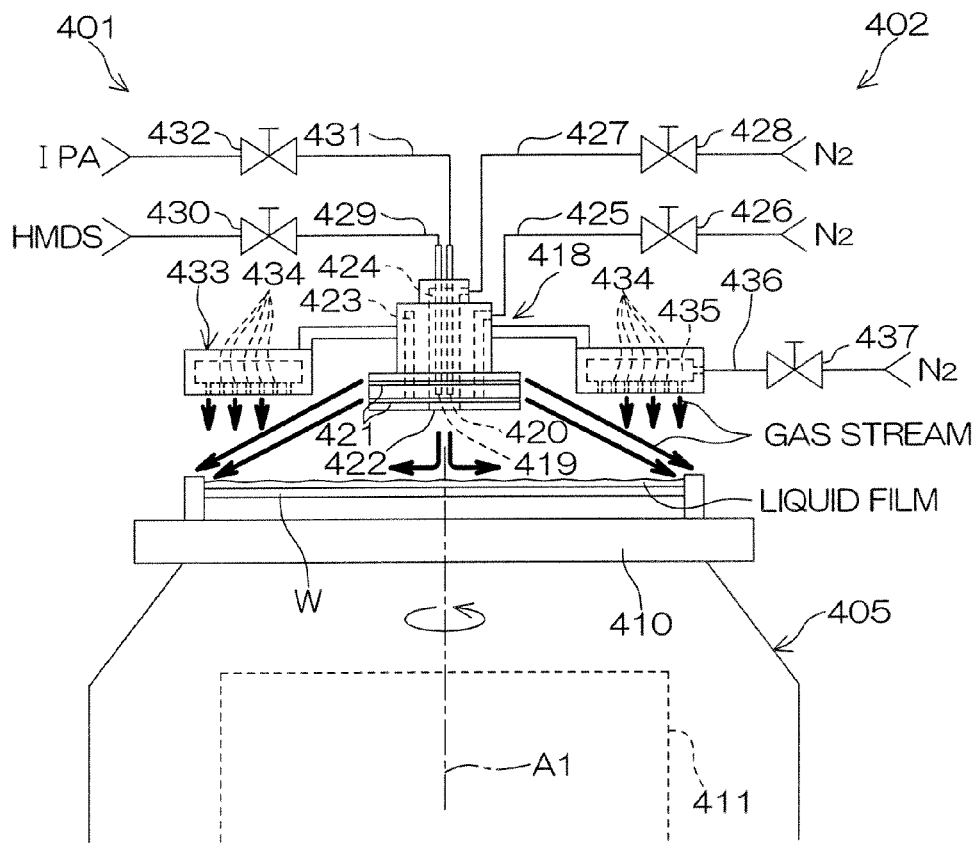
FIG. 19 is a schematic side view showing an inner gas nozzle and an outer gas nozzle.
Figure 20:
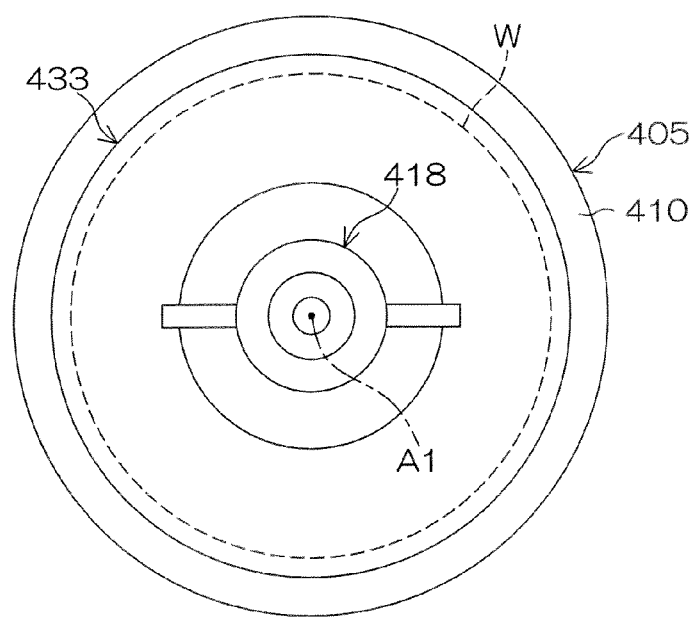
FIG. 20 is a schematic plan view showing the inner gas nozzle and the outer gas nozzle.

FIG. 18 is a schematic diagram showing the inside of a treatment unit 402 provided in a substrate treatment apparatus 401 according to a sixth embodiment of the present invention as seen horizontally. FIG. 19 is a schematic side view showing an inner gas nozzle (suppressing unit) 418 and an outer gas nozzle (suppressing unit) 433. FIG. 20 is a schematic plan view showing the inner gas nozzle 418 and the outer gas nozzle 433.

As shown in FIG. 18, the substrate treatment apparatus 401 is of a single substrate treatment type adapted to treat a single wafer W at a time. The substrate treatment apparatus 401 includes a treatment unit 402 of a single substrate treatment type for treating the wafer W, and a controller 403 which controls the operations of units provided in the substrate treatment apparatus 401 and the opening and the closing of valves.

As shown in FIG. 18, the treatment unit 402 includes a box-shaped chamber 404, a spin chuck (substrate holding and rotating unit) 405 which horizontally holds the wafer W in the chamber 404 and rotates the wafer W about a rotation axis A1 vertically extending through the center of the wafer W, a plurality of nozzles which spout treatment fluids (gases and liquids) above the wafer W held by the spin chuck 405, and a tubular cup 406 which surrounds the spin chuck 405.

As shown in FIG. 18, the chamber 404 includes a box-shaped partition wall 407 in which the spin chuck 405 is accommodated, an FFU 408 (fan filter unit 408 as an air supplying unit) which supplies clean air to the inside of the partition wall 407 from an upper portion of the partition wall 407, and an evacuation device 409 which evacuates the chamber 404 from a lower portion of the partition wall 407. The FFU 408 is disposed on the partition wall 407, and attached to the top of the partition wall 407. The FFU 408 supplies the clean air into the chamber 404 from the top of the partition wall 407. The evacuation device 409 is connected to the bottom of the cup 406, and adapted to suck out gas from the chamber 404 through the bottom of the cup 406. The FFU 408 and the evacuation device 409 are cooperative to form a down flow (downward stream) in the chamber 404. The FFU 408 and the evacuation device 409 are constantly driven. Therefore, the treatment of the wafer W is performed in the down flow formed in the chamber 404.

As shown in FIG. 18, the spin chuck 405 includes a disk-shaped spin base 410 which horizontally holds the wafer W, and a spin motor (drying unit) 411 which rotates the wafer W and the spin base 410 about the rotation axis A1. The spin chuck 405 may be a chuck of a clamping type adapted to horizontally clamp the wafer W to horizontally hold the wafer W, or a chuck of a vacuum type adapted to suck a back surface (lower surface, non-device-formation surface) of the wafer W to horizontally hold the wafer W. The spin chuck 405 shown in FIG. 18 is the clamping type chuck. The cup 406 surrounds the spin base 410. The cup 406 has an upper open end, which is located on a higher level than the spin base 410. Therefore, a chemical liquid, a rinse liquid and other treatment liquid flowing out around the wafer W are received by the cup 406.

As shown in FIG. 18, the nozzles include a chemical liquid nozzle 412 which spouts a chemical liquid toward the wafer W held by the spin chuck 405. The treatment unit 402 includes a chemical liquid pipe 413 connected to the chemical liquid nozzle 412 and a chemical liquid valve 414 provided in the chemical liquid pipe 413. With the chemical liquid valve 414 open, the chemical liquid is supplied from a chemical liquid supply source and spouted from the chemical liquid nozzle 412 toward an upper surface of the wafer W. The chemical liquid to be supplied to the chemical liquid nozzle 412 is hydrofluoric acid or SC1 (a liquid mixture containing $NH_4OH$ and $H_2O_2$). The chemical liquid to be supplied to the chemical liquid nozzle 412 is not limited to hydrofluoric acid and SC1, but may be a liquid containing at least one of sulfuric acid, acetic acid, nitric acid, hydrochloric acid, hydrofluoric acid, ammonia water, hydrogen peroxide water, organic acids (e.g., citric acid and oxalic acid), organic alkalis (e.g., TMAH (tetramethylammonium hydroxide), surface active agents and anti-corrosive agents.

As shown in FIG. 18, the nozzles include a rinse liquid nozzle 415 which spouts a rinse liquid (e.g., DIW) toward the wafer W held by the spin chuck 405. The treatment unit 402 includes a rinse liquid pipe 416 connected to the rinse liquid nozzle 415, and a rinse liquid valve 417 provided in the rinse liquid pipe 416. With the rinse liquid valve 417 open, the rinse liquid is supplied from a rinse liquid supply source and spouted from the rinse liquid nozzle 415 toward the upper surface of the wafer W. The rinse liquid to be supplied to the rinse liquid nozzle 415 is not limited to the DIW, but other examples of the rinse liquid include carbonated water, electrolytic ion water, hydrogen water, ozone water and a hydrochloric acid aqueous solution having a dilute concentration (e.g., about 10 to about 100 ppm).

The chemical liquid nozzle 412 may be a stationary nozzle which is fixed and adapted to spout the chemical liquid toward a center portion of the upper surface of the wafer w, or may be a scan nozzle which is adapted to move a chemical liquid applying position on the upper surface of the wafer W between the center portion and a peripheral edge portion of the upper surface of the wafer W. Similarly, the rinse liquid nozzle 415 may be a stationary nozzle or a scan nozzle. The chemical liquid nozzle 412 and the rinse liquid nozzle 415 shown in FIG. 18 are scan nozzles. In this case, the treatment unit 402 includes a first nozzle movement mechanism 441 which moves the chemical liquid nozzle 412 to move the chemical liquid applying position within the upper surface of the wafer W, and a second nozzle movement mechanism 442 which moves the rinse liquid nozzle 415 to move a rinse liquid applying position within the upper surface of the wafer W.

The first nozzle movement mechanism 441 moves the chemical liquid nozzle 412 to move the chemical liquid applying position within the upper surface of the wafer W. In addition, the first nozzle movement mechanism. 441 moves the chemical liquid nozzle 412 between a treatment position at which the chemical liquid spouted from the chemical liquid nozzle 412 reaches the upper surface of the wafer W and a retracted position at which the chemical liquid nozzle 412 is retracted on a lateral side of the spin chuck 405. Similarly, the second nozzle movement mechanism 442 moves the rinse liquid nozzle 415 to move the rinse liquid applying position within the upper surface of the wafer W. In addition, the second nozzle movement mechanism 442 moves the rinse liquid nozzle 415 between a treatment position at which the rinse liquid spouted from the rinse liquid nozzle 415 reaches the upper surface of the wafer W and a retracted position at which the rinse liquid nozzle 415 is retracted on a lateral side of the spin chuck 405.

As shown in FIG. 19, the nozzles include an inner gas nozzle which spouts a drying gas above the wafer W held by the spin chuck 405, a hydrophobization liquid nozzle (hydrophobization liquid supplying unit) 419 which spouts a hydrophobization liquid toward the wafer W held by the spin chuck 405, and a solvent nozzle (liquid film forming unit) 420 which spouts IPA (liquid) toward the wafer W held by the spin chuck 405. The inner gas nozzle 418 has a columnar shape extending vertically and having an outer diameter smaller than the diameter of the wafer W. The hydrophobization liquid nozzle 419 and the solvent nozzle 420 each extend vertically inside the inner gas nozzle 418 to be supported by the inner gas nozzle 418.

As shown in FIG. 19, the inner gas nozzle 418 has a tubular outer peripheral surface surrounding a vertical axis (rotation axis A1), and a lower surface parallel to the upper surface of the wafer W. The inner gas nozzle 418 includes an annular first outlet port 421 which opens in the outer peripheral surface of the inner gas nozzle 418, a second outlet port 422 which opens in the lower surface of the inner gas nozzle 418, a first flow passage 423 connected to the first outlet port 421 and a second flow passage 424 connected to the second outlet port 422. The first flow passage 423 and the second flow passage 424 are provided inside the inner gas nozzle 418. The first flow passage 423 has a tubular shape extending vertically, and the second flow passage 424 vertically extends inside the first flow passage 423. The first outlet port 421 is defined by an annular slit continuously extending along the entire circumference of the inner gas nozzle 418, and the second outlet port 422 is located at a lower level than the first outlet port 421. As shown in FIG. 19, the first outlet port 421 may include a plurality of annular slits disposed at different height levels.

As shown in FIG. 19, the treatment unit 402 includes a first gas pipe 425 connected to the first flow passage 423, a first gas valve 426 provided in the first gas pipe 425, a second gas pipe 427 connected to the second flow passage 424, and a second gas valve 428 provided in the second gas pipe 427. With the first gas valve 426 open, the drying gas is supplied from a drying gas supply source not shown to the first flow passage 423 through the first gas pipe 425. With the second gas valve 428 open, similarly, the drying gas is supplied from the drying gas supply source to the second flow passage 424 through the second gas pipe 427. The drying gas to be supplied to the inner gas nozzle 418 is, for example, an inert gas such as nitrogen gas, clean air (air free from foreign matter), dry air (dehumidified clean air) or other gas. The nitrogen gas has a humidity of, for example, not greater than 10%, and the clean air has a humidity of, for example, not greater than 40%. The dry air has a lower humidity than the clean air. In this embodiment, nitrogen gas dehumidified to a humidity of not greater than 10% is supplied as the drying gas from the drying gas supply source.

As shown in FIG. 19, the first outlet port 421 is annular, and opens outward. Therefore, the nitrogen gas supplied to the first flow passage 423 is radially spouted from the first outlet port 421 around the inner gas nozzle 418. The second outlet port 422 opens downward, so that the nitrogen gas supplied to the second flow passage 424 is spouted from the second outlet port 422 downward of the inner gas nozzle 418. A nitrogen gas spouting direction in which the nitrogen gas is spouted from the first outlet port 421 may be horizontal or may be inclined downward with respect to a horizontal plane.

As shown in FIG. 18, the treatment unit 402 includes a third nozzle movement mechanism 443 which moves the inner gas nozzle 418 between a position above the spin chuck 405 and a position on a lateral side of the spin chuck 405. The hydrophobization liquid nozzle 419 and the solvent nozzle 420 are moved together with the inner gas nozzle 418. The third nozzle movement mechanism 443 horizontally and vertically moves the inner gas nozzle 418. The third nozzle movement mechanism 443, for example, horizontally moves the inner gas nozzle 418 between a treatment position at which the inner gas nozzle 418 is located above the spin chuck 405 and a retracted position at which the inner gas nozzle 418 is located on the lateral side of the spin chuck 405. The treatment position is such that the lower surface of the inner gas nozzle 418 is vertically opposed to and spaced from the center portion of the upper surface of the wafer W held by the spin chuck 405 (as shown in FIGS. 18 to 20).

As shown in FIG. 19, the nitrogen gas spouted from the first outlet port 421 forms an annular gas stream spreading radially outward about the inner gas nozzle 418. When the nitrogen gas is spouted from the first outlet port 421 with the inner gas nozzle 418 located at the treatment position, the spouted nitrogen gas reaches above the peripheral edge portion of the upper surface of the wafer W, whereby the entire upper surface of the wafer W is covered with the gas stream. Thus, the upper surface of the wafer W is protected from mist of the treatment liquid, particles and other foreign matter. When the nitrogen gas is spouted from the second outlet port 422 in this state, the nitrogen gas spouted from the second outlet port 422 hits the upper surface of the wafer W and then spreads radially between the lower surface of the inner gas nozzle 418 and the upper surface of the wafer W. Thus, a disk-shaped gas stream is formed as covering the entire upper surface of the wafer W. When the nitrogen gas is spouted from both the first outlet port 421 and the second outlet port 422 with the inner gas nozzle 418 located at the treatment position, the entire upper surface of the wafer W is protected by a plurality of gas stream layers vertically stacked one on another.

As shown in FIG. 19, the treatment unit 402 includes a hydrophobization liquid pipe 429 connected to the hydrophobization liquid nozzle 419, and a hydrophobization liquid valve 430 provided in the hydrophobization liquid pipe 429. With the hydrophobization liquid valve 430 open, the hydrophobization liquid is supplied from a hydrophobization liquid supply source and spouted downward from an outlet port of the hydrophobization liquid nozzle 419. The outlet port of the hydrophobization liquid nozzle 419 is disposed inside the inner gas nozzle 418, and opposed to the second outlet port 422. Therefore, the hydrophobization liquid supplied to the hydrophobization liquid nozzle 419 is spouted downward from the second outlet port 422. The hydrophobization liquid spouted from the hydrophobization liquid nozzle 419 with the inner gas nozzle 418 located at the treatment position reaches the center portion of the upper surface of the wafer W. The hydrophobization liquid to be supplied to the hydrophobization liquid nozzle 419 is HMDS (liquid) which silylates the wafer W for hydrophobization of the wafer W. HMDS (liquid) is an example of a liquid silylation agent (i.e., silylation liquid).

As shown in FIG. 19, the treatment unit 402 includes a solvent pipe 431 connected to the solvent nozzle 420, and a solvent valve 432 provided in the solvent pipe 431. With the solvent valve 432 open, IPA (liquid) is supplied from an IPA supply source and spouted downward from an outlet port of the solvent nozzle 420. The outlet port of the solvent nozzle 420 is disposed inside the inner gas nozzle 418, and opposed to the second outlet port 422. Therefore, IPA supplied to the solvent nozzle 420 is spouted downward from the second outlet port 422. IPA spouted from the solvent nozzle 420 with the inner gas nozzle 418 located at the treatment position reaches the center portion of the upper surface of the wafer W. IPA is an example of a solvent which is homogeneously miscible with liquid containing water (e.g., DIW) as well as the hydrophobization liquid (e.g., HMDS). IPA has a lower surface tension than DIW, and is more volatile than DIW.

As shown in FIG. 19, the nozzles include an outer gas nozzle 433 which spouts nitrogen gas toward the wafer W. As shown in FIG. 20, the outer gas nozzle 433 is a horizontally held ring nozzle. The outer gas nozzle 433 coaxially surrounds the inner gas nozzle 418. The outer gas nozzle 433 has an inner diameter that is greater than the outer diameter of the inner gas nozzle 418, and an outer diameter that is generally equal to the diameter of the wafer W. The outer gas nozzle 433 may be connected to the third nozzle movement mechanism 443 via the inner gas nozzle 418, or may be connected to a fourth nozzle movement mechanism independent of the third nozzle movement mechanism 443. In FIGS. 18 to 20, the outer gas nozzle 433 and the inner gas nozzle 418 are connected to each other, and the outer gas nozzle 433 is connected to the third nozzle movement mechanism 443 via the inner gas nozzle 418. The outer gas nozzle 433 is movable between a treatment position (shown in FIGS. 18 to 20) at which a lower surface of the outer gas nozzle 433 is opposed to the peripheral edge portion of the upper surface of the wafer W and a retracted position at which the outer gas nozzle 433 is retracted from above the wafer W.

With the outer gas nozzle 433 located at the treatment position, as shown in FIG. 19, the lower surface of the outer gas nozzle 433 is vertically opposed to and spaced from the peripheral edge portion of the upper surface of the wafer W. The lower surface of the outer gas nozzle 433 is located around the first outlet port 421 provided in the outer peripheral surface of the inner gas nozzle 418. The lower surface of the outer gas nozzle 433 may be disposed at a lower or higher height level than the first outlet port 421 or at the same height level as the first outlet port 421. In any case, the lower surface of the outer gas nozzle 433 is located above the gas stream formed by the nitrogen gas spouted from the first outlet port 421. Therefore, the nitrogen gas spouted from the first outlet port 421 with the inner gas nozzle 418 located at the treatment position is not hindered by the outer gas nozzle 433, but reaches the peripheral edge portion of the upper surface of the wafer W. Therefore, the entire upper surface of the wafer W is covered with the nitrogen gas spouted from the first outlet port 421.

As shown in FIG. 19, the outer gas nozzle 433 includes a plurality of third outlet ports 434 which open in the lower surface of the outer gas nozzle 433, and a third flow passage 435 connected to the respective third outlet ports 434. The treatment unit 402 includes a third gas pipe 436 connected to the third flow passage 435, and a third gas valve 437 provided in the third gas pipe 436. The third flow passage 435 is provided inside the outer gas nozzle 433. The third flow passage 435 is connected to the respective third outlet ports 434. The third outlet ports 434 are distributed over the entire lower surface of the outer gas nozzle 433. The third outlet ports 434 are radially spaced different distances from the center of the outer gas nozzle 433, and spaced circumferentially from each other. In this embodiment, the drying gases to be supplied to the outer gas nozzle 433 and the inner gas nozzle 418 are of the same type (dehumidified nitrogen gas), but different types of drying gases may be used.

With the third gas valve 437 open, as shown in FIG. 19, the nitrogen gas is supplied from the drying gas supply source to the respective third outlet ports 434 through the third gas pipe 436. The nitrogen gas supplied to the third gas pipe 436 is spouted downward from the respective third outlet ports 434. With the outer gas nozzle 433 located at the treatment position, the entire peripheral edge portion of the upper surface of the wafer W is vertically opposed to and spaced from the third outlet ports 434. When the third gas valve 437 is opened with the outer gas nozzle 433 located at the treatment position, therefore, the nitrogen gas spouted from the respective third outlet ports 434 is sprayed on the entire peripheral edge portion of the upper surface of the wafer W. That is, the nitrogen gas spouted from the outer gas nozzle 433 is not sprayed over the entire upper surface of the wafer W, but evenly sprayed only on the peripheral edge portion of the upper surface of the wafer W.

Where the wafer W has a diameter of 300 mm, the nitrogen gas spouted from the third outlet ports 434 with the outer gas nozzle 433 located at the treatment position is sprayed on the entire peripheral edge portion of the upper surface of the wafer W including an annular region having a width of 50 mm from the outer peripheral edge of the wafer W. When the nitrogen gas is spouted from the third outlet ports 434 with the upper surface of the wafer W being covered with the drying gas spouted from at least one of the first outlet port 421 and the second outlet port 422 of the inner gas nozzle 418, the nitrogen gas spouted from the third outlet ports 434 flows through the gas stream covering the upper surface of the wafer W to be sprayed on the peripheral edge portion of the upper surface of the wafer W.

As shown in FIG. 18, the nozzles include an upper gas nozzle 438 which spouts the nitrogen gas within the chamber 404 to replace an internal atmosphere of the chamber 404 with the nitrogen gas. The upper gas nozzle 438 is located at a higher height level than the spin chuck 405, more preferably at a higher height level than the inner gas nozzle 418 and the outer gas nozzle 433. The treatment unit 402 includes a fourth gas pipe 439 connected to the upper gas nozzle 438, and a fourth gas valve 440 provided in the fourth gas pipe 439. With the fourth gas valve 440 open, the nitrogen gas is supplied from the drying gas supply source to the upper gas nozzle 438 through the fourth gas pipe 439, and spouted from an outlet port of the upper gas nozzle 438. Thus, gas in the chamber 404 is introduced into the evacuation device 409 to be expelled from the chamber 404. The nitrogen gas to be supplied to the upper gas nozzle 438 may be of the same type as the drying gas (dehumidified nitrogen gas) to be supplied to the inner gas nozzle 418, or of a different type. A nitrogen gas spouting direction in which the nitrogen gas is spouted from the upper gas nozzle 438 may be toward or away from the wafer W or parallel to the wafer W.

Figure 21:
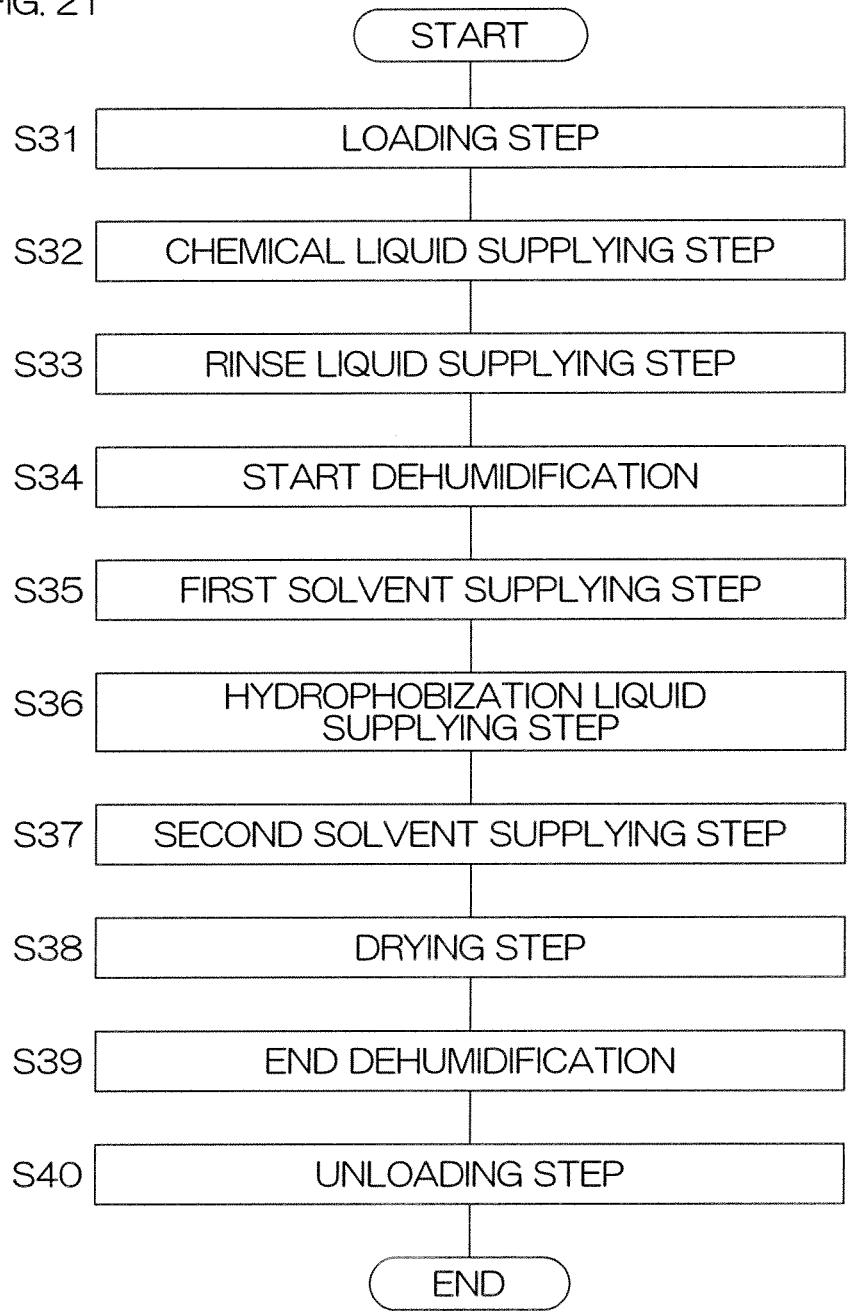
FIG. 21 is a process diagram for explaining an exemplary substrate treatment process to be performed by the substrate treatment apparatus according to the sixth embodiment of the present invention.
Figure 22:
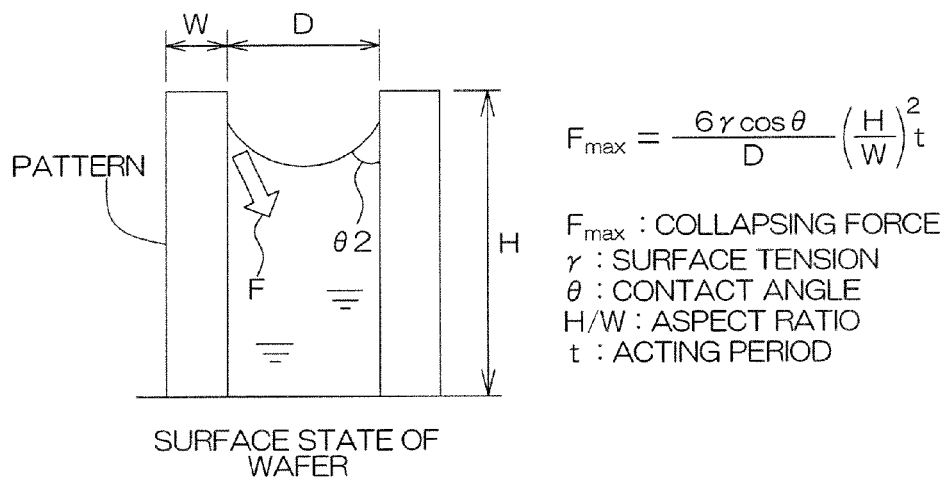
FIG. 22 is a diagram for explaining a pattern collapsing force.
Figure 23:
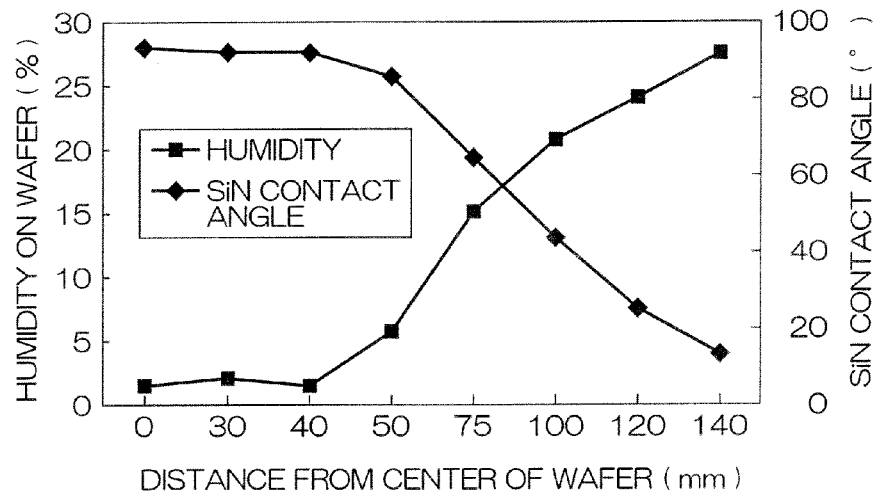
FIG. 23 is a graph showing a relationship between a humidity on a substrate and a contact angle.

FIG. 21 is a process diagram for explaining an exemplary process to be performed for treating a wafer W by the substrate treatment apparatus 401 according to the sixth embodiment of the present invention. FIG. 22 is a diagram for explaining a pattern collapsing force. FIG. 23 is a graph showing a relationship between a humidity on the wafer W and a contact angle. Measurement values shown in FIG. 23 are those obtained when HMDS was supplied to a wafer W having a diameter of 300 mm and formed with a silicon nitride film.

In the exemplary process to be hereinafter described, a wafer W (see FIG. 22) formed with a nano-scale minute pattern having an irregular surface is treated. In the following description, reference will be made to FIG. 18. As required, reference will be also made to FIGS. 21, 22 and 23.

When the wafer W is to be treated, a wafer loading step (Step S31 in FIG. 21) is performed to load the wafer W into the chamber 40. More specifically, the controller 403 causes a transport robot (not shown) to load the wafer W into the chamber 404 with the chemical liquid nozzle 412 and other arrangements in the chamber 404 being retracted from above the spin chuck 405. Then, the controller 403 causes the transport robot to place the wafer W on the spin chuck 405 with a front surface of the wafer W facing up. Thereafter, the controller 403 rotates the spin motor 411 with the wafer W held by the spin chuck 405. Thus, the rotation of the wafer W is started. After the wafer W is placed on the spin chuck 405, the controller 403 retracts the transport robot out of the chamber 404.

Then, a chemical liquid supplying step (Step S32 in FIG. 21) is performed to supply the chemical liquid (e.g., hydrofluoric acid or SC1) to the wafer W. More specifically, the controller 403 controls the first nozzle movement mechanism 441 to move the chemical liquid nozzle 412 from the retracted position to the treatment position. Thereafter, the controller 403 opens the chemical liquid valve 414 to spout the chemical liquid from the chemical liquid nozzle 412 toward the upper surface of the rotating wafer W. The controller 403 controls the first nozzle movement mechanism 441 in this state to move the chemical liquid applying position on the upper surface of the wafer W between the center portion and the peripheral edge portion of the wafer W. After a lapse of a predetermined period from the opening of the chemical liquid valve 414, the controller 403 closes the chemical liquid valve 414 to stop spouting the chemical liquid from the chemical liquid nozzle 412. Thereafter, the controller 403 controls the first nozzle movement mechanism 441 to retract the chemical liquid nozzle 412 from above the spin chuck 405.

The chemical liquid spouted from the chemical liquid nozzle 412 reaches the upper surface of the wafer W, and then flows outward on the upper surface of the wafer W due to a centrifugal force. Thus, a chemical liquid film is formed as covering the entire upper surface of the wafer W. In this manner, the chemical liquid is supplied to the entire upper surface of the wafer W, which is thereby treated with the chemical liquid. Further, the controller 403 moves the chemical liquid applying position on the upper surface of the wafer W between the center portion and the peripheral edge portion of the wafer W, while rotating the wafer W. Thus, the chemical liquid applying position moves over the entire upper surface of the wafer W, whereby the entire upper surface of the wafer W is scanned. Therefore, the chemical liquid spouted from the chemical liquid nozzle 412 is sprayed directly on the entire upper surface of the wafer W. Thus, the entire upper surface of the wafer W is uniformly treated.

Subsequently, a rinse liquid supplying step (Step S33 in FIG. 21) is performed to supply DIW (an example of the rinse liquid) to the wafer W. More specifically, the controller 403 controls the second nozzle movement mechanism 442 to move the rinse liquid nozzle 415 from the retracted position to the treatment position. Thereafter, the controller 403 opens the rinse liquid valve 417 to spout DIW from the rinse liquid nozzle 415 toward the upper surface of the rotating wafer W. The controller 403 controls the second nozzle movement mechanism 442 in this state to move the DIW applying position on the upper surface of the wafer W between the center portion and the peripheral edge portion of the wafer W. After a lapse of a predetermined period from the opening of the rinse liquid valve 417, the controller 403 closes the rinse liquid valve 417 to stop spouting DIW from the rinse liquid nozzle 415. Thereafter, the controller 403 controls the second nozzle movement mechanism 442 to retract the rinse liquid nozzle 415 from above the spin chuck 405.

Like the chemical liquid spouted from the chemical liquid nozzle 412, the DIW spouted from the rinse liquid nozzle 415 reaches the upper surface of the wafer W, and then flows outward on the upper surface of the wafer W due to a centrifugal force. Therefore, the chemical liquid on the wafer W is forced to flow outward by the DIW to be expelled around the wafer W. Thus, the chemical liquid on the wafer W is washed away by the DIW, so that the chemical liquid film on the wafer W is replaced with a DIW liquid film covering the entire upper surface of the wafer W. The controller 403 moves the DIW applying position on the upper surface of the wafer W between the center portion and the peripheral edge portion of the wafer W, while rotating the wafer W. Thus, the DIW applying position moves over the entire upper surface of the wafer W, whereby the entire upper surface of the wafer W is scanned. Therefore, the DIW spouted from the rinse liquid nozzle 415 is sprayed directly on the entire upper surface of the wafer W. Thus, the entire upper surface of the wafer W is uniformly treated.

Subsequently, a dehumidifying step (Step S34 in FIG. 21) is started to reduce the humidity on the wafer W. More specifically, the controller 403 opens the fourth gas valve 440 to spout the nitrogen gas from the upper gas nozzle 438. The nitrogen gas spouted from the upper gas nozzle 438 is distributed throughout the chamber 404 to form a gas stream in the chamber 404. Therefore, gas in the chamber 40 containing the mist of the treatment liquid and the like is introduced into the evacuation device 409 by the nitrogen gas to be thereby expelled from the chamber 404. Thus, the internal atmosphere of the chamber 404 is replaced with the nitrogen gas, whereby the humidity in the chamber 404 is reduced (chamber dehumidifying step).

Further, the controller 403 controls the third nozzle movement mechanism 443 to move the inner gas nozzle 418 from the retracted position to the treatment position. Thus, the inner gas nozzle 418 is located above the center portion of the wafer W, while the outer gas nozzle 433 is located above the peripheral edge portion of the wafer W. The hydrophobization liquid nozzle 419 and the solvent nozzle 420 are disposed inside the inner gas nozzle 418. With the inner gas nozzle 418 located above the center portion of the wafer W, therefore, the hydrophobization liquid nozzle 419 and the solvent nozzle 420 are located above the center portion of the wafer W.

With the inner gas nozzle 418 and the outer gas nozzle 433 located above the wafer W, the controller 403 opens the first gas valve 426 and the second gas valve 428 to spout the nitrogen gas from the inner gas nozzle 418. Thus, a nitrogen gas stream is formed as flowing radially outward on the DIW liquid film covering the entire upper surface of the wafer W (substrate covering step). Further, the controller 403 opens the third gas valve 437 in this state to spout the nitrogen gas from the outer gas nozzle 433. The nitrogen gas spouted from the respective third outlet ports 434 of the outer gas nozzle 433 is sprayed on the peripheral edge portion of the upper surface of the wafer W covered with the DIW liquid film (peripheral edge portion dehumidifying step). Therefore, the nitrogen gas spouted from the outer gas nozzle 433 is sprayed on the peripheral edge portion of the upper surface of the wafer W with the entire upper surface of the wafer W covered with the plurality of gas stream layers stacked one on another.

The atmosphere (moisture-containing atmosphere) on the wafer W is forced to flow radially outward by the nitrogen gas spouted from the inner gas nozzle 418. Thus, the moisture-containing atmosphere is expelled from above the wafer W. Since the nitrogen gas is spouted from the outer gas nozzle 433 toward the peripheral edge portion of the upper surface of the wafer W, the atmosphere on the peripheral edge portion of the upper surface of the wafer W is reliably expelled from above the wafer W by the nitrogen gas spouted from the outer gas nozzle 433. Thus, the atmosphere on the wafer W is made of the drying gas (nitrogen gas), so that the humidity on the wafer W is reduced. Further, the nitrogen gas is sprayed on the upper surface of the wafer W covered with the liquid film, thereby substantially preventing adhesion of foreign matter to the wafer W.

Simultaneously with the dehumidifying step, a first solvent supplying step (liquid film forming step, Step S35 in FIG. 21) is performed to supply IPA (an example of the solvent homogeneously miscible with DIW) to the wafer W. More specifically, with the wafer W being rotated and with the nitrogen gas being spouted from the inner gas nozzle 418 and the outer gas nozzle 433, the controller 403 opens the solvent valve 432 to spout IPA from the solvent nozzle 420 toward the center portion of the upper surface of the rotating wafer W. IPA spouted from the solvent nozzle 420 reaches the upper surface of the wafer W, and then flows outward on the upper surface of the wafer W due to a centrifugal force. Since IPA has higher affinity for DIW, the DIW on the wafer W is easily dissolved in IPA. Therefore, the DIW liquid film on the wafer W is replaced with an IPA liquid film covering the entire upper surface of the wafer W. After a lapse of a predetermined period from the opening of the solvent valve 432, the controller 403 closes the solvent valve 432 to stop spouting IPA from the solvent nozzle 420.

Simultaneously with the dehumidifying step, a hydrophobization liquid supplying step (Step S36 in FIG. 21) is performed to supply HMDS (a silylation liquid, an example of the hydrophobization liquid) to the wafer W. More specifically, with the wafer W being rotated and with the nitrogen gas being spouted from the inner gas nozzle 418 and the outer gas nozzle 433, the controller 403 opens the hydrophobization liquid valve 430 to spout HMDS from the hydrophobization liquid nozzle 419 toward the center portion of the upper surface of the rotating wafer W. HMDS spouted from the hydrophobization liquid nozzle 419 reaches the upper surface of the wafer W, and then flows outward on the upper surface of the wafer W due to a centrifugal force. HMDS on the wafer W is dissolved in IPA. Therefore, the IPA liquid film on the wafer W is replaced with an HMDS liquid film covering the entire upper surface of the wafer W. After a lapse of a predetermined period from the opening of the hydrophobization liquid valve 430, the controller 403 closes the hydrophobization liquid valve 430 to stop spouting HMDS from the hydrophobization liquid nozzle 419.

HMDS reaching the rotating wafer W flows from the center portion to the peripheral edge portion of the upper surface of the wafer W. Thus, HMDS is supplied to the entire upper surface of the wafer W including inner portions of the pattern, whereby the entire upper surface of the wafer W is silylated. Therefore, a hydrophobic protection film which repels water is formed on the entire upper surface of the wafer W, so that a contact angle between the wafer W and water is increased. That is, the contact angle between the wafer W and water is made closer to 90 degrees. As indicated by a formula in FIG. 22, a pattern collapsing force Fmax is reduced as the contact angle $\theta 2$ becomes closer to 90 degrees. Therefore, the supply of HMDS alters the surface state of the wafer W to a state such that the collapse of the pattern does not easily occur.

HMDS contains an active species that reacts with hydroxyl groups (OH groups) in the wafer W to hydrophobize the wafer W. If the humidity on the wafer W is high, the active species of HMDS is liable to react with moisture in the atmosphere and, therefore, the amount of the active species is reduced. That is, the activity of HMDS is reduced (HMDS is inactivated). More specifically, as shown in FIG. 23, the contact angle is smaller if the humidity is higher (at about 140 mm on the abscissa). The contact angle is greater if the humidity is lower (at about 0 mm on the abscissa). HMDS is supplied to the wafer W with the humidity on the wafer W kept at a lower level (not higher than 45%, preferably not higher than 10%). Therefore, HMDS can reliably react with the wafer W, so that the contact angle between the wafer W and water can be reliably increased.

As previously described, HMDS reaching the rotating wafer W flows from the center portion to the peripheral edge portion of the upper surface of the wafer W. The amount of the active species of HMDS is reduced as HMDS flows outward on the upper surface of the wafer W. Therefore, the active species of HMDS is present in a smaller amount on the peripheral edge portion of the upper surface of the wafer W than on the center portion of the upper surface of the wafer W. Unless the humidity in the vicinity of the peripheral edge portion of the upper surface of the wafer W is reliably reduced, the amount of the active species of HMDS is further reduced. The nitrogen gas is spouted from the outer gas nozzle 433 toward the peripheral edge portion of the upper surface of the wafer W. This makes it possible to reliably reduce the humidity in the vicinity of the peripheral edge portion of the upper surface of the wafer W, so that HMDS can reliably react with the entire upper surface of the wafer W.

Simultaneously with the dehumidifying step, a second solvent supplying step (Step S37 in FIG. 21) is performed to supply IPA (an example of the solvent homogeneously miscible with HMDS) to the wafer W. More specifically, with the wafer W being rotated and with the nitrogen gas being spouted from the inner gas nozzle 418 and the outer gas nozzle 433, the controller 403 opens the solvent valve 432 to spout IPA from the solvent nozzle 420 toward the center portion of the upper surface of the rotating wafer W. IPA spouted from the solvent nozzle 420 reaches the upper surface of the wafer W, and then flows outward on the upper surface of the wafer W due to a centrifugal force. Therefore, the HMDS liquid film on the wafer W is replaced with an IPA liquid film covering the entire upper surface of the wafer W. After a lapse of a predetermined period from the opening of the solvent valve 432, the controller 403 closes the solvent valve 432 to stop spouting IPA from the solvent nozzle 420.

Simultaneously with the dehumidifying step, a drying step (Step S38 in FIG. 21) is performed to dry the wafer W. More specifically, the controller 403 controls the spin chuck 405 to increase the rotation speed of the wafer W to a higher rotation speed (e.g., several thousands rpm) with the nitrogen gas being spouted from the inner gas nozzle 418 and the outer gas nozzle 433. Thus, the wafer W is dried with the entire upper surface of the wafer W covered with the nitrogen gas. Thereafter, the controller 403 controls the spin chuck 405 to stop rotating the wafer W. Further, the controller 403 closes the first gas valve 426, the second gas valve 428, the third gas valve 437 and the fourth gas valve 440 to stop spouting the nitrogen gas from the inner gas nozzle 418, the outer gas nozzle 433 and the upper gas nozzle 438 (Step S39 in FIG. 21, the chamber dehumidifying step, the substrate covering step and the peripheral edge portion dehumidifying step are ended).

Subsequently, an unloading step (Step S40 in FIG. 21) is performed to unload the wafer W from the chamber 404. More specifically, the controller 403 controls the third nozzle movement mechanism 443 to retract the inner gas nozzle 418 and the outer gas nozzle 433 from above the wafer W. Thereafter, the controller 403 causes the transport robot to enter the chamber 404 with the chemical liquid nozzle 412 and other arrangements in the chamber 404 being retracted from above the spin chuck 405. Then, the controller 403 causes the transport robot to hold the wafer W on the spin chuck 405. Thereafter, the controller 403 causes the transport robot to unload the wafer W from the chamber 404. The hydrophobic protection film formed on the wafer W by the supply of HMDS is removed from the wafer W outside the chamber 404. A hydrophobic protection film removing device may be provided in the substrate treatment apparatus 401 or may be provided separately from the substrate treatment apparatus 401.

In the sixth embodiment, as described above, the stream of the dehumidified nitrogen gas (drying gas) is formed on the wafer W with the entire front surface of the wafer W covered with the IPA liquid film, and the atmosphere on the wafer W is replaced with the nitrogen gas. Thus, the moisture-containing atmosphere is removed from above the wafer W, whereby the humidity on the wafer W is reduced. Then, the hydrophobization liquid for hydrophobizing the wafer W is supplied to the front surface of the rotating wafer W with the humidity on the wafer W thus reduced. In this manner, the front surface of the wafer W is hydrophobized. This reduces the force (pattern collapsing force) acting on the pattern during the drying of the wafer W, thereby substantially preventing the collapse of the pattern.

The hydrophobization liquid contains the active species that reacts with the wafer W to hydrophobize the front surface of the wafer W. The amount of the active species is reduced by the reaction of the active species with the wafer W. The hydrophobization liquid supplied to the rotating wafer W flows outward on the front surface of the wafer W. Therefore, the active species is present in a smaller amount on the peripheral edge portion of the front surface of the wafer W than on the center portion of the front surface of the wafer W. Further, the amount of the active species in the hydrophobization liquid is reduced by the reaction with the moisture in the atmosphere. On the center portion of the front surface of the wafer W on which a greater amount of the active species is present, the hydrophobization liquid reacts with the wafer W, even if the humidity is higher on the center portion of the front surface of the wafer W. On the peripheral edge portion of the front surface of the wafer W on which a smaller amount of the active species is present, however, the reaction between the wafer W and the hydrophobization liquid is significantly influenced by the humidity.

As described above, the hydrophobization liquid is supplied to the front surface of the wafer W with the humidity on the wafer W reduced by the nitrogen gas. The nitrogen gas is spouted toward the peripheral edge portion of the front surface of the wafer W. Thus, the nitrogen gas stream is formed on the peripheral edge portion of the upper surface of the wafer W, whereby the humidity on the peripheral edge portion of the front surface of the wafer W is reduced. Therefore, the hydrophobization liquid can reliably react with the peripheral edge portion of the front surface of the wafer W and, hence, can reliably react with the entire front surface of the wafer W, thereby substantially preventing the collapse of the pattern on the entire front surface of the wafer W. Further, the nitrogen gas is spouted with the entire front surface of the wafer W covered with the liquid film. This substantially prevents particles and other foreign matter from adhering to the peripheral edge portion of the front surface of the wafer W, thereby substantially preventing the contamination of the wafer W.

[Seventh Embodiment]

Figure 24:
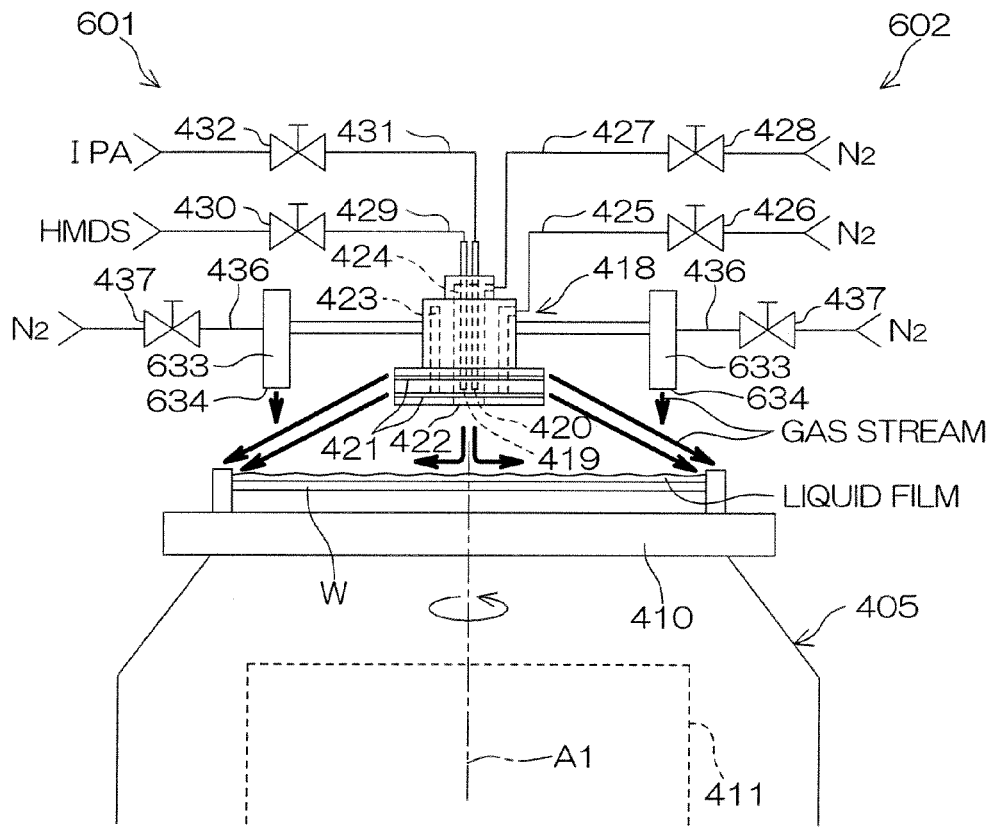
FIG. 24 is a schematic side view showing an inner gas nozzle and outer gas nozzles according to a seventh embodiment of the present invention.
Figure 25:
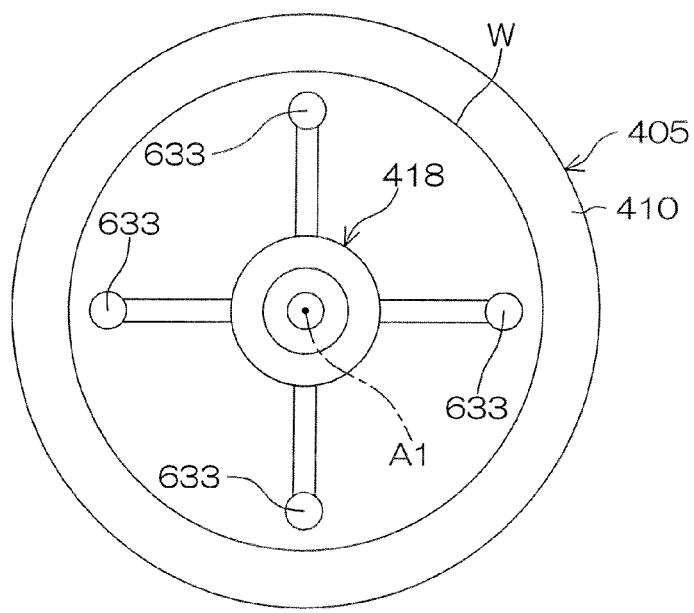
FIG. 25 is a schematic plan view showing the inner gas nozzle and the outer gas nozzles according to the seventh embodiment of the present invention.

FIG. 24 is a schematic side view showing an inner gas nozzle 418 and outer gas nozzles (suppressing unit) 633 according to a seventh embodiment of the present invention. FIG. 25 is a schematic plan view showing the inner gas nozzle 418 and the outer gas nozzles 633 according to the seventh embodiment of the present invention. In FIGS. 24 and 25, components corresponding to those shown in FIGS. 18 to 23 will be designated by the same reference characters as in FIGS. 18 to 23, and duplicate description will be omitted.

As shown in FIG. 24, a substrate treatment apparatus 601 according to the seventh embodiment has substantially the same construction as the substrate treatment apparatus 401 according to the sixth embodiment except for the outer gas nozzles. More specifically, a treatment unit 602 according to the seventh embodiment includes a plurality of outer gas nozzles 633, instead of the outer gas nozzle 433 according to the sixth embodiment, which spout the drying gas toward the wafer W. In the seventh embodiment, dehumidified nitrogen gas is supplied as the drying gas from a drying gas supply source not shown as in the sixth embodiment.

As shown in FIG. 25, the outer gas nozzles 633 are disposed in circumferentially spaced relation (about the rotation axis A1) as surrounding the inner gas nozzle 418. The outer gas nozzles 633 each extend vertically. The outer gas nozzles 633 may be connected to the third nozzle movement mechanism 443 (see FIG. 18) via the inner gas nozzle 418 or may be connected to a fourth nozzle movement mechanism independent of the third nozzle movement mechanism 443. In FIGS. 24 and 25, the outer gas nozzles 633 are illustrated as being connected to the third nozzle movement mechanism 443 via the inner gas nozzle 418. The outer gas nozzles 633 are movable between a treatment position (shown in FIGS. 24 and 25) in which lower surfaces of the outer gas nozzles 633 are opposed to the peripheral edge portion of the upper surface of the wafer W and a retracted position in which the outer gas nozzles 633 are retracted from above the wafer W.

With the outer gas nozzles 633 located in the treatment position, as shown in FIG. 24, the lower surfaces of the outer gas nozzles 633 are vertically opposed to and spaced from the peripheral edge portion of the upper surface of the wafer W. The lower surfaces of the outer gas nozzles 633 are located around the first outlet port 421 provided in the outer peripheral surface of the inner gas nozzle 418. The lower surface of the outer gas nozzles 633 may be located at a higher or lower height level than the first outlet port 421, or may be located at the same height level as the first outlet port 421. In any case, the lower surfaces of the outer gas nozzles 633 are located above the gas stream formed by the nitrogen gas spouted from the first outlet port 421.

As shown in FIG. 24, the outer gas nozzles 633 each have a third outlet port 634 which opens in the lower surface thereof. The outer gas nozzles 633 are connected to the third gas pipe 436, in which the third gas valve 437 is provided. With the third gas valve 437 open, the nitrogen gas is supplied from the drying gas supply source to the respective outer gas nozzles 633 through the third gas pipe 436 to be spouted downward from the third outlet ports 634. When the nitrogen gas is spouted from the respective outer gas nozzles 633 with the upper surface of the wafer W covered with the nitrogen gas spouted from the inner gas nozzle 418, the nitrogen gas spouted from the respective outer gas nozzles 633 flows through the gas stream covering the upper surface of the wafer W to be sprayed on the peripheral edge portion of the upper surface of the wafer W.

The controller 403 performs a process sequence from the loading step to the rinse liquid supplying step as in the exemplary wafer treatment process (first exemplary process) according to the sixth embodiment. Thereafter, the controller 403 spouts the nitrogen gas from the inner gas nozzle 418 located at the treatment position as in the first exemplary process (substrate covering step). Further, the controller 403 spouts the nitrogen gas from the respective outer gas nozzles 633 located in the treatment position (peripheral edge portion dehumidifying step). The controller 403 performs the first solvent supplying step and the subsequent steps in this state. Therefore, HMDS is supplied to the wafer W with the humidity on the wafer W kept at a lower level. Thus, HMDS reacts with the entire upper surface of the wafer W to make the contact angle closer to 90 degrees, thereby substantially preventing the collapse of the pattern.

[Eighth Embodiment]

Figure 26:
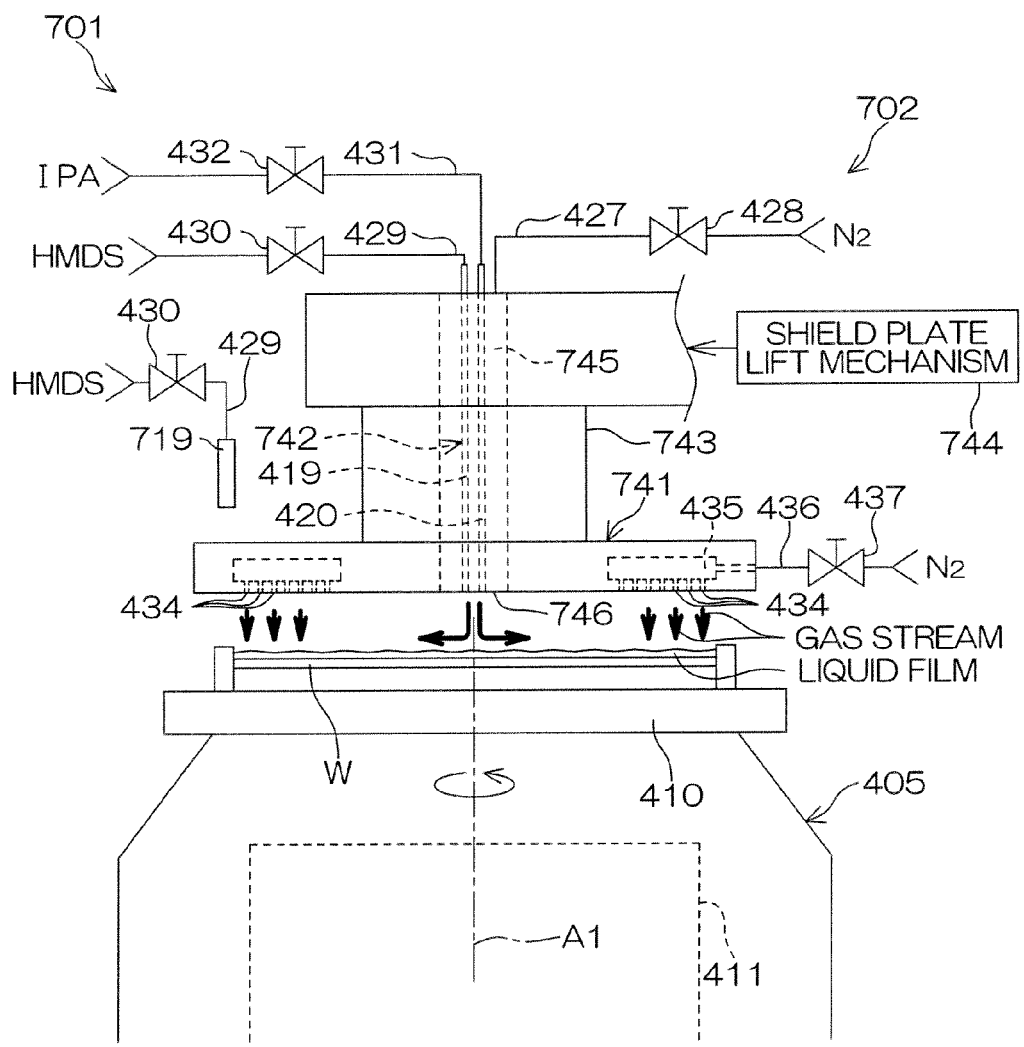
FIG. 26 is a schematic side view illustrating a shield plate according to an eighth embodiment of the present invention.
Figure 27:
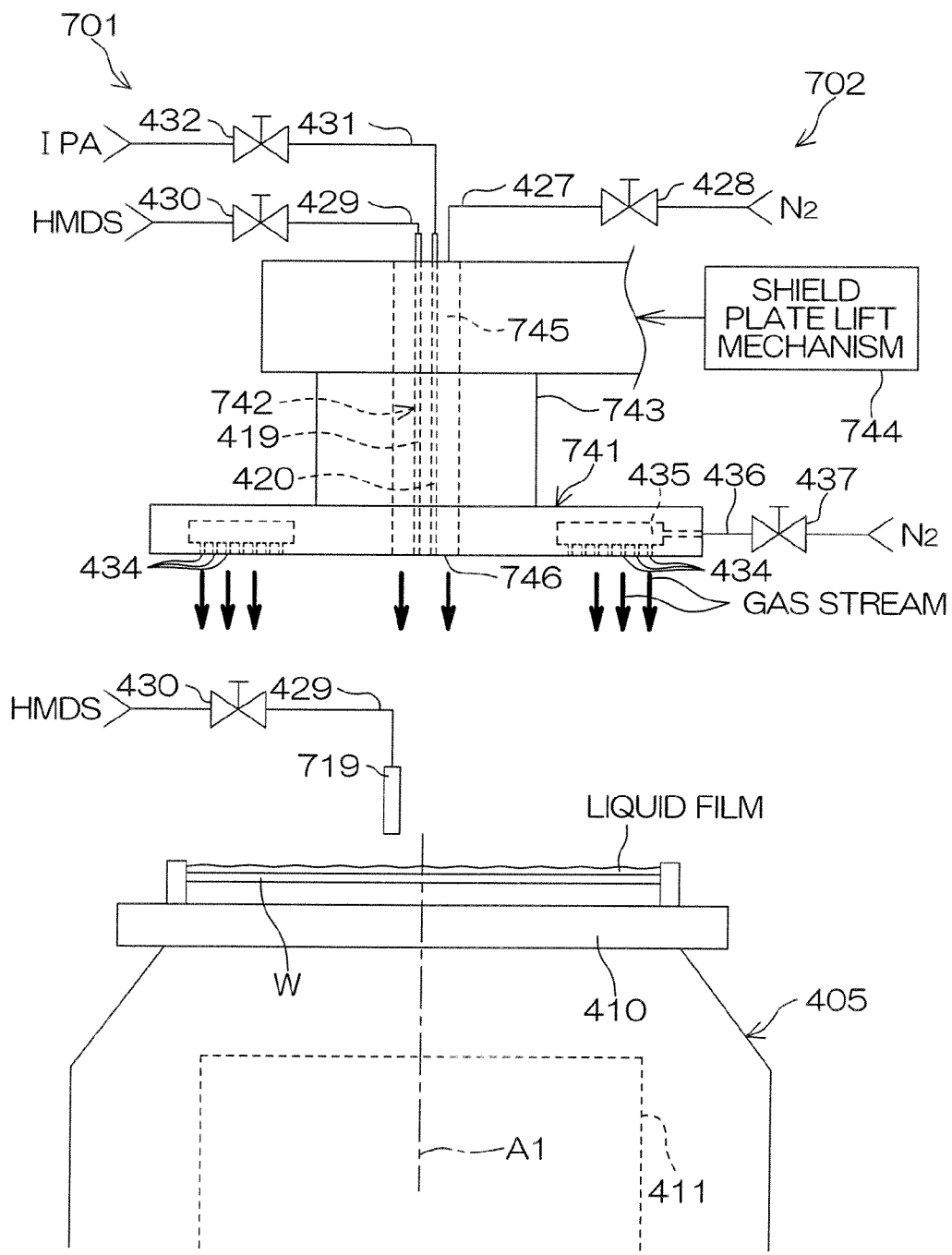
FIG. 27 is another schematic side view illustrating the shield plate according to the eighth embodiment of the present invention.

FIGS. 26 and 27 are schematic side views illustrating a shield plate (suppressing unit) 741 according to an eighth embodiment of the present invention. In FIG. 26, the shield plate 741 is located at an adjacent position. In FIG. 27, the shield plate 741 is located at a retracted position. In FIGS. 26 and 27, components corresponding to those shown in FIGS. 18 to 25 will be designated by the same reference characters as in FIGS. 18 to 25, and duplicate description will be omitted. In the eighth embodiment, dehumidified nitrogen gas is supplied as the drying gas from a drying gas supply source not shown as in the first to seventh embodiments.

The substrate treatment apparatus 701 according to the eighth embodiment has substantially the same construction as the substrate treatment apparatus 401 according to the sixth embodiment except for the inner gas nozzle and the outer gas nozzle. More specifically, a treatment unit 702 according to the eighth embodiment includes, instead of the inner gas nozzle 418 and the outer gas nozzle 433 according to the sixth embodiment, a disk-shaped shield plate 741 horizontally supported above the spin chuck 405, a center shaft nozzle 742 which spouts the treatment liquid downward from a center portion of a lower surface of the shield plate 741, and a hydrophobization liquid nozzle (hydrophobization liquid supplying unit) 719 which spouts HMDS toward the wafer W held by the spin chuck 405. The hydrophobization liquid nozzle 719 may be either a stationary nozzle or a scan nozzle. The hydrophobization liquid nozzle 719 is connected to the hydrophobization liquid pipe 429 in which the hydrophobization liquid valve 430 is provided.

The shield plate 741 has a disk shape having a greater diameter than the wafer W. The shield plate 741 is horizontally supported by a support shaft 743 extending upward from the shield plate 741. The shield plate 741 has a center axis aligning with the rotation axis A1. The lower surface of the shield plate 741 is vertically opposed to and spaced from the upper surface of the wafer W. The shield plate 741 is connected to a lift unit 744. The lift unit 744 vertically moves up and down the shield plate 741 and the support shaft 743. The lift unit 744 moves up and down the shield plate 741 between an adjacent position (shown in FIG. 26) at which the lower surface of the shield plate 741 is located adjacent the upper surface of the wafer W held by the spin chuck 405 and a retracted position (shown in FIG. 27) which is located above the adjacent position.

The shield plate 741 includes a plurality of third outlet ports 434 which open in a peripheral edge portion of the lower surface of the shield plate 741, and a third flow passage 435 connected to the respective third outlet ports 434. The third flow passage 435 is connected to the third gas pipe 436 in which the third gas valve 437 is provided. The third flow passage 435 is defined inside the shield plate 741. The third flow passage 435 is connected to the respective third outlet ports 434. The third outlet ports 434 are distributed throughout the peripheral edge portion of the lower surface of the shield plate 741. The third outlet ports 434 are radially spaced different distances from the center of the shield plate 741, and spaced circumferentially from each other. With the third gas valve 437 open, the nitrogen gas is supplied from the drying gas source to the respective third outlet ports 434 through the third gas pipe 436 and spouted downward from the respective outlet ports 434 toward the peripheral edge portion of the upper surface of the wafer W.

The center shaft nozzle 742 vertically extends along a vertical axis (rotation axis A1) extending through the center of the shield plate 741 and the center of the wafer W. The center shaft nozzle 742 is disposed above the spin chuck 405. The center shaft nozzle 742 is moved up and down together with the shield plate 741 and the support shaft 743. The support shaft 743 is tubular, and its inside space communicates with a through-hole vertically extending through a center portion of the shield plate 741. The through-hole opens in the center portion of the lower surface of the shield plate 741. The center shaft nozzle 742 is inserted in the support shaft 743. The center shaft nozzle 742 has a lower surface which is located at the same height level as the lower surface of the shield plate 741 or at a higher height level than the lower surface of the shield plate 741.

The center shaft nozzle 742 includes a hydrophobization liquid nozzle 419 and a solvent nozzle 420 accommodated in a common case extending vertically along the rotation axis A1. Lower end openings of the hydrophobization liquid nozzle 419 and the solvent nozzle 420 are located at the same height level as the lower surface of the shield plate 741 or at a higher height level than the lower surface of the shield plate 741. The hydrophobization liquid nozzle 419 is connected to the hydrophobization liquid pipe 429 in which the hydrophobization liquid valve 430 is provided. The solvent nozzle 420 is connected to the solvent pipe 431 in which the solvent valve 432 is provided. The hydrophobization liquid nozzle 419 and the solvent nozzle 420 are surrounded by a tubular flow passage 745 defined around the center shaft nozzle 742. The tubular flow passage 745 has a lower end which defines an annular opening surrounding the center shaft nozzle 742. The tubular flow passage 745 is connected to the second gas pipe 427 in which the second gas valve 428 is provided.

With the hydrophobization liquid valve 430 open, HMDS supplied from the hydrophobization liquid pipe 429 to the hydrophobization liquid nozzle 419 is spouted downward from the outlet port of the hydrophobization liquid nozzle 419. With the solvent valve 432 open, similarly, IPA supplied to the solvent nozzle 420 is spouted downward from the outlet port of the solvent nozzle 420. With the second gas valve 428 open, the nitrogen gas supplied from the second gas pipe 427 to the tubular flow passage 745 is spouted downward from the lower end of the tubular flow passage 745. When at least one of the hydrophobization liquid valve 430, the solvent valve 432 and the second gas valve 428 is open, therefore, a corresponding at least one of HMDS, IPA and nitrogen gas is spouted downward from a center opening 746 which opens in the center portion of the lower surface of the shield plate 741.

When the wafer W is to be treated, the controller 403 opens the second gas valve 428 to spout the nitrogen gas (an example of the drying gas) from the center opening 746 with the entire upper surface of the wafer W covered with a liquid film of DIW, IPA or the like. The nitrogen gas spouted downward from the center opening 746 flows outward through a space defined between the upper surface of the wafer W held by the spin chuck 405 and the lower surface of the shield plate 741. Thus, a moisture-containing atmosphere is expelled from the space between the wafer W and the shield plate 741, which is in turn filled with the nitrogen gas (substrate covering step). This reduces the humidity on the wafer W. The nitrogen gas may be spouted from the center opening 746 with the shield plate 741 located at the adjacent position as shown in FIG. 26 or with the shield plate 741 located at the retracted position as shown in FIG. 27. In either case, the space on the wafer W is limited by the shield plate 741, so that the space in which the atmosphere should be replaced (the humidity should be reduced) has a reduced volume.

With the nitrogen gas spouted from the center opening 746, the controller 403 further opens the third gas valve 437 to spout the nitrogen gas from the respective third outlet ports 434 toward the peripheral edge portion of the upper surface of the wafer W. Thus, the nitrogen gas is sprayed on the peripheral edge portion of the upper surface of the wafer W covered with the liquid film. Then, the controller 403 supplies HMDS to the rotating wafer W with the space on the wafer W being filled with the nitrogen gas. More specifically, where the shield plate 741 is located at the adjacent position as shown in FIG. 26, the controller 403 spouts HMDS from the hydrophobization liquid nozzle 419 toward the upper surface of the rotating wafer W. Thus, HMDS is supplied to the entire upper surface of the wafer W while the humidity on the wafer W is kept at a lower level. Where the shield plate 741 is located at the retracted position as shown in FIG. 27, on the other hand, the controller 403 spouts HMDS from the hydrophobization liquid nozzle 719 toward the upper surface of the rotating wafer W. Thus, HMDS is supplied to the entire upper surface of the wafer W while the humidity on the wafer W is kept at a lower level.

[Ninth Embodiment]

FIG. 28 is a schematic side view illustrating an inner gas nozzle 418 and an outer gas nozzle 433 according to a ninth embodiment of the present invention. In FIG. 28, components corresponding to those shown in FIGS. 18 to 27 will be designated by the same reference characters as in FIGS. 18 to 27, and duplicate description will be omitted. In the ninth embodiment, dehumidified nitrogen gas, clean air and dry air are simultaneously supplied as the drying gas from respective drying gas supply sources not shown to a treatment unit 802.

A substrate treatment apparatus 801 according to the ninth embodiment has substantially the same construction as the substrate treatment apparatus 401 according to the sixth embodiment except for the third gas pipe connected to the outer gas nozzle 433. More specifically, the treatment unit 802 includes, instead of the third gas pipe 436 according to the sixth embodiment, a plurality of pipes (a third $N_2$ pipe 847, a third CA pipe 848 and a third DA pipe 849) connected to the third flow passage 435 of the outer gas nozzle 433. The treatment unit 802 further includes a plurality of opening/closing valves (a third $N_2$ valve 850, a third CA valve 851 and a third DA valve 852) provided in the respective pipes, and a plurality of flow rate regulating valves (a third $N_2$ flow rate regulating valve 853, a third CA flow rate regulating valve 854 and a third DA flow rate regulating valve 855) provided in the respective pipes.

The controller 403 performs a process sequence from the loading step to the unloading step as in the exemplary process for treating the wafer W according to the sixth embodiment. Before the start of the peripheral edge portion dehumidifying step, the controller 403 sets gas supplying conditions including the humidity, the flow rate and the like of the drying gas to be spouted from the outer gas nozzle 433 based on the humidity on the wafer W (setting step). Then, the controller 403 spouts the drying gas at a predetermined humidity at a predetermined flow rate from the outer gas nozzle 433 (spouting step).

More specifically, the controller 403 selects one of the third $N_2$ valve 850, the third CA valve 851 and the third DA valve 852 to supply one of the three types of drying gases (nitrogen gas, clean air and dry air) having different humidities to the outer gas nozzle 433. Further, the controller 403 determines the opening degree of one of the flow rate regulating valves corresponding to the drying gas to be supplied to the outer gas nozzle 433 (the opening degree of a corresponding one of the third $N_2$ flow rate regulating valve 853, the third CA flow rate regulating valve 854 and the third DA flow rate regulating valve 855). Then, the controller 403 spouts the selected drying gas at the predetermined flow rate from the outer gas nozzle 433.

When the drying gas is spouted from the outer gas nozzle 433 toward the peripheral edge portion of the upper surface of the wafer W, the humidity on the wafer W is reduced. As the humidity of the drying gas spouted from the outer gas nozzle 433 decreases, the humidity on the wafer W is reduced. Further, the humidity on the wafer W is changed, if the drying gas having the same humidity is spouted at different flow rates from the outer gas nozzle 433. That is, the humidity on the wafer W is reduced, as the drying gas spouting flow rate increases. Therefore, the humidity on the wafer W is controlled by the humidity and the flow rate of the drying gas to be spouted from the outer gas nozzle 433.

As described above, the controller 403 sets the gas supplying conditions based on the humidity on the wafer W observed before the drying gas is spouted from the outer gas nozzle 433, and the drying gas is spouted from the outer gas nozzle 433 according to the gas supplying conditions thus set. More specifically, if the humidity on the wafer W is higher, the controller 403 spouts a lower humidity drying gas from the outer gas nozzle 433, or increases the drying gas spouting flow rate. If the humidity on the wafer W is lower, on the other hand, the controller 403 spouts a higher humidity drying gas from the outer gas nozzle 433, or reduces the drying gas spouting flow rate. Thus, the humidity on the wafer W can be controlled at a stable level.

The gas supplying conditions may be set based on conditions for a preceding process step performed before the peripheral edge portion dehumidifying step. Where a greater amount of the treatment liquid is supplied to the wafer W or the treatment liquid is supplied to the wafer W for a longer period of time in the preceding process step, for example, a greater amount of mist is liable to be generated, resulting in a higher humidity on the wafer W. Therefore, the controller 403 may set the gas supplying conditions based on the amount of the treatment liquid supplied to the wafer W or the period of the supply of the treatment liquid to the wafer W.

Alternatively, the gas supplying conditions may be set based on the actual humidity on the wafer W. More specifically, the treatment unit 802 may include a humidity sensor 856 which measures the humidity on the wafer W. In this case, the humidity sensor 856 may be provided in a recess formed in the lower surface of the inner gas nozzle 418, or may be held by the outer gas nozzle 433, the spin chuck 405 or other member provided in the chamber 404. The controller 403 detects the humidity on the wafer W based on a measurement value of the humidity sensor 856. Then, the controller 403 sets the gas supplying conditions based on the actually detected humidity on the wafer W. Therefore, the humidity on the wafer W is precisely controlled.

While the nine embodiments of the present invention have thus been described, the invention may be embodied in other ways.

In the first to fifth embodiments, the silylation liquid having an ordinary liquid temperature is spouted from the hydrophobization liquid nozzle 4. However, the temperature of the silylation liquid to be spouted from the hydrophobization liquid nozzle 4 is not limited to the ordinary temperature as long as the temperature is relatively low such as not to inactivate the silylation liquid.

Further, the substrate treatment apparatuses may be each configured so that a silylation liquid temperature-controlled at a predetermined spouting temperature (e.g., at a predetermined temperature within a range of 40° C. to 82.4° C.) is spouted from the hydrophobization liquid nozzle 4.

The substrate treatment apparatuses may be each configured so that IPA temperature-controlled at a predetermined spouting temperature (at a predetermined temperature within a range of from an ordinary temperature to 70° C.) is spouted from the solvent nozzle 5.

The heating temperature of the wafer W in the second solvent supplying step of Step S5 in FIG. 5 and in the first and second solvent supplying steps of Steps S13 and S15 in FIG. 10 may be different from the heating temperature of the wafer W in the hydrophobization liquid supplying step of Step S4 in FIG. 5 and in the hydrophobization liquid supplying step of Step S14 in FIG. 10.

In the first embodiment, the substrate treatment apparatus may be configured so that the first and second heater plates 3A, 3B of the heating mechanism 3 can be separately temperature-controlled. In this case, the heating temperature of the peripheral edge portion of the wafer W may be set higher than the heating temperature of the center portion of the wafer W by designing the first heater 28A and the second heater 28B so that the second heater 28B has a greater heat generation amount than the first heater 28A.

In the first embodiment, an arrangement associated with the first heater plate 3A may be obviated so that the heating mechanism 3 includes only an arrangement associated with the second heater plate 3B. In this case, the heating temperature of the peripheral edge portion of the wafer W may be set higher than the heating temperature of the center portion of the wafer W. In this case, the silylation liquid spouted from the hydrophobization liquid nozzle 4 to the center portion of the upper surface of the wafer W is unlikely to be inactivated during the movement from the center portion to the peripheral edge portion of the wafer W. Therefore, not only the center portion but also the peripheral edge portion of the wafer W can be reliably hydrophobized.

In the first embodiment, a heat generation member having a heat generation surface opposed to the entire lower surface of the wafer W may be provided to entirely heat the wafer W.

In the first embodiment, the first and second heaters 28A, 28B may be incorporated in the spin base 12. In this case, the spin base 12 per se can be heated by the heat generation from the first and second heaters 28A, 28B. The upper surface of the spin base 12 functions as the heat generation surface. Thus, the wafer W held by the spin chuck 2 is heated to the predetermined temperature.

In this case, the spin base 12 may be configured so as to suck the back surface (lower surface) of the wafer W to horizontally hold the wafer W. That is, the spin chuck may be of a vacuum suction type.

In the second embodiment, the back side gas outlet ports 160, 161 for spouting the higher temperature inert gas may be opposed to the rotation center of the lower surface of the wafer W. The back side gas outlet ports 160, 161 may be aligned in two or more rows rather than in one row.

The sizes and the densities of the back side gas outlet ports 160, 161 are desirably set so that the inert gas supply flow amount per unit area is greater on the peripheral edge portion of the lower surface of the wafer W than on the center portion of the lower surface of the wafer W.

In the second and fourth embodiments, the higher temperature inert gas (nitrogen gas) is used as the higher temperature gas to be sprayed to the wafer W by way of example, but other usable examples of the higher temperature gas include steam (hot steam) and higher temperature clean air.

In the third embodiment, a mechanism equivalent to the warm water spouting mechanism 350 shown in the fifth embodiment may be employed instead of the heater plate 200. Thus, the higher temperature liquid can be sprayed to the upper surface of the wafer W held by the spin chuck 2 and the silylation liquid or the treatment liquid (e.g., IPA) flowing on the upper surface of the wafer W to warm the silylation liquid and the treatment liquid.

In the fourth embodiment, the front side gas outlet ports 260, 261 for spouting the higher temperature inert gas may be opposed to the rotation center of the upper surface of the wafer W. The front side gas outlet ports 260, 261 may be aligned in two or more rows rather than in one row.

The sizes and the densities of the front side gas outlet ports 260, 261 are desirably set so that the inert gas supply flow amount per unit area is greater on the peripheral edge portion of the upper surface of the wafer W than on the center portion of the upper surface of the wafer W.

In the fifth embodiment, the liquid outlet ports 360, 361 for spouting the warm water may be opposed to the rotation center of the lower surface of the wafer W. The liquid outlet ports 360, 361 may be aligned in two or more rows rather than in one row.

The sizes and the densities of the liquid outlet ports 360, 361 are desirably set so that the warm water supply flow amount per unit area is generally uniform on the lower surface of the wafer W.

In the fifth embodiment, an evacuation port may be provided in the bottom of the cup 7, and a gas stream flowing downward may be formed in the cup 7 during the spouting of the warm water by spraying the dry clean air, the inert gas or other gas toward the center portion or the peripheral edge portion of the upper surface of the wafer W. Thus, the warm water is further reliably prevented from flowing up to the upper surface of the wafer W.

In the fifth embodiment, the warm water is supplied as the higher temperature liquid to the wafer W by way of example, but a higher temperature dilute chemical liquid may be used as the higher temperature liquid.

In the first and third embodiments, the resistance ceramic heater is used as the heat generation member by way of example, but an infrared heater such as a halogen lamp may be used as the heat generation member.

In the first to fifth embodiments, different solvents may be used in the solvent supplying step (corresponding to the first solvent supplying step of Step S3) to be performed before the hydrophobization liquid supplying step and in the solvent supplying step (corresponding to the second solvent supplying step of Step S5) to be performed after the hydrophobization liquid supplying step.

In the first to fifth embodiments, the solvent supplying step (corresponding to the first solvent supplying step of STEP S3) to be performed before the hydrophobization liquid supplying step may be obviated depending on the type of the silylation liquid to be used.

In the sixth to ninth embodiments, the drying gas is sprayed to the peripheral edge portion of the front surface of the substrate with the front surface of the substrate covered with the IPA liquid film by way of example. The liquid for the liquid film is not limited to IPA, but DIW or other type of liquid may be used.

In the sixth to ninth embodiments, HMDS is supplied to the wafer after the start of the spouting of the drying gas by way of example, but HMDS may be supplied to the wafer simultaneously with the start of the spouting of the drying gas. Of course, the supply of HMDS to the wafer may be started before the start of the spouting of the drying gas. That is, HMDS may be supplied to the wafer with or without the spouting of the drying gas.

In the sixth to ninth embodiments, the wafer is dried by rotating the wafer covered with the IPA liquid film at the higher rotation speed by way of example. Alternatively, IPA is replaced with DIW on the wafer, and then the wafer covered with a DIW liquid film may be dried. That is, after HMDS is supplied to the wafer, IPA and DIW may be supplied in this order to the wafer.

In the sixth to ninth embodiments, the wafer is dried by rotating the wafer at the higher rotation speed by way of example, but the wafer may be dried by heating the wafer by a heating device such as a lamp or a heater or by spraying a gas supplied from a blower to the wafer.

In the ninth embodiment, the gas pipes which supply different types of drying gasses are connected to the outer gas nozzle by way of example, but gas nozzles (the inner gas nozzle, the upper gas nozzle and the shield plate) other than the outer gas nozzle may be connected to the respective gas pipes.

In the ninth embodiment, the humidity sensor for measuring the humidity on the wafer W is attached to the inner gas nozzle byway of example. Alternatively, the humidity sensor may be attached to a gas nozzle (the outer gas nozzle, the upper gas nozzle or the shield plate) other than the inner gas nozzle.

In the first to ninth embodiments, IPA (isopropyl alcohol) is used as the solvent by way of example, but a liquid having a smaller surface tension than water and a lower boiling point than water may be used as the solvent. More specifically, an alcohol such as methyl alcohol, ethanol or propyl alcohol may be used as the solvent. Other usable examples of the solvent include ketones, PGMEA (propylene glycol monomethyl ether acetate), EGMEA (ethylene glycol monomethyl ether {acetate}) and fluorine-containing solvents.

In the sixth to ninth embodiments, the front surface of the wafer is covered with the IPA liquid film and, in this state, the drying gas is sprayed to the peripheral edge portion of the front surface of the wafer by way of example. However, the liquid for the liquid film is not limited to IPA, but DIW or other type of liquid may be used.

Examples of the ketones include acetone and diethyl ketone, at least one of which may be used.

Examples of the fluorine-containing solvents include HFE (hydrofluoroethers) and HFC (hydrofluorocarbons), at least one of which may be used.

In the first to ninth embodiments, the substrate treatment apparatuses are adapted to treat the disk-shaped substrate by way of example, but may be adapted to treat a polygonal substrate such as for a liquid crystal display device.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2012-187837, 2012-192083, 2013-044546 and 2013-053240 filed in the Japan Patent Office on Aug. 28, 2012, on Aug. 31, 2012, on Mar. 6, 2013 and on Mar. 15, 2013, respectively, the disclosure of which is incorporated herein by reference in its entirety.

What is claimed is:

1. A substrate treatment method for treating a front surface of a substrate formed with a predetermined pattern, the method comprising:

a liquid film forming step of forming a liquid film of a treatment liquid on the front surface of the substrate;

a hydrophobization liquid supplying step of supplying a hydrophobization liquid to a center portion of the front surface of the substrate for hydrophobizing the front surface of the substrate, while rotating the substrate;

an inactivation suppressing step of suppressing inactivation of the supplied hydrophobization liquid on a peripheral edge portion of the front surface of the substrate simultaneously with the hydrophobization liquid supplying step; and a drying step of drying the substrate to which the hydrophobization liquid has been supplied, wherein the inactivation suppressing step includes a heating step of heating at least one of the substrate and the hydrophobization liquid supplied to the front surface of the substrate, wherein at least one of a center portion of the substrate and the hydrophobization liquid supplied to the center portion of the front surface of the substrate is heated with a smaller heat amount per unit area than a peripheral edge portion of the substrate and a hydrophobization liquid supplied to the peripheral edge portion of the front surface of the substrate in the heating step.

2. The substrate treatment method according to claim 1, wherein the heating step includes a substrate heating step of heating the substrate.

3. The substrate treatment method according to claim 2, wherein the substrate heating step includes the step of heating the substrate by a heat generation member disposed in opposed relation to a back surface of the substrate.

4. The substrate treatment method according to claim 2, wherein the substrate heating step includes a first higher temperature gas spouting step of spraying a higher temperature gas having a temperature higher than an ordinary temperature to the substrate from a back side gas outlet port disposed in opposed relation to a peripheral edge portion of a back surface of the substrate.

5. The substrate treatment method according to claim 2, wherein the substrate heating step includes a higher temperature liquid spouting step of spouting a liquid having a temperature higher than an ordinary temperature toward the substrate from a liquid outlet port disposed in opposed relation to a peripheral edge portion of a back surface of the substrate.

6. The substrate treatment method according to claim 1,
wherein the hydrophobization liquid supplying step includes the step of spouting a hydrophobization liquid having a predetermined liquid temperature toward the front surface of the substrate from a hydrophobization liquid nozzle,
wherein the heating step includes the step of heating at least one of the substrate and the hydrophobization liquid supplied to the front surface of the substrate to a temperature higher than the liquid temperature of the hydrophobization liquid spouted from the hydrophobization liquid nozzle.

7. The substrate treatment method according to claim 1, wherein the heating step includes a second higher temperature gas spouting step of spraying a higher temperature gas having a temperature higher than an ordinary temperature to the substrate from a front side gas outlet port disposed in opposed relation to the peripheral edge portion of the front surface of the substrate.

8. The substrate treatment method according to claim 1, wherein at least one of a peripheral edge portion of the substrate and a hydrophobization liquid supplied to the peripheral edge portion of the front surface of the substrate is heated in the heating step.

9. The substrate treatment method according to claim 1,
wherein the liquid film forming step includes
a preliminary solvent supplying step of supplying a solvent having a smaller surface tension than water to the front surface of the substrate before the hydrophobization liquid supplying step.

10. The substrate treatment method according to claim 1, further comprising a pre-drying solvent supplying step of supplying a solvent having a smaller surface tension than water to the front surface of the substrate after the hydrophobization liquid supplying step before the drying step.

11. The substrate treatment method according to claim 1, wherein the hydrophobization liquid comprises at least one of HMDS (hexamethyldisilazane) and TMS (tetramethylsilane).

12. The substrate treatment method according to claim 9, further comprising a step of heating the substrate simultaneously with the preliminary solvent supplying step.

13. The substrate treatment method according to claim 10, further comprising a step of heating the substrate simultaneously with the pre-drying solvent supplying step.

* * * * *